(12) United States Patent
Iwase et al.

(10) Patent No.: US 7,315,603 B2
(45) Date of Patent: Jan. 1, 2008

(54) SEMICONDUCTOR STORAGE DEVICE, METHOD FOR PROTECTING PREDETERMINED MEMORY ELEMENT AND PORTABLE ELECTRONIC EQUIPMENT

(75) Inventors: Yasuaki Iwase, Tenri (JP); Yoshifumi Yaoi, Yamatokooriyama (JP); Hiroshi Iwata, Nara-ken (JP); Akihide Shibata, Nara (JP); Yoshinao Morikawa, Ikoma (JP); Masaru Nawaki, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 661 days.

(21) Appl. No.: 10/848,312

(22) Filed: May 19, 2004

(65) Prior Publication Data

US 2005/0002258 A1    Jan. 6, 2005

(30) Foreign Application Priority Data

May 20, 2003    (JP) ............................. 2003-142123

(51) Int. Cl.
*G11C 8/00* (2006.01)
(52) U.S. Cl. .................. 376/233; 376/104; 376/212
(58) Field of Classification Search ................ 365/104, 365/233, 212
See application file for complete search history.

(56) References Cited

U.S. PATENT DOCUMENTS 5,442,704 A * 8/1995 Holtey ........................ 711/163
5,546,561 A * 8/1996 Kynett et al. ................ 365/195
6,240,032 B1 * 5/2001 Fukumoto .................... 365/222

FOREIGN PATENT DOCUMENTS

| JP | 5-81072 B2 | 11/1993 |
|---|---|---|
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| WO | WO 99/07000 A2 | 2/1999 |

* cited by examiner

*Primary Examiner*—Thong Q. Le
(74) *Attorney, Agent, or Firm*—Birch, Stewart, Kolasch & Birch, LLP

(57) ABSTRACT

There is provided a semiconductor storage device and portable electronic equipment including a nonvolatile memory element that can easily be miniaturized. The semiconductor storage device includes a memory cell array 21 in which a plurality of memory elements 1 are arranged and a write state machine 32. The memory element 1 includes a gate electrode 104 formed on a semiconductor layer 102 via a gate insulator 103, a channel region arranged below the gate electrode 104, diffusion regions 107a, 107b that are located on both sides of the channel region and have a conductive type opposite to that of the channel region and memory function bodies 109 that are located on both sides of the gate electrode 104 and have a function to retain electric charge. The write state machine 32 can selectively prevent program and erase of data in the memory elements within a predetermined range.

10 Claims, 31 Drawing Sheets

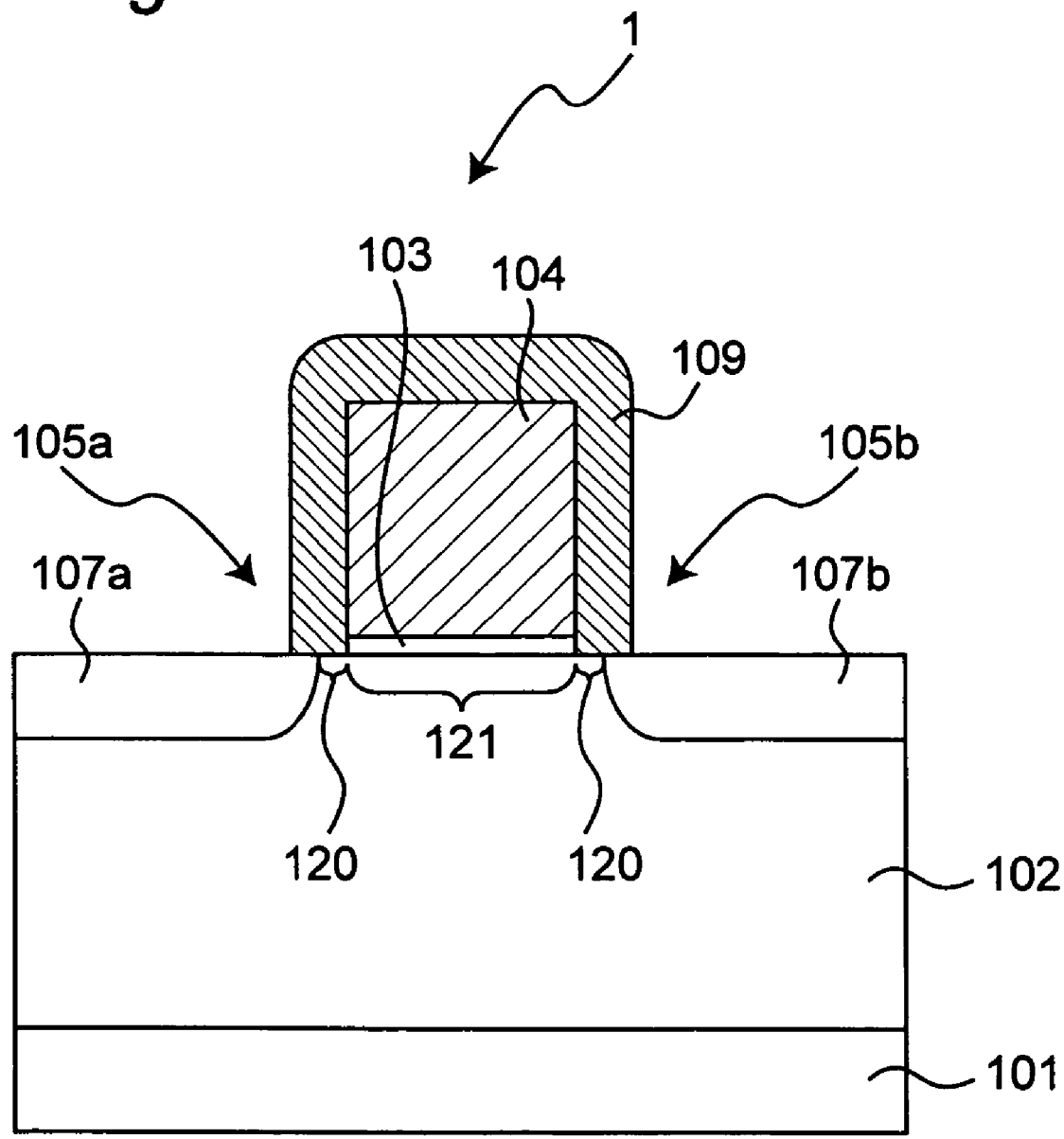

Fig.25

| COMMAND | REQUEST BUS CYCLE | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| PROGRAM SETUP/PROGRAM | 2 | WRITE | X | 40H | WRITE | PA | PD |

Fig.35

| ADDRESS | A16 | A15 | A14 | A13 | |
|---|---|---|---|---|---|
| 1FFFF | 1 | 1 | 1 | 1 | BOOT BLOCK |
| ⋮ | ⋮ | ⋮ | ⋮ | ⋮ | |
| 1E000 | 1 | 1 | 1 | 1 | |
| 1DFFF | 1 | 1 | 1 | 0 | PARAMETER BLOCK 1 |
| 1D000 | 1 | 1 | 1 | 0 | |
| 1CFFF | 1 | 1 | 1 | 0 | PARAMETER BLOCK 2 |
| 1C000 | 1 | 1 | 1 | 0 | |
| 1BFFF | 1 | 1 | 0 | 1 | MAIN BLOCK |
| | 1 | 0 | 1 | | |
| | 1 | 0 | 0 | | |
| | 0 | 1 | 1 | | |
| | 0 | 1 | 0 | | |
| | 0 | 0 | 1 | | |
| 00000 | 0 | 0 | 0 | 0 | |

US 7,315,603 B2

SEMICONDUCTOR STORAGE DEVICE, METHOD FOR PROTECTING PREDETERMINED MEMORY ELEMENT AND PORTABLE ELECTRONIC EQUIPMENT

This nonprovisional application claims priority under 35 U.S.C. §119(a) on Patent Application No. 2003-142123 filed in Japan on May 20, 2003, the entire contents of which are hereby incorporated by reference.

BACKGROUND OF THE INVENTION

The present invention relates to a semiconductor storage device and portable electronic equipment. The invention relates, more specifically, to a semiconductor storage device that has a memory cell array in which nonvolatile memory elements constructed of field-effect transistors including memory function bodies having a function to retain electric charge or polarization are arranged and to portable electronic equipment including such a semiconductor storage device.

Conventionally, a flash memory has typically been used as a nonvolatile semiconductor storage device.

In this flash memory, as shown in FIG. 40, a floating gate 902, an insulation film 907 and a word line (control gate) 903 are formed in this order via a gate insulation film 908 on a semiconductor substrate 901, and a source line 904 and a bit line 905 are formed on both sides of the floating gate 902, constituting a memory cell. Around this memory cell are formed element isolation regions 906 (refer to Japanese Patent Laid-Open Publication No. HEI 5-304277).

The memory cell retains storage as the quantity of charge in the floating gate 902. In the memory cell array constructed by arranging the memory cells, the desired memory cell can be subjected to rewrite and read operations by selecting the specified word line and bit line and applying a predetermined voltage to the lines.

The flash memory as described above exhibits a drain current Id to gate voltage Vg characteristic indicated by the solid line curve and the dashed line curve in FIG. 41 when the quantity of charges in the floating gate 902 changes. That is, if the quantity of negative charges in the floating gate 902 is increased, then the characteristic curve changes from the characteristic indicated by the solid line curve to the characteristic indicated by the broken line curve in FIG. 41, and the Id-Vg curve is displaced roughly parallel in a direction in which the gate voltage Vg increases with respect to same drain current Id, and the threshold voltage increases.

However, the flash memory as described above has been functionally required to arrange the insulation film 907 that isolates the floating gate 902 from the word line 903 and had difficulties in reducing the thickness of the gate insulation film 908 to prevent the leak of charges from the floating gate 902. Thus, the flash memory is required to arrange the insulation film 907 and the gate insulation film 908 of specified thicknesses so that the miniaturization of memory cell is difficult to achieve.

SUMMARY OF THE INVENTION

Accordingly, embodiments of the present invention provide a semiconductor storage device and portable electronic equipment including nonvolatile memory elements that are easy to miniaturize.

According to an aspect of the present invention, there is provided a semiconductor storage device comprising:

a memory cell array having a plurality of memory elements whose addresses can be designated;

a write state machine which is connected to the memory cell array, controls operations to be performed on the memory cell array, receives control signals that represent one operation or a sequence of operations to be performed at at least one block of at least one address in the memory cell array, receives predetermined bits of an identification of a block of addresses, further receives a protect signal, generates an active lock signal if the predetermined bit of the identification of the block of the addresses and the protect signal are in predetermined states, responds to the lock signal by failing to perform the operation identified, and responds to an absence of the lock signal by performing each operation identified on every address within the block; and a command state machine which is connected so as to receive data including commands and generates control signals for controlling the write state machine and the protect signal, each memory element of the memory cell array comprising:

a gate electrode formed on a semiconductor layer via a gate insulator;

a channel region disposed below the gate electrode via the gate insulator;

diffusion regions which are disposed on both sides of the channel region and have a conductive type opposite to a conductive type of the channel region; and memory function bodies which are formed on both sides of the gate electrode and have a function to retain electric charge or polarization.

According to the above-mentioned construction, the memory element of the memory cell array comprises the memory function bodies located on both sides of the gate electrode in place of the conventional floating gate, and therefore, the thickness of the gate insulator can be made thin and fine. Therefore, the semiconductor storage device can be miniaturized.

Furthermore, the formation process of the memory element is highly compatible with the formation process of ordinary transistors. Therefore, in comparison with the case where the memory cell array that employs a prior art flash memory as a nonvolatile memory element is combined with a row decoder, a column decoder, a program verify circuit and so on constructed of an ordinary transistor for consolidation, the semiconductor storage device of embodiments of the present invention is allowed to remarkably reduce numbers of masks and processes. Therefore, the yield of chips is improved, and the cost can be reduced.

Furthermore, in the memory element, the memory function borne by the memory function bodies and the transistor operation function borne by the gate insulator are separated from each other. Therefore, it is easy to restrain the short-channel effect by reducing the film thickness of the gate insulator with a sufficient memory function possessed. Furthermore, the value of the current flowing between the diffusion regions due to rewrite largely changes in comparison with an EEPROM. Therefore, it becomes easy to distinguish between the write state and the erase state of the semiconductor storage device.

Moreover, according to the aforementioned construction, the command state machine generates the protect signal, while the write state machine operates to receive the protect signal and generate an active lock signal when the predetermined bits of the identifications of the block of the addresses and the protect signal are in predetermined states, respond to this active lock signal by not performing the identified operation and respond to the absence of the active lock signal by performing each identified operation every address in the block. Therefore, the write and erase of data of the memory elements in the predetermined range can be selectively prevented.

Moreover, according to another aspect of the present invention, there is provided a semiconductor storage device comprising:

a memory cell array having a plurality of memory elements identified by addresses; and a microprocessor for outputting commands of memory operations to be performed at at least one address in the memory cell array, wherein the command outputted from the microprocessor includes an identification of at least one operation to be performed and an identification of at least one block of memory addresses, and wherein the microprocessor further outputs a protect signal indicating that predetermined memory elements of the memory cell array are protected when the protect signal is in an active state, the semiconductor storage device comprising a memory controller connected between the memory cell array and the microprocessor, wherein the memory controller receives the commands, data and identifications of the blocks of the addresses and outputs operation control signals to perform the identified operation at the at least one address in the memory cell array, and wherein the memory controller comprises a command state machine connected so as to receive the identification of at least one operation to be performed and the state of the protect signal, the command state machine outputting write state machine control signals comprising signals to identify the operation to be performed and a state of the protect signal, wherein the memory controller further comprises a write state machine connected to the memory cell array to control operation to be performed on the memory cell array, the write state machine comprising a logic circuit connected so as to receive predetermined bits of the address and a write state machine control signal, the logic circuit generating an active lock signal if the predetermined bits of the address and the protect signal are in predetermined states, the write state machine responding to the active lock signal by failing to perform the operation identified, and each memory element of the memory cell array comprising:

a gate electrode formed on a semiconductor layer via a gate insulator;

a channel region disposed below the gate electrode via the gate insulator;

diffusion regions which are disposed on both sides of the channel region and have a conductive type opposite to a conductive type of the channel region; and memory function bodies which are formed on both sides of the gate electrode and have a function to retain electric charge or polarization.

Moreover, according to an aspect of the present invention, there is provided a method for protecting the predetermined memory element comprising the steps of:

outputting a protect signal indicating that predetermined memory elements of the memory cell array is protected when the protect signal is in an active state from the microprocessor to the memory controller;

receiving predetermined bits of the address and the protect signal by the memory controller and generating a lock signal if the predetermined bits of the address and the protect signal are in predetermined states;

putting the memory controller into a state determined by a status of the protect signal and by an immediately preceding state of the memory controller, and making the memory controller operate on subsequent memory addresses determined by the state, such that the memory controller fails to perform the operation identified if the lock signal is generated, and performs the operation identified according to the state of the memory controller on addresses at which the operations identified are to be performed if the lock signal is not generated.

In one embodiment, the memory function bodies owned by the memory element further include a charge retention film extended roughly parallel to a side surface of the gate electrode.

According to the aforementioned embodiment, the write speed of the memory element is increased, and the program verify operation speed can be increased. Moreover, the memory element can be programmed with high accuracy to the desired level while restraining variations in the memory effect, and the program verify operation can be completed within a short time.

Moreover, in one embodiment, a p-type highly doped region is provided adjacently to the channel side of the n-type diffusion region owned by the memory element.

According to the aforementioned embodiment, the write speed of the memory element is increased, and the program verify operation speed can be increased.

Moreover, in one embodiment, the memory element has an insulation film which insulates a film that has a surface roughly parallel to a surface of the gate insulator and a function to retain electric charge from the channel region or the semiconductor layer, and the insulation film has a film thickness thinner than a film thickness of the gate insulator and is not thinner than 0.8 nm.

According to the above-mentioned embodiment, injection of electric charge into the memory function bodies is facilitated, and the speed of write into the memory element is increased. This makes it possible to increase the program verify operation speed, achieve write with a low voltage and reduce the power consumption of the program verify operation.

Moreover, in one embodiment, at least part of the memory function bodies owned by the memory element overlaps part of the diffusion region.

According to the above-mentioned embodiment, write can be performed with a low voltage without a supplementary gate, and the power consumption of the program verify operation can be reduced.

Moreover, the portable electronic equipment of an embodiment of the present invention comprises the aforementioned semiconductor storage device.

According to the above-mentioned construction, the consolidation process of the memory element and the logic circuit is simple. Therefore, the manufacturing cost can be restrained. This makes it possible to reduce the cost, increase the operation speed of read and write and prevent the accidental write and erase of the predetermined memory element.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic sectional view of part of a memory element in the semiconductor storage device of the first embodiment of the present invention;

FIG. 25 shows a Table 1 of commands of the above semiconductor storage device;

FIG. 35 is a table showing addresses;

DETAILED DESCRIPTION OF THE PREFERRED EMBODIMENTS

Figure 2A:
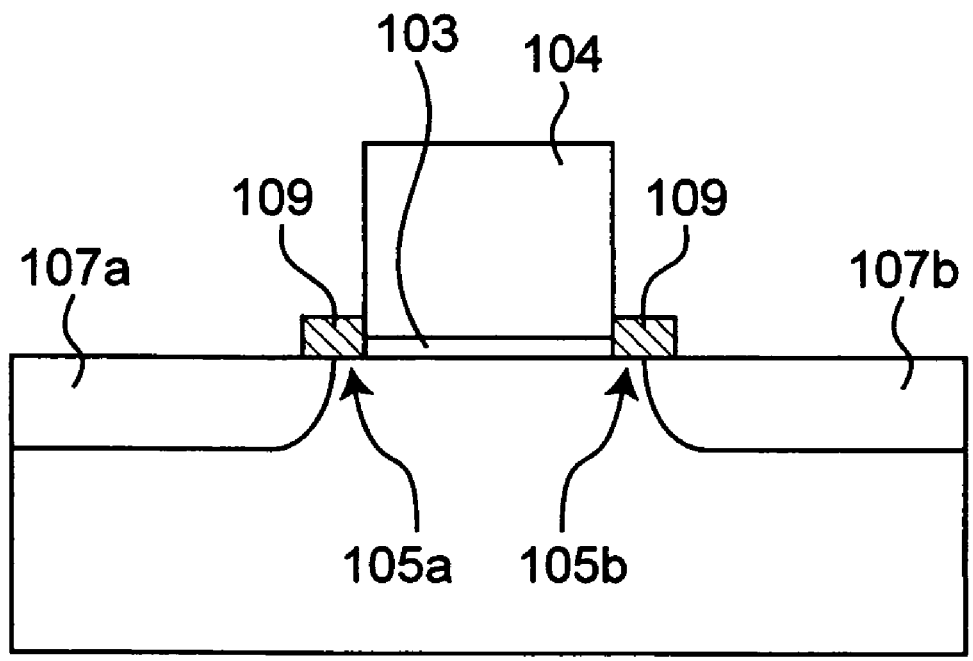
FIGS. 2A and 2B are schematic sectional views of part of memory elements in the semiconductor storage device of the modified first embodiment of the present invention.

An outline of a nonvolatile memory element to be employed in the semiconductor storage device of various embodiments of the present invention will be described first.

The memory element is constructed mainly of a semiconductor layer, a gate insulation film, a gate electrode, a channel region, a diffusion region and a memory function body. In this case, the channel region generally means a region of the same conductive type as that of the semiconductor layer, or a region right under the gate electrode, while the diffusion region means a region of the conductive type opposite to that of the channel region.

Specifically, the memory element, which may be constructed of one first conductive type region that is the diffusion region, a second conductive type region that is the channel region, one memory function body arranged across regions of the first and second conductive types, and an electrode provided via the gate insulation film, should properly be constructed of a gate electrode formed on the gate insulation film, two memory function bodies formed on both sides of the gate electrode, two diffusion regions arranged on both sides of the memory function body oppositely to the gate electrode, and a channel region arranged under the gate electrode.

The semiconductor device should be formed as a semiconductor layer on a semiconductor substrate or preferably formed on a well region of the first conductive type formed in the semiconductor substrate.

The semiconductor substrate is not specifically limited so long as it is used for a semiconductor device, and there can be enumerated, for example, bulk substrates of elemental semiconductors of silicon, germanium and so on and compound semiconductors of silicon germanium, GaAs, InGaAs, ZnSe, GaN and so on. Moreover, it is acceptable to employ various substrates such as an SOI (Silicon on Insulator) substrate, an SOS (Silicon on Sapphire) substrate and a multi-layer SOI substrate and a glass or plastic substrate on which a semiconductor layer is possessed, as those which have a semiconductor layer on its surface. Among others, a silicon substrate, an SOI substrate on the surface of which a silicon layer is formed or the like, is preferable. The semiconductor substrate or the semiconductor layer may be single crystal (by, for example, epitaxial growth), polycrystal or amorphous although there are variations in the quantity of current flowing inside.

It is preferred that an element isolation region is formed on this semiconductor layer, and a single or multi-layer structure may be formed by a combination of the elements of transistors, capacitors, resistors and so on, circuits of these elements, semiconductor devices and layer insulation films. The element isolation region can be formed of various element isolation films such as a LOCOS (Local Oxidation of Silicon) film, a trench oxide film and an STI (Shallow Trench Isolation) film. The semiconductor layer may have the P-type or the N-type conductive type, and it is preferred that a well region of at least one first conductive type (P-type or N-type) be formed on the semiconductor layer. There can be employed a semiconductor layer and a well region whose impurity concentrations are within the ranges well known in the field. When the SOI substrate is employed as a semiconductor layer, a well region may be formed on the surface semiconductor layer, or a body region may be possessed under the channel region.

The gate insulation film is generally not specifically limited so long as it is used for a semiconductor device, and there can be employed: for example, an insulation film such as a silicon oxide film and a silicon nitride film; a single layer film or a laminate film of a high dielectric film such as an aluminum oxide film, a titanium oxide film, a tantalum oxide film and a hafnium oxide film. Among others, the silicon oxide film is preferable. The gate insulation film should have a film thickness of, for example, about 1 to 20 nm and preferably have a film thickness of about 1 to 6 nm. The gate insulation film may be formed only right under the gate electrode or formed larger (wider) than the gate electrode.

The gate electrode is formed on the gate insulation film normally in a shape for use in a semiconductor device or a shape that has a concave portion in a lower end portion. The gate electrode, which should preferably be formed in an integrated body without being separated by a single layer or multi-layer conductive film, may be arranged in a separated state by the single layer or multi-layer conductive film. Moreover, the gate electrode may have a side wall insulation film on the side wall. The gate electrode is normally not specifically limited so long as it is used for a semiconductor device, and there can be enumerated the conductive films of: for example, polysilicon; metals of copper and aluminum; high-melting-point metals of tungsten, titanium and tantalum; a single layer film or a multilayer film of high-melting-point metal and silicide thereof; and so on. The gate electrode should properly be formed with a film thickness of, for example, about 50 to 400 nm. It is to be noted that a channel region is formed under the gate electrode.

It is preferred that the gate electrode is formed only on the side wall of the memory function body described later or does not cover the upper portion of the memory function body. With this arrangement, a contact plug can be arranged closer to the gate electrode, and therefore, the miniaturization of the memory element is facilitated. Moreover, the memory element, which has a simple arrangement as described above, is easy to manufacture, and the yield can be improved.

The memory function body has at least a function to retain electric charges (hereinafter referred to as a "charge retention function"). In other words, the memory function body has a function to store and retain charges, trap charges or retain a charge polarized state. This function is fulfilled by the memory function body that includes, for example, a film or region having the charge retention function. As a material that fulfills this function, there can be enumerated: silicon nitride; silicon; silicate glass containing impurities of phosphorus, boron or the like; silicon carbide; alumina; high dielectric materials of hafnium oxide, zirconium oxide, tantalum oxide and the like; zinc oxide; ferroelectric substance; metal and so on. Therefore, the memory function body can be formed of a single layer or laminate structure of: an insulation film including a silicon nitride film; an insulation film including a conductive film or a semiconductor layer inside; an insulation film including at least one conductor or semiconductor dot; or an insulation film including a ferroelectric film in which internal charges are polarized by an electric field and the state is retained. Among others, the silicon nitride film, in which a number of levels for trapping charges exist, is therefore able to obtain a great hysteresis characteristic. Moreover, a charge retention time is long, and there occurs no problem of charge leak due to the generation of a leak path, and therefore, a retention characteristic is satisfactory. Furthermore, a silicon nitride film is preferable because it is normally used in the LSI process.

By employing the insulation film, which internally includes the film having the charge retention function, such as a silicon nitride film, as a memory function body, reliability of storage retention can be improved. The reason for the above is that the silicon nitride film is an insulator and the electric charges of the entire silicon nitride film are not lost at once even when the charge leak partially occurs in the film. Moreover, even if a distance between memory elements is reduced and mutually adjacent memory function bodies are brought in contact with each other when a plurality of memory elements are arranged, the information stored in each of the memory function bodies is not lost dissimilarly to the case where the memory function bodies are constructed of a conductor. Furthermore, the contact plug can be arranged closer to the memory function body and arranged so as to overlap with the memory function body in some cases. Therefore, the miniaturization of the memory element is facilitated.

In order to improve the reliability of storage retention, the film that has the charge retention function is not always required to have a film-like shape, and a film having the charge retention function should preferably exist discretely in the insulation film. In concrete, it is preferred that the film having the charge retention function is distributed in a dot-like form in a material that hardly retains electric charges, or, for example, silicon oxide.

When a conductive film or a semiconductor layer is employed as a charge retaining film, it is preferable to arrange the charge retaining film via an insulation film so as not to come in direct contact with neither one of the semiconductor layer (semiconductor substrate, well region, body region, source/drain region or diffusion region) and the gate electrode. As the insulation film, for example, there can be enumerated a laminate structure of a conductive film and an insulation film, a structure in which a conductive film is distributed in a dot-like form in the insulation film, a structure arranged in a part of the side wall insulation film formed on the side wall of the gate and so on.

By employing the insulation film that internally include a conductive film or a semiconductor layer as a memory function body, the amount of electric charges to be injected into the conductor or the semiconductor can be freely controlled, and a multi-value arrangement can easily be provided. Therefore, this arrangement is preferable.

Furthermore, by employing the insulation film that includes at least one conductor or semiconductor dots as a memory function body, the write and erase operations can easily be performed by direct tunneling of electric charges, and low power consumption can be achieved. Therefore, this arrangement is preferable.

Moreover, it is acceptable to use a ferroelectric film such as PZT (lead zirconate titanate) and PLZT (lead lanthanum zirconate titanate) whose polarization direction is changed by an electric field as a memory function body. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase can be achieved. Therefore, this arrangement is preferable.

The insulation film, which constitutes the memory function body, should properly be a region for making it difficult for electric charges to escape or a film that has a function to make it difficult for electric charges to escape. As one that fulfills the function to make it difficult for electric charges to escape, a silicon oxide film and so on can be enumerated.

The charge retaining film included in the memory function body is arranged on both sides of the gate electrode directly or via an insulation film and arranged on the semiconductor layer (semiconductor substrate, well region, body region or source/drain region or diffusion region) directly or via a gate insulation film. It is preferred that the charge retaining films located on both sides of the gate electrode be formed so as to cover the whole or part of the side walls of the gate electrode directly or via an insulation film. According to an example of application, when the gate electrode has a concave portion in its lower end portion, the charge retaining film may be formed so as to be completely or partially buried in the concave portion directly or via an insulation film.

The diffusion region can be made to function as a source/drain region and has a conductive type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important in some embodiments of the invention is that at least part of the film or region having the charge retention function in the memory function body overlaps with part of the diffusion region. The reason for the above is that the essence of the memory elements that constitute the semiconductor storage device is to rewrite stored information by an electric field which is applied across the memory function body in accordance with the voltage difference between the gate electrode, existing only in the side wall portion of the memory function body, and the diffusion region.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses a short-channel effect. In this case, it is preferable to provide an arrangement that part of this diffusion region and the gate electrode hold at least part of the memory function body therebetween.

The memory element of tho procnt invention can be formed by the ordinary semiconductor process according to a method similar to the method of forming a side wall spacer of a single layer or laminate structure on the side wall of the gate electrode. Specifically, there can be enumerated: a method for forming a gate electrode, thereafter forming a single layer film or a multilayer film including a film having the charge retention function (hereinafter referred to as a "charge retaining film"), a charge retaining film such as a charge retaining film/insulation film, an insulation film/charge retaining film and an insulation film/charge retaining film/insulation film and leaving these films in a side wall spacer shape by etching back under appropriate conditions; a method for forming an insulation film or a charge retaining film, leaving the films in a side wall spacer shape by etching back under appropriate conditions, further forming a charge retaining film or an insulation film and leaving the films in a side wall spacer shape by etching back under appropriate conditions; a method for coating or depositing an insulation film material in which a particulate charge retaining material is distributed on a semiconductor layer including a gate electrode, and leaving the insulation film material in a side wall spacer shape by etching back under appropriate conditions; a method for forming a gate electrode, thereafter forming the single layer film or the multilayer film and carrying out patterning by using a mask and so on. Moreover, there can be enumerated a method for forming a charge retaining film, a charge retaining film/insulation film, an insulation film/charge retaining film, an insulation film/charge retaining film/insulation film and so on before forming the gate electrode, forming an opening in a region that becomes a channel region of these films, forming a gate electrode material film on the entire upper surface and patterning this gate electrode material film in a shape, which is larger than the opening and includes the opening and so on.

One example of the formation process of this memory element will be described.

First of all, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion layer region (source/drain region) is formed. Subsequently, it is proper to carry out a silicide process or an upper portion wiring process according to a well-known procedure.

When a memory cell array is constructed by arranging the memory elements of embodiments of the present invention, the best mode of the memory elements is to satisfy, for example, all the required conditions:

(1) the function of the word line is possessed by the integrated body of the gate electrodes of a plurality of memory elements;
(2) the memory function bodies are formed on both sides of the word line;
(3) electric charges in the memory function bodies are retained by an insulator, or in particular, a silicon nitride film;
(4) the memory function bodies are constructed of an ONO (Oxide Nitride Oxide) film, and the silicon nitride film has a surface roughly parallel to the surface of the gate insulation film;
(5) the silicon nitride film in each memory function body is separated by the word line, the channel region and the silicon oxide film;
(6) the silicon nitride film in each memory function body overlaps with the diffusion region;
(7) the thickness of the insulation film, which separates the silicon nitride film that has a surface roughly parallel to the surface of the gate insulation film from the channel region or the semiconductor layer differs from the thickness of the gate insulation film;
(8) write and erase operations of one memory element are performed by a single word line;
(9) there is no electrode (word line) that has a function to assist the write and erase operations on each memory function body; and
(10) the portion put in contact with the diffusion region right under each memory function body has a region where the impurity concentration of the conductive type opposite to the conductive type of the diffusion region is high. Benefits are obtained even when fewer than all ten requirements are satisfied. It is to be noted that the memory elements may satisfy at least one of these requirements.

The most preferable combination of the aforementioned requirements resides, for example, in that (3) electric charges in the memory function bodies are retained by an insulator, or in particular, a silicon nitride film, (6) the insulation film (silicon nitride film) in each memory function body overlaps with the diffusion region, and (9) there is no electrode (word line) that has a function to assist the write and erase operations on each memory function body.

When the requirement (3) and the requirement (9) are satisfied, the memory elements are very useful as follows. First of all, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body is a conductor, interference occurs between the charge retaining regions as the distance between the memory elements is reduced by capacitive coupling, and the storage information cannot be retained.

Moreover, when the charge retaining region in the memory function body is an insulator (e.g., silicon nitride film), there is no need to make each memory function body independent of each memory cell. For example, the memory function bodies formed on both sides of one word line shared by a plurality of memory cells are not required to be isolated every memory cell, and it is possible to share the memory function bodies formed on both sides of one word line by a plurality of memory cells that share the word line. Therefore, the photoetching process for isolating the memory function bodies become unnecessary, and the manufacturing process is simplified. Furthermore, the position alignment margin of the photolithography process and the film etching margin become unnecessary. Therefore, the margin between the memory cells can be reduced. Therefore, even if the formation is carried out on the same microfabrication level, the memory cell occupation area can be miniaturized in comparison with the case where the charge retaining region in the memory function body is a conductor (e.g., polycrystalline silicon film). When the charge retaining region in the memory function body is a conductor, there is needed a photoetching process for separating the memory function bodies every memory cell, and there are needed a photo position alignment margin and a film etching margin.

Furthermore, since there is a simple element structure that has no electrode having the function to assist the write and erase operations on the memory function bodies, the number of processes is reduced, and the yield can be improved. Therefore, consolidation with the transistors that constitute a logic circuit and an analog circuit can be facilitated, and an inexpensive semiconductor storage device can be obtained.

Moreover, the device is more useful when the requirements (3) and (9) are satisfied and the requirement (6) is satisfied. That is, by making the charge retaining region and the diffusion region in each memory function body overlap with each other, the write and erase operations can be performed at a very low voltage. In concrete, the write and erase operations can be performed at a low voltage of not higher than 5 V. This operation produces a very large effect in terms of circuit design. There is no need to make a high voltage in a chip dissimilarly to the flash memory, and therefore, the charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

When the requirement (3) is not satisfied or when electric charges are retained by a conductor in the memory function body, the write operation can be performed even when the requirement (6) is not satisfied, or when the conductor in the memory function body and the diffusion region do not overlap with each other. This is because the conductor in the memory function body executes write assist by capacitive coupling with the gate electrode.

Moreover, when the requirement (9) is not satisfied, or when there is an electrode that has the function to assist the write and erase operations on the memory function body, the write operation can be performed even when the requirement (6) is not satisfied, or when the insulator in the memory function body and the diffusion region do not overlap with each other.

The memory element may be connected in series to a transistor on one side or both sides or consolidated with a logic transistor on an identical chip. In the above case, the semiconductor device of an embodiment of the present invention, or in particular, the memory element can be formed through processes that has very high affinity for the formation processes of ordinary standard transistors of transistors, logic transistors and the like, and therefore, they can be concurrently formed. Therefore, the process of consolidating the memory elements with the transistors or the logic transistors becomes very simple, and an inexpensive consolidated device can be obtained.

The memory element can store binary or more information in one memory function body, and this allows the element to function as a memory element that stores four values or more information. The memory element may store only binary information. Moreover, it is possible to make the memory element function as a memory cell that has both the functions of a select transistor and a memory transistor by the variable resistor effect of the memory function body.

By being combined with a logic element, a logic circuit or the like, the semiconductor storage device of an embodiment of the present invention can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS'ss (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be integrated as at least part of the control circuit of electronic equipment or a data storage circuit or detachably integrated at need.

Embodiments of the semiconductor storage device and the portable electronic equipment of the present invention will be described in detail below with reference to the drawings.

The First Embodiment

The semiconductor storage device of this embodiment is provided with a memory element 1 that serves as one example of the nonvolatile memory element as shown in FIG. 1.

In the memory element 1, a gate electrode 104 is formed on a P-type well region 102 formed via a gate insulation film 103 on the surface of a semiconductor substrate 101. A silicon nitride film 109, which has a trap level for retaining electric charges and serves as a charge retaining film, is arranged on the upper surface and the side surfaces of the gate electrode 104, and the portions of the silicon nitride film 109 located on both side walls of the gate electrode 104 serve as memory function bodies 105a and 105b for actually retaining electric charges. In this case, the memory function body means a portion where electric charges are actually accumulated by the rewrite operation in the memory function body or the charge retaining film. N-type diffusion regions 107a and 107b, which function as a source region and a drain region, respectively, are formed on both sides of the gate electrode 104 and inside the P-type well region 102. The diffusion regions 107a and 107b have an offset structure. That is, the diffusion regions 107a and 107b do not reach the region 121 located under the gate electrode, and the offset regions 120 under the charge retaining film (silicon nitride film 109) constitute part of the channel region.

Figure 2B:
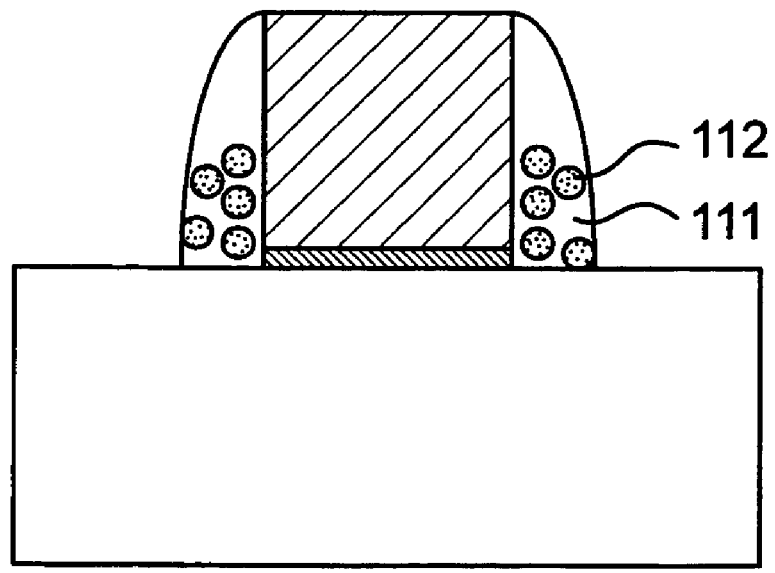

It is to be noted that the memory function bodies 105a and 105b, which substantially retain electric charges, are both sides wall portions of the gate electrode 104. Therefore, the silicon nitride film 109 is only required to be formed in the regions corresponding to these portions (see FIG. 2A). Moreover, the memory function bodies 105a and 105b may have a structure in which particles 112 constructed of a conductor or a semiconductor of a nanometer size are distributed in scattered dots in an insulation film 111 (see FIG. 2B). In this case, it is difficult for an electric charge to tunnel its way through the dots since the quantum effect is excessive when the particle 112 has a size smaller than 1 nm, and no remarkable quantum effect appears at the room temperature when the size exceeds 10 nm. Therefore, the diameter of the particle 112 should preferably be within a range of 1 nm to 10 nm. Furthermore, the silicon nitride films 109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 131a and 131b have a function to retain electric charges. Moreover, the term of "write" means the injection of electrons into the memory function bodies 131a and 131b when the memory element is the N-channel type. Hereinafter, the description is provided on the assumption that the memory element is the N-channel type.

Figure 3:
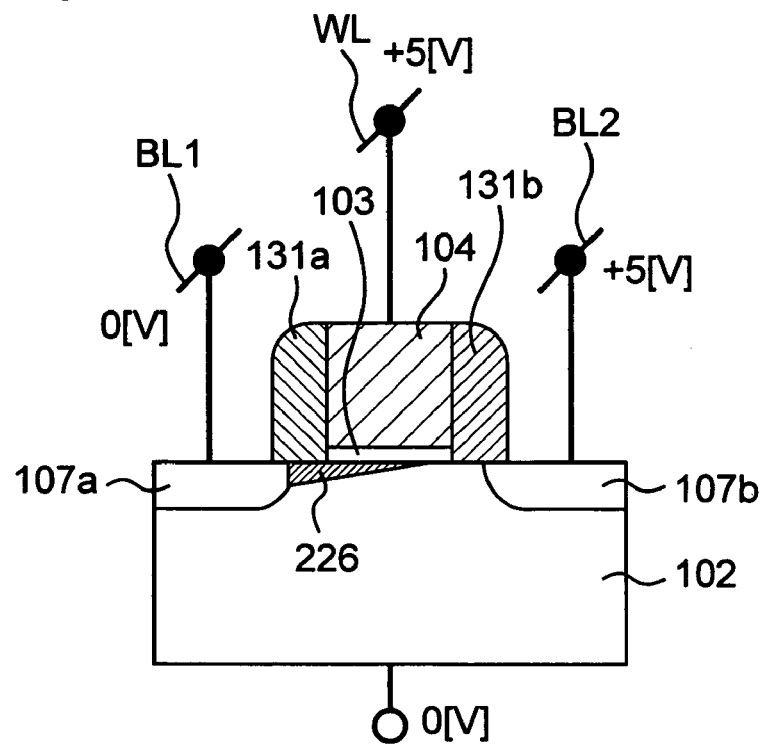
FIG. 3 is a view for explaining the write operation of the memory element in the semiconductor storage device of the first embodiment.

In order to inject an electron (execute write) into the second memory function body 131b, as shown in FIG. 3, an N-type first diffusion region 107a and an N-type second diffusion region 107b are made to serve as a source electrode and a drain electrode, respectively. For example, a voltage of 0 V is applied to the first diffusion region 107a and the P-type well region 102, a voltage of +5 V is applied to the second diffusion region 107b, and a voltage of +5 V is applied to the gate electrode 104. According to the above-mentioned voltage conditions, an inversion layer 226 extends from the first diffusion region 107a (source electrode), but it does not reach the second diffusion region 107b (drain electrode), generating a pinch-off point. An electron is accelerated from the pinch-off point to the second diffusion region 107b (drain electrode) by a high electrical field and becomes a so-called hot electron (high energy conduction electron). Write is performed by the injection of this hot electron into the second memory function body 131b. Since no hot electron is generated in the vicinity of the first memory function body 131a, write is not performed.

Figure 4:
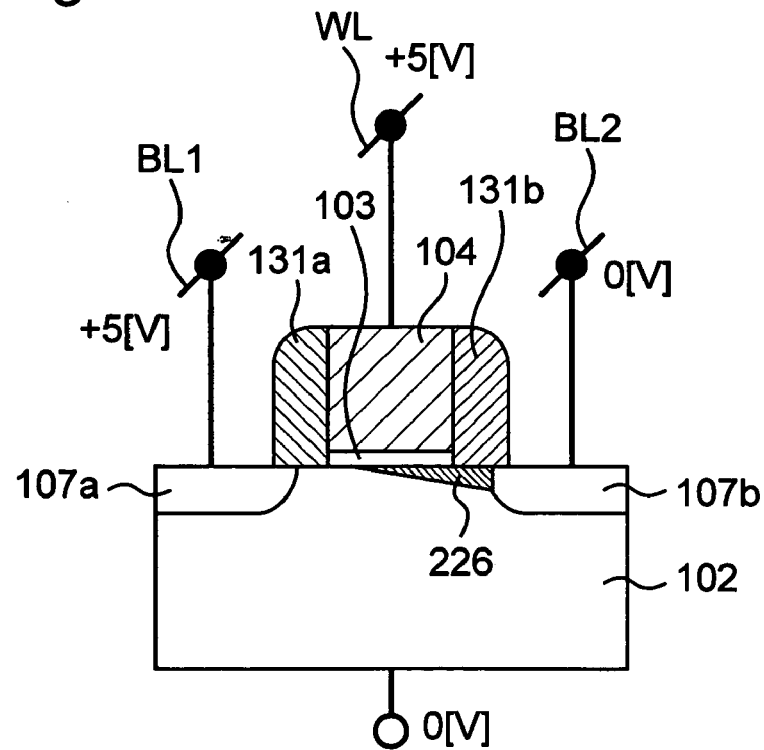
FIG. 4 is a view for explaining the write operation of the memory element in the semiconductor storage device of the first embodiment.

On the other hand, in order to inject an electron (execute write) into the first memory function body 131a, as shown in FIG. 4, the second diffusion region 107b and the first diffusion region 107a are made to serve as the source electrode and the drain electrode, respectively. For example, a voltage of 0 V is applied to the second diffusion region 107b and the P-type well region 102, a voltage of +5 V is applied to the first diffusion region 107a, and a voltage of +5 V is applied to the gate electrode 104. As described above, by exchanging the source and drain regions reversely to the case where an electron is injected into the second memory function body 131b, write can be performed by injecting an electron into the first memory function body 131a.

Next, the principle of erase operation of the memory element will be described with reference to FIG. 5 and FIG. 6.

Figure 5:
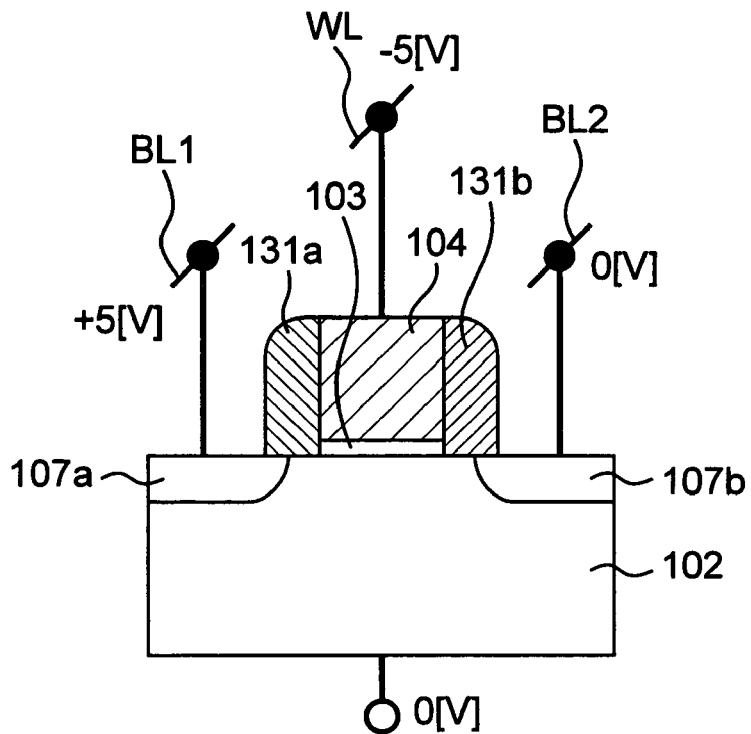
FIG. 5 is a view for explaining the erase operation of the memory element in the semiconductor storage device of the first embodiment.

According to a first method for erasing the information stored in the first memory function body 131a, as shown in FIG. 5, a positive voltage (e.g., +5 V) is applied to the first diffusion region 107a, a voltage of 0 V is applied to the P-type well region 102, a reverse bias is applied to a PN junction of the first diffusion region 107a and the P-type well region 102, and a negative voltage (e.g., −5 V) is further applied to the gate electrode 104. At this time, the potential slope becomes steep, in particular, in the vicinity of the gate electrode 104 at the PN junction due to the influence of the gate electrode to which the negative voltage is applied. Accordingly, a hot hole (high energy hole) is generated on the P-type well region 102 side of the PN junction due to band-to-band tunneling. This hot hole is drawn toward the gate electrode 104 that has a negative potential, and conse-quently, the hole is injected into the first memory function body 131a. As described above, the erase of the first memory function body 131a is performed. In this case, it is proper to apply a voltage of 0 V to the second diffusion region 107b.

When erasing the information stored in the second memory function body 131b, it is proper to exchange the potential of the first diffusion region with the potential of the second diffusion region in the aforementioned case.

Figure 6:
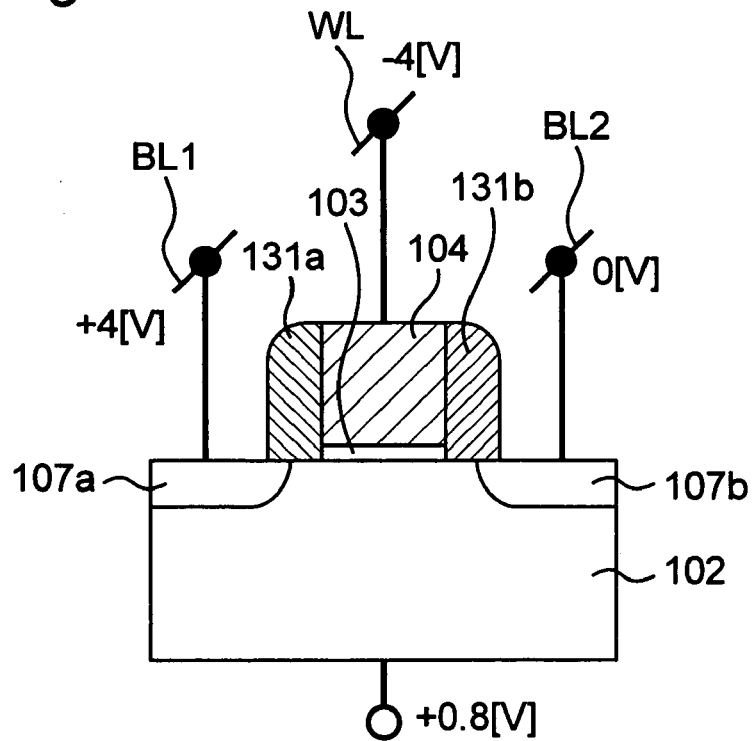
FIG. 6 is a view for explaining the erase operation of the memory element in the semiconductor storage device of the first embodiment.

According to a second method for erasing the information stored in the first memory function body 131a, as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied across the P-type well region 102 and the second diffusion region 107b, injecting an electron into the P-type well region 102. The injected electron diffuses to a PN junction of the P-type well region 102 and the first diffusion region 107a and become hot electrons by being accelerated there by an intense electric field. This hot electron generates an electron-hole pair at the PN junction. That is, by applying the forward voltage across the P-type well region 102 and the second diffusion region 107b, the electron injected into the P-type well region 102 becomes a trigger to generate a hot hole at the PN junction located on the opposite side. The hot hole generated at the PN junction is drawn toward the gate electrode 104 that has a negative potential, and consequently, the hole is injected into the first memory function body 131a.

According to this method, even when only a voltage insufficient for the generation of a hot hole by band-to-band tunneling is applied to the PN junction of the P-type well region and the first diffusion region 107a, the electron injected from the second diffusion region 107b becomes a trigger to generate an electron-hole pair at the PN junction, allowing a hot hole to be generated. Therefore, the voltage during the erase operation can be lowered. Particularly, when an offset region 120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 131a, a voltage of +5 V must to be applied to the first diffusion region 107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of embodiments of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, over-erase does not easily occur.

Figure 7:
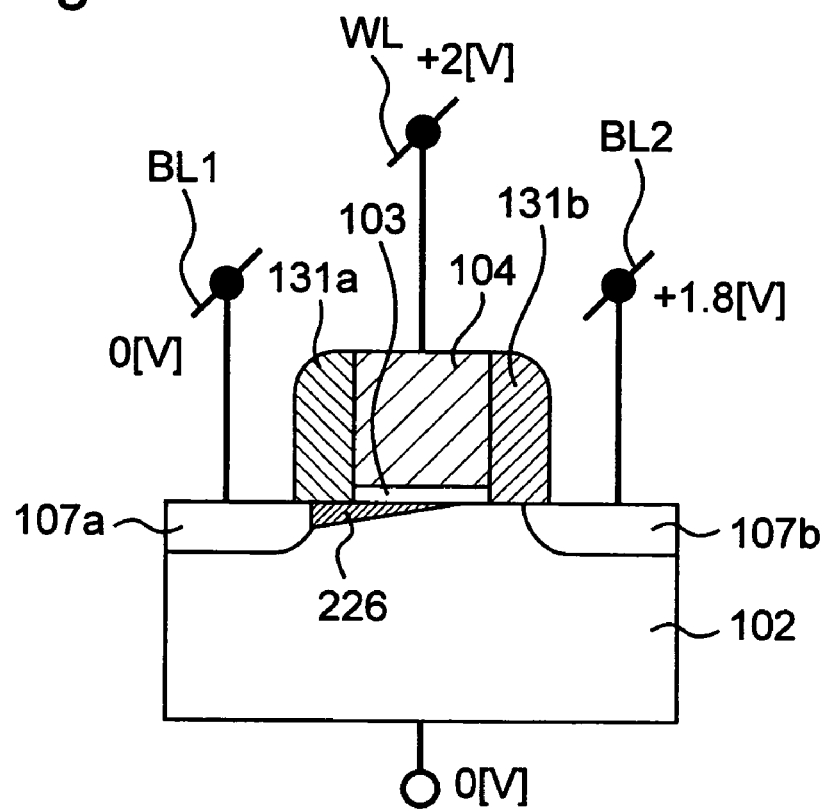
FIG. 7 is a view for explaining the read operation of the memory element of the semiconductor storage device of the first embodiment.

The principle of read operation of the memory element will be further described with reference to FIG. 7.

In reading the information stored in the first memory function body 131a, the transistor is operated by making the first diffusion region 107a and the second diffusion region 107b serve as a source electrode and a drain electrode, respectively. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when no electron is accumulated in the first memory function body 131a, a drain current easily flows. When electrons are accumulated in the first memory function body 131a, the inversion layer is not easily formed in the vicinity of the first memory function body 131a, and therefore, a drain current hardly flows. Therefore, by detecting the drain current, the storage information of the first memory function body 131a can be read. In particular, when read is performed by giving a voltage that causes the pinch-off operation, the state of charges accumulated in the first memory function body 131a can be more accurately determined without being influenced by the presence or absence of charges in the second memory function body 131b.

In reading the information stored in the second memory function body 131b, the transistor is operated by making the second diffusion region 107b and the first diffusion region 107a serve as the source electrode and the drain electrode, respectively. For example, it is proper to apply a voltage of 0 V to the second diffusion region 107b and the P-type well region 102, apply a voltage of +1.8 V to the first diffusion region 107a and apply a voltage of +2 V to the gate electrode 104. As described above, by exchanging the source and drain regions reversely to the case where the information stored in the first memory function body 131a is read, the information stored in the second memory function body 131b can be read.

If the channel region (offset regions 120) that is not covered with the gate electrode 104 is left, then the inversion layer is lost or formed depending on the presence or absence of surplus electric charges of the memory function bodies 131a and 131b in the channel region that is not covered with the gate electrode 104, and consequently, a great hysteresis (a change in the threshold value) is obtained. It is to be noted that the drain current is largely reduced when the width of the offset region 120 is excessively large, and the read speed is significantly slowed. Therefore, it is preferable to determine the width of the offset region 120 so that sufficient hysteresis and read speed can be obtained.

Even when the diffusion regions 107a and 107b reached the ends of the gate electrode 104, i.e., even when the diffusion regions 107a and 107b and the gate electrode 104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be performed by detecting the drain current, and a function as a memory can be obtained. However, when a larger memory hysteresis effect is needed, it is preferred that the diffusion regions 107a and 107b do not overlap with the gate electrode 104 (the offset region 120 exists).

By the aforementioned operation method, 2-bit write and erase per transistor can be selectively achieved. Moreover, by arranging memory elements with a word line WL connected to the gate electrodes 104 of the memory elements and with a first bit line BL1 and a second bit line BL2 connected to the first diffusion regions 107a and the second diffusion regions 107b, respectively, a memory cell array can be constructed.

Moreover, according to the aforementioned operation method, the 2-bit write and erase per transistor are performed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of embodiments of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

The Second Embodiment

Figure 8:
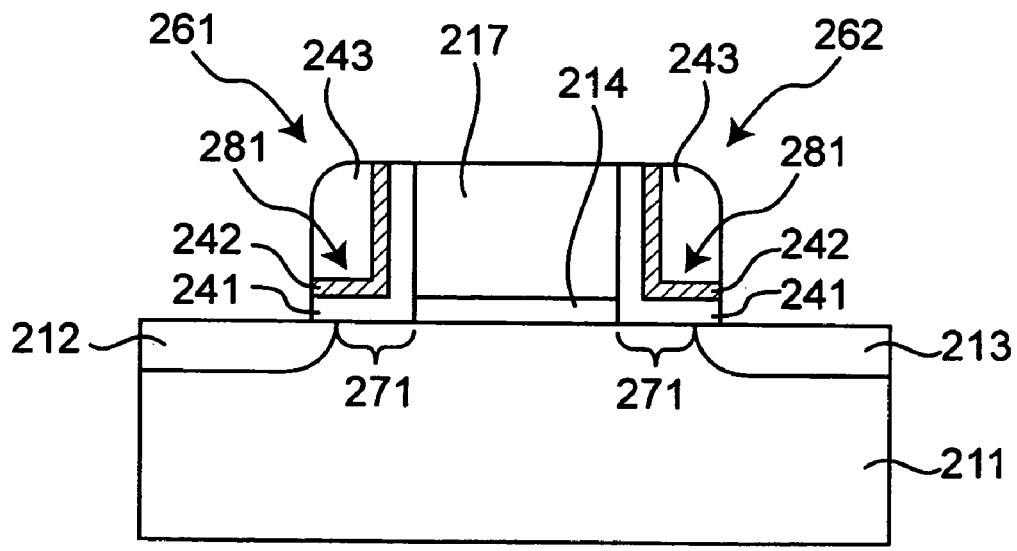
FIG. 8 is a schematic sectional view of the essential part of a memory element in the semiconductor storage device of the second embodiment of the present invention.

As shown in FIG. 8, the memory element in the semiconductor storage device of the present embodiment has a construction substantially similar to that of the memory element 1 of FIG. 1 except for the memory function bodies 261 and 262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 242 that has a level for trapping electric charges as a charge retaining film and silicon oxide films 241 and 243 that have the operation of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 242 is held between the silicon oxide films 241 and 243, charge injection efficiency during the rewrite operation is increased, and higher-speed operation becomes possible. In this memory element, the silicon nitride film 242 may be replaced by a ferroelectric substance.

Also, the region (silicon nitride film 242) for holding electric charges in the memory function bodies 261, 262 are overlapped with the diffusion layer regions 212, 213. Herein, the term "overlap" is used to refer to the state that at least part of the region (silicon nitride film 242) for holding electric charges is present on at least part of the diffusion layer regions 212, 213. It is noted that there are shown a semiconductor substrate 211, a gate insulating film 214, a gate electrode 217 and an offset region 271 between the gate electrode 217 and the diffusion layer regions 212, 213. Though unshown in the drawing, the uppermost surface of the semiconductor substrate 211 under the gate insulating film 214 is a channel region.

An effect produced by the arrangement that the silicon nitride film 242 serving as the region for retaining electric charges in the memory function bodies 261 and 262 overlap with the diffusion regions 212 and 213 will be described.

Figure 9:
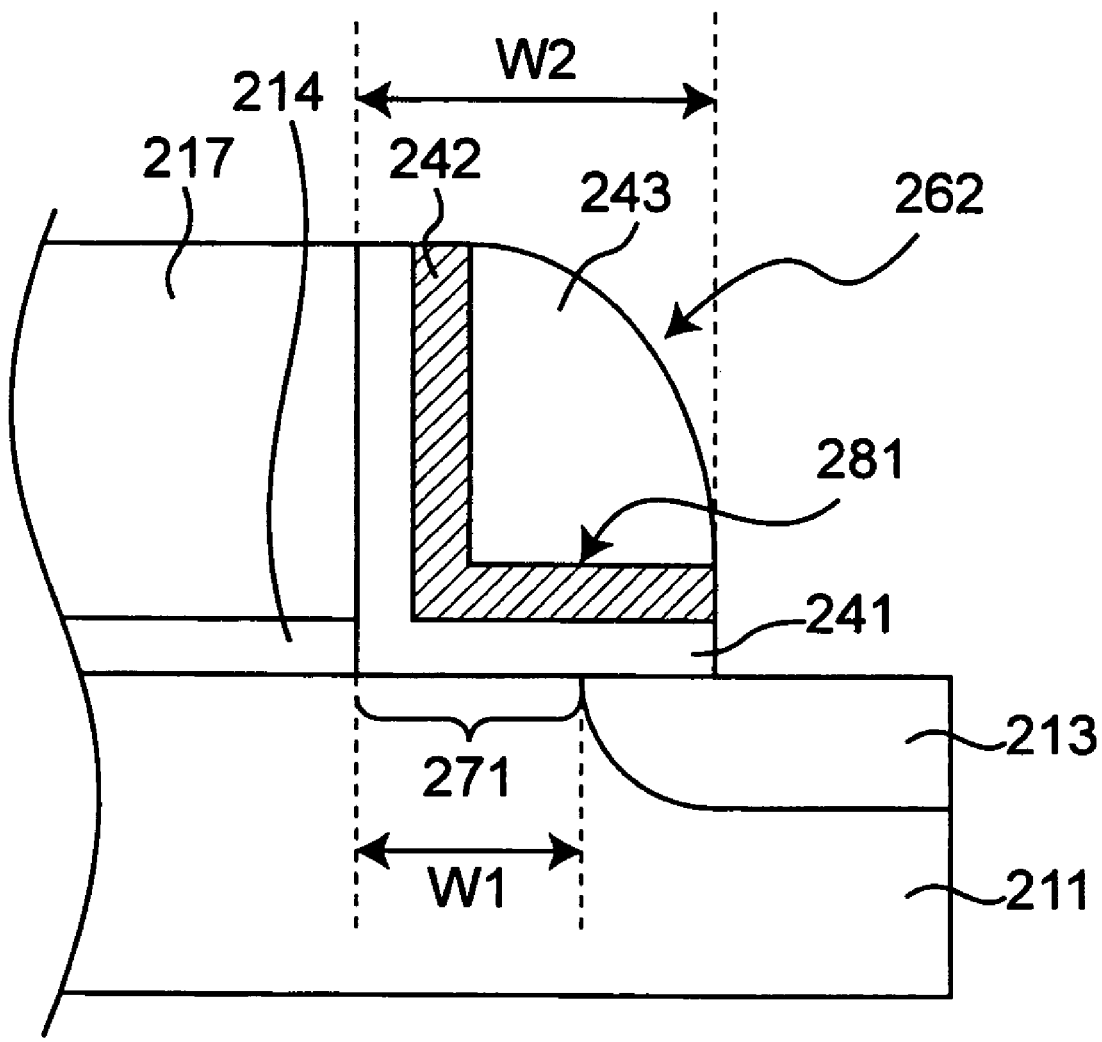
FIG. 9 is an enlarged schematic sectional view of the essential part of the semiconductor storage device of FIG. 8.

As shown in FIG. 9, assuming that the amount of offset of a gate electrode 217 with respect to a diffusion region 213 is W1 and that the width of a memory function body 262 in a cross-sectional plane in the channel-length direction of the gate electrode 217 is W2 in the peripheral portions of the memory function body 262, then the amount of overlap of the memory function body 262 with the diffusion region 213 is expressed by W2-W1. What is important here is that the memory function body 262 constructed of the silicon nitride film 242 of the memory function body 262 overlaps with the diffusion region 213, i.e., the arrangement that the relation: W2>W1 is satisfied.

In FIG. 9, the end of the silicon nitride film 242 remote from the gate electrode 217 coincided with the end of the memory function body 262 remote from the gate electrode 217 at the memory function body 262. Therefore, the width of the memory function body 262 was defined as W2.

Figure 10:
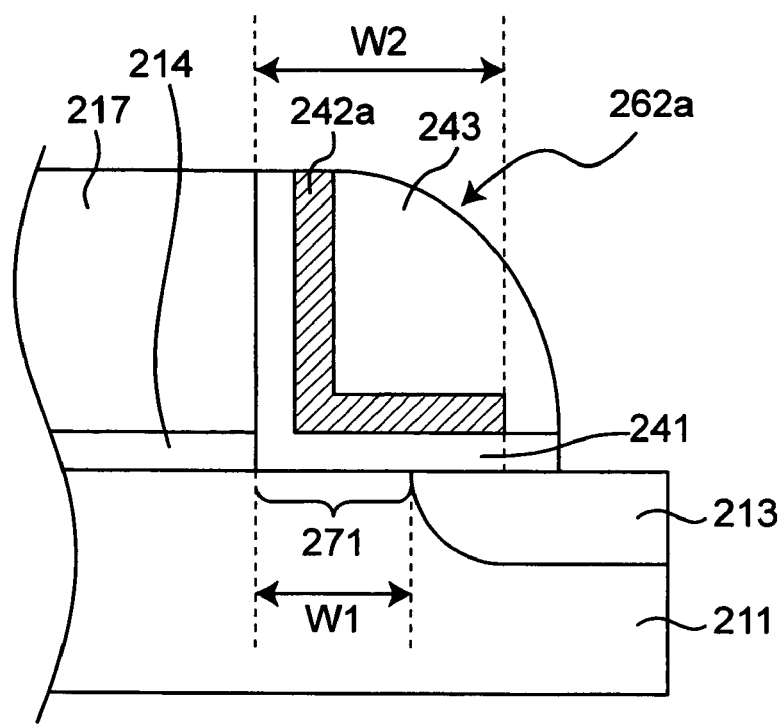
FIG. 10 is an enlarged schematic sectional view of part of the modified semiconductor storage device of FIG. 8.

In the case where an edge of a silicon nitride film 242a on the side away from the gate electrode in a memory function body 262a is not aligned with an edge of the memory function body 262a on the side away from the gate electrode 217 as shown in FIG. 10, W2 may be defined as the width from the edge of the gate electrode to the edge of the silicon nitride film 242a on the side away from the gate electrode 217.

Figure 11:
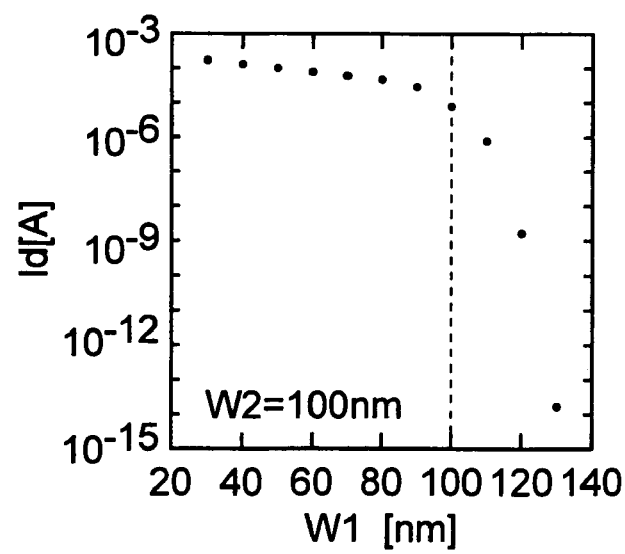
FIG. 11 is a graph showing the electrical characteristic of the memory element in the semiconductor storage device of the second embodiment.

FIG. 11 shows a drain current Id in the structure of FIG. 9 with the width W2 of the memory function body 262 being fixed to 100 nm and the offset amount W1 being varied. Herein, the drain current is obtained by device simulation performed under the conditions that the memory function body 262 is in erase state (positive holes are stored), and the diffusion layer regions 212, 213 are set to be a source electrode and a drain electrode, respectively. As shown in FIG. 11, with W1 being 100 nm or more (i.e., when the silicon nitride film 242 and the diffusion layer region 213 are not overlapped), the drain current shows rapid reduction. Since a drain current value is almost in proportion to a read operation speed, memory performance is rapidly deteriorated when W1 is 100 nm or more. In the range where the silicon nitride film 242 and the diffusion layer region 213 are overlapped, the drain current shows mild reduction. Therefore, taking a manufacturing dispersion into consideration, it is difficult to obtain a memory function unless at least part of the silicon nitride film 242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 242 is overlapped with the diffusion layer regions 212, 213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2-W1>10 nm was more preferable in consideration to manufacturing dispersion.

It is preferable for reading information stored in the memory function body 261 (region 281) to set the diffusion layer region 212 as a source electrode and the diffusion layer region 213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 261 with good sensitivity regardless of the storage condition of the memory function body 262, resulting in large contribution to implementation of two-bit operation.

In the case of storing information only in one side out of the two memory function bodies, or in the case of using these two memory function bodies in the same storing condition, an pinch-off point is not necessarily formed in read operation.

Although not shown in FIG. 8, a well region (P type well in the case of N-channel device) is preferably formed on the surface of the semiconductor substrate 211. Forming the well region facilitates control of other electric characteristics (withstand voltage, junction capacitance, and short channel effect) while maintaining impurity concentration of the channel region optimum for memory operation (rewrite operation and read operation).

Figure 12:
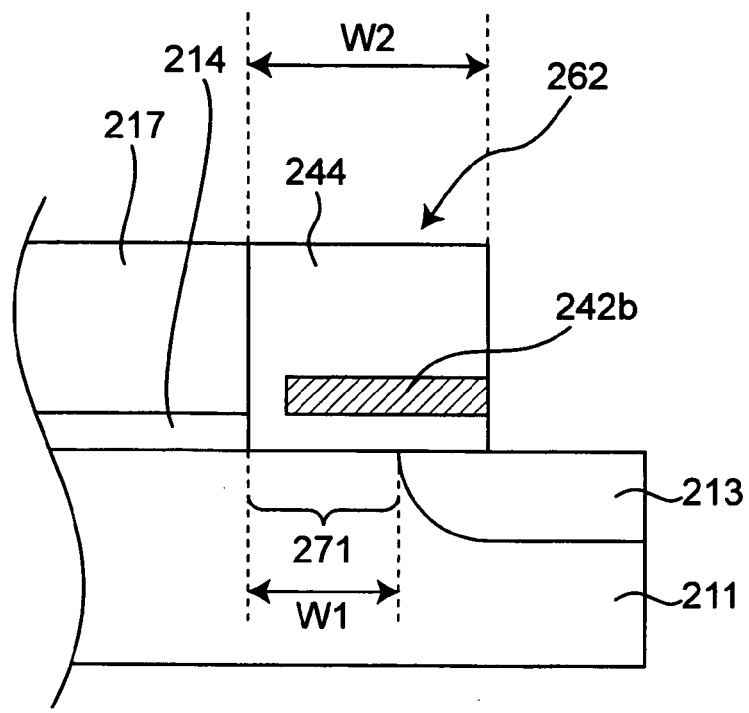
FIG. 12 is a schematic sectional view of part of a memory element in the semiconductor storage device of the modified second embodiment of the present invention.

Also, it is preferable that the memory function body contains a charge holding film disposed approximately parallel to the surface of the gate insulating film. In other words, it is preferable that the surface of the charge holding film in the memory function body is disposed so as to have a constant distance from the surface of the gate insulating film. More particularly, as shown in FIG. 12, a silicon nitride film 242b as an electric holding film in the memory function body 262 has a face approximately parallel to the surface of the gate insulating film 214. In other words, the silicon nitride film 242b is preferably formed to have a uniform height from the height corresponding to the surface of the gate insulating film 214.

The presence of the silicon nitride film 242b approximately parallel to the surface of the gate insulating film 214 in the memory function body 262 makes it possible to effectively control easiness of formation of an inversion layer in the offset region 271 with use of an amount of electric charges stored in silicon nitride film 242b, thereby enabling increase of memory effect. Also, by placing the silicon nitride film 242b approximately parallel to the surface of the gate insulating film 214, change of memory effect may be kept relatively small even with a dispersed offset amount (W1), enabling restraint of memory effect dispersion. In addition, movement of electric charges toward upper side of the silicon nitride film 242b may be suppressed, and therefore characteristic change due to the movement of electric charges during memory holding may be restrained.

Furthermore, the memory function body 262 preferably contains an insulating film (e.g., a portion of the silicon oxide film 244 on the offset region 271) that separates the silicon nitride film 242b approximately parallel to the surface of the gate insulating film 214 from the channel region (or the well region). This insulating film may restrain dispersion of the electric charges stored in the charge holding film, thereby contributing to obtaining a memory element with better holding characteristics.

It is noted that controlling the film thickness of the silicon nitride film 242b as well as controlling the film thickness of the insulating film under the silicon nitride film 242b (a portion of the silicon oxide film 244 on the offset region 271) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the silicon nitride 242b to the sum of a maximum film thickness of the insulating film under the silicon nitride film 242b and a maximum film thickness of the silicon nitride film 242b. Consequently, the concentration of electric line of force generated by the electric charges stored in the silicon nitride film 242b may be substantially controlled, and therefore dispersion of the degree of memory effect of the memory element may be minimized.

The Third Embodiment

Figure 13:
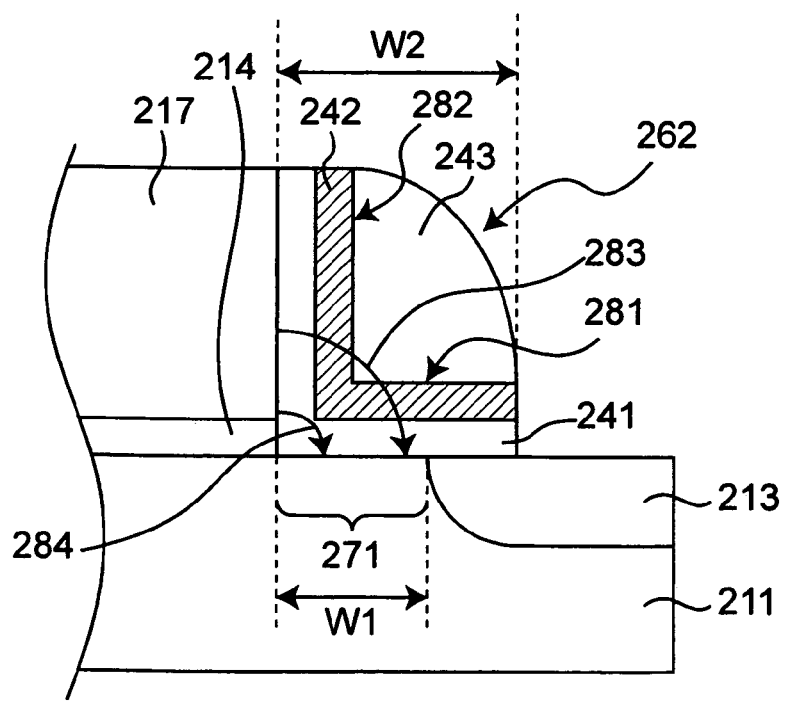
FIG. 13 is a schematic sectional view of part of a memory element in the semiconductor storage device of the third embodiment of the present invention.

In this embodiment, a silicon nitride film 242 as a film made of a first insulator in the charge holding portion 262 has an approximately uniform film thickness as shown in FIG. 13. Further, the silicon nitride film 242 as a charge holding film is configured such that a region 281 having a constant thickness and disposed approximately parallel to the surface of the gate insulating film 214 and a region 282 extending in direction approximately parallel to the side face of the gate electrode 217.

When a positive voltage is applied to the gate electrode 217, electric line of force in the memory function body 262 passes the silicon nitride film 242 total two times through the first portion 281 and the second portion 282 as shown with an arrow 283. It is noted that when a negative voltage is applied to the gate electrode 217, the direction of electric line of force is reversed. Herein, a dielectric constant of the silicon nitride film 242 is approx. 6, while a dielectric constant of silicon oxide films 241, 243 is approx. 4. Eventually, an effective dielectric constant of the memory function body 262 in the direction of electric line of force (arrow 283) becomes larger than that in the case where the charge holding film includes only the first portion 281, which makes it possible to decrease potential difference between the both edges of the electric line of force. More specifically, much part of the voltage applied to the gate electrode 217 is used to reinforce electric fields in the offset region 271.

Electric charges are injected into the silicon nitride film 242 in rewrite operation because generated electric charges are pulled by electric fields in the offset region 271. As a consequence, the silicon nitride film 242 including the second portion 282 increases the electric charges injected into the memory function body 262 in rewrite operation, thereby increasing a rewrite speed.

In the case where the portion of the silicon oxide film 243 is a silicon nitride film, more specifically, in the case where the charge holding film is not flat against the height corresponding to the surface of the gate insulating film 214, movement of electric charges toward upper side of the silicon nitride film becomes outstanding, and holding characteristics are deteriorated.

Instead of silicon nitride film, the charge holding film is more preferably formed from high-dielectric substances such as hafnium oxide having extremely large dielectric constant.

Further, the memory function body more preferably includes an insulating film (a portion of the silicon oxide film 241 on the offset region 271) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the memory function body more preferably includes an insulating film (a portion of the silicon oxide film 241 in contact with the gate electrode 217) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the memory element.

Further, similar to the second embodiment, it is preferable that the film thickness of the insulating film under the silicon nitride film 242 (a portion of the silicon oxide film 241 on the offset region 271) is controlled to be constant, and further the film thickness of the insulating film disposed on the side face of the gate electrode (a portion of the silicon oxide film 241 in contact with the gate electrode 217) is controlled to be constant. Consequently, the concentration of electric line of force generated by the electric charges stored in the silicon nitride film 242 may be substantially controlled, and leakage of electric charges may be prevented.

The Fourth Embodiment

In this embodiment, optimization of the distance between a gate electrode, a memory function body, and a source/drain region is explained.

Figure 14:
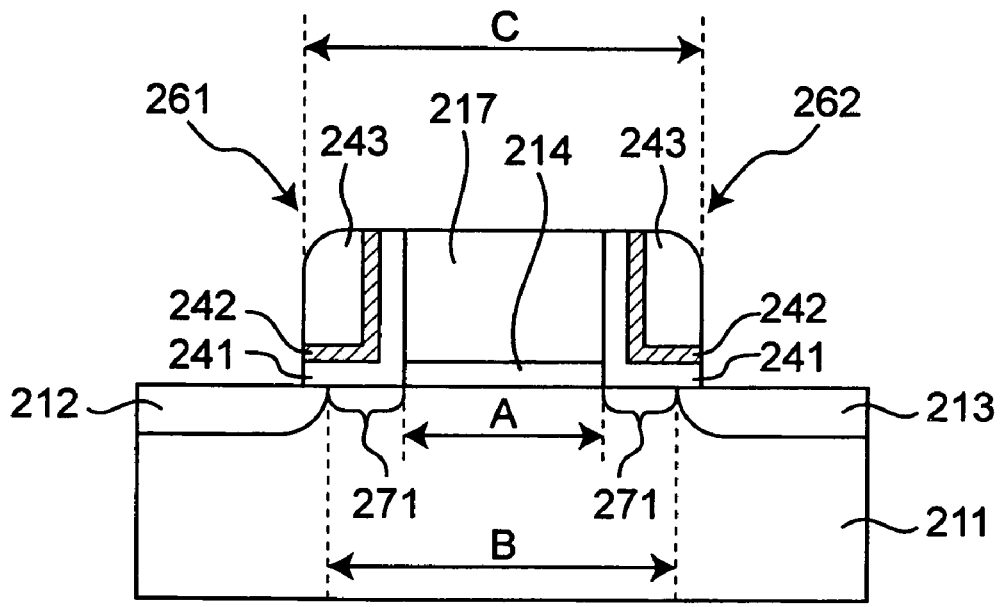
FIG. 14 is a schematic sectional view of part of a memory element in the semiconductor storage device of the fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film (the side away from the gate electrode) having a function of holding the electric charges in the other memory function body.

An equation A<B is preferable. When this equation is satisfied, in the channel region, there is present an offset region 271 between a portion under the gate electrode 217 and the source/drain regions 212, 213. Thereby, the electric charges stored in the memory function bodies 261, 262 (silicon nitride film 242) effectively change easiness of inversion in the entire part of the offset region 271. As a result, memory effect is increased, and high-speed read operation is particularly enabled.

Also, when the gate electrode 217 and the source/drain regions 212, 213 are offset, that is when an equation A<B is satisfied, easiness of inversion of the offset region when a voltage is applied to the gate electrode 217 is largely changed by an electric charge amount stored in the memory function bodies 261, 262. Consequently, memory effect increases and short channel effect can be reduced.

However, as long as the memory effect is effective, the offset region is not necessarily required. Even when the offset region 271 is not present, if the impurity concentration in the source/drain regions 212, 213 is sufficiently small, the memory effect can still be effective in the memory function bodies 261, 262 (silicon nitride film 242). Also, as described referring to FIG. 11, a memory function can not substantially be obtained unless at least part of the silicon nitride film 242a is overlapped with the source/drain region 212, 213. Therefore, the state of A<B<C is most preferable.

The Fifth Embodiment

Figure 15:
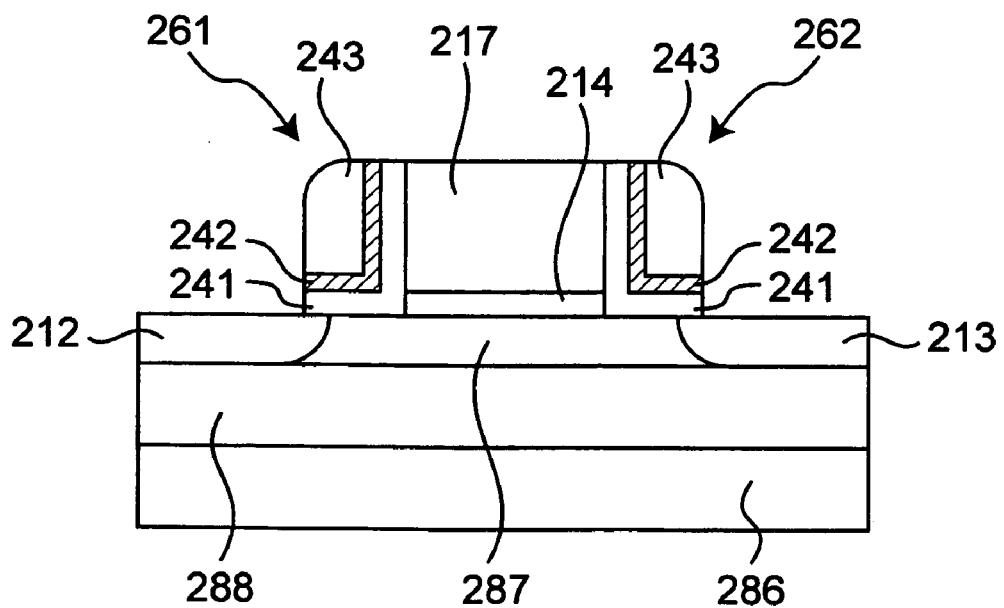
FIG. 15 is a schematic sectional view of part of a memory element in the semiconductor storage device of the fifth embodiment of the present invention.

A memory element of semiconductor storage device according to this embodiment has essentially the same structure as that in the second embodiment except that the semiconductor substrate is SOI substrate as shown in FIG. 15.

The memory element is structured such that an embedded oxide film 288 is formed on a semiconductor substrate 286, and on top of the embedded oxide film 288, SOI layer is further formed. In the SOI layer, there are formed diffusion regions 212, 213, and other areas constitute a body region 287.

This memory element also brings about the functions and effects similar to those of the memory element in the second embodiment. Further, since the junction capacitance between the diffusion regions 212, 213 and the body region 287 may be considerably reduced, it becomes possible to increase a device speed and to decrease power consumption.

The Sixth Embodiment

Figure 16:
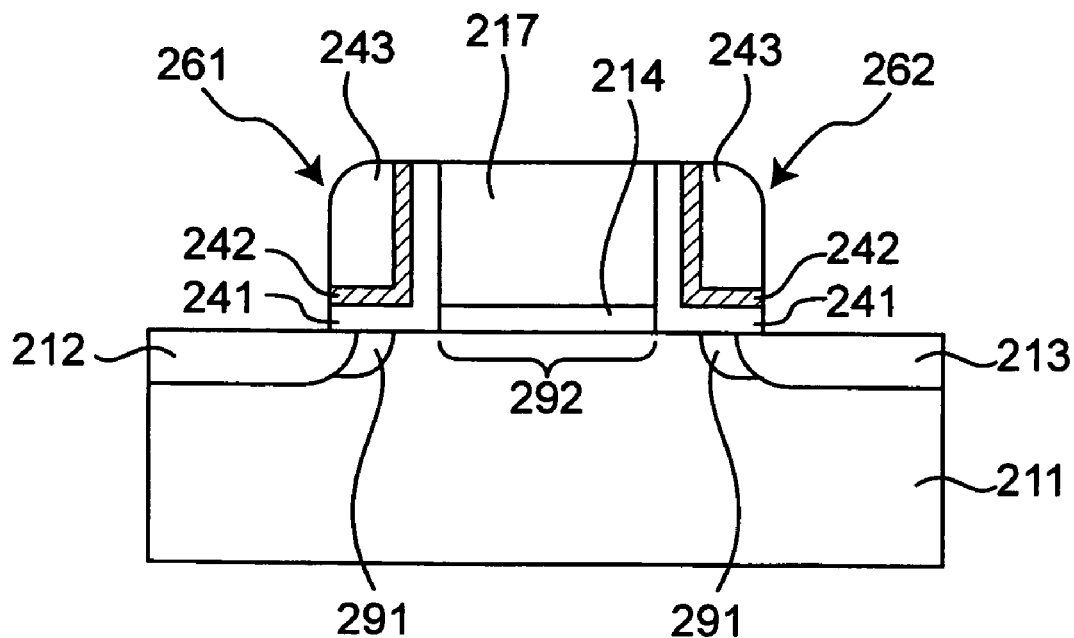
FIG. 16 is a schematic sectional view of part of a memory element in the semiconductor storage device of the sixth embodiment of the present invention.

A memory element in this embodiment has essentially the same structure as that in the second embodiment except that in the vicinity of the channel side of N type diffusion regions 212, 213, a P type highly-concentrated region 291 is added as shown in FIG. 16.

More specifically, the concentration of P type impurity (e.g., boron) in the P type highly-concentrated region 291 is higher than the concentration of P type impurity in the region 292. An appropriate value of the P type impurity concentration in the P type highly-concentrated region 291 is, for example, around $5 \times 10^{17}$ to $1 \times 10^{19}$ cm$^{-3}$. Also, a value of the P type impurity concentration in the region 292 may be set to, for example, $5 \times 10^{16}$ to $1 \times 10^{18}$ cm$^{-3}$.

Thus, providing the P type highly-concentrated region 291 makes the junction between the diffusion regions 212, 213 and the semiconductor substrate 211 steep right under the memory function bodies 261, 262. This facilitates generation of hot carriers in write and erase operation, thereby enabling reduction of voltage in write operation and erase operation or implementing high-speed write operation and erase operation. Further, since the impurity concentration in the region 292 is relatively small, a threshold value when the memory is in erased state is small and so the drain current becomes large. Consequently, a read speed is increased. This makes it possible to provide a memory element having low rewrite voltage or a high rewrite speed, and having a high read speed.

Also in FIG. 16, by providing the P type highly-concentrated region 291 in a position adjacent to the source/drain region and on the lower side of the memory function bodies 261, 262 (that is a position not right under the gate electrode), a threshold value of the entire transistor shows considerable increase. The degree of this increase is extremely larger than that in the case where the P type highly-concentrated region 291 is right under the gate electrode. When write electric charges (electrons in the case where the transistor is N channel type) are stored in the memory function bodies 261, 262, the difference becomes larger. When enough erase electric charges (positive holes in the case where the transistor is N channel type) are stored in the memory function body, a threshold value of the entire transistor is decreased down to a value determined by the impurity concentration in the channel region (region 292) under the gate electrode 217. More specifically, the threshold value in the erased state is not dependent on the impurity concentration in the P type highly-concentrated region 291, whereas the threshold value in the written state receives extremely large influence. Therefore, disposing the P type highly-concentrated region 291 under the memory function bodies and adjacent to the source/drain region imparts extremely large fluctuation only to the threshold value in the written state, thereby enabling remarkable increase of memory effect (difference of threshold values in the erased state and the written state).

The Seventh Embodiment

Figure 17:
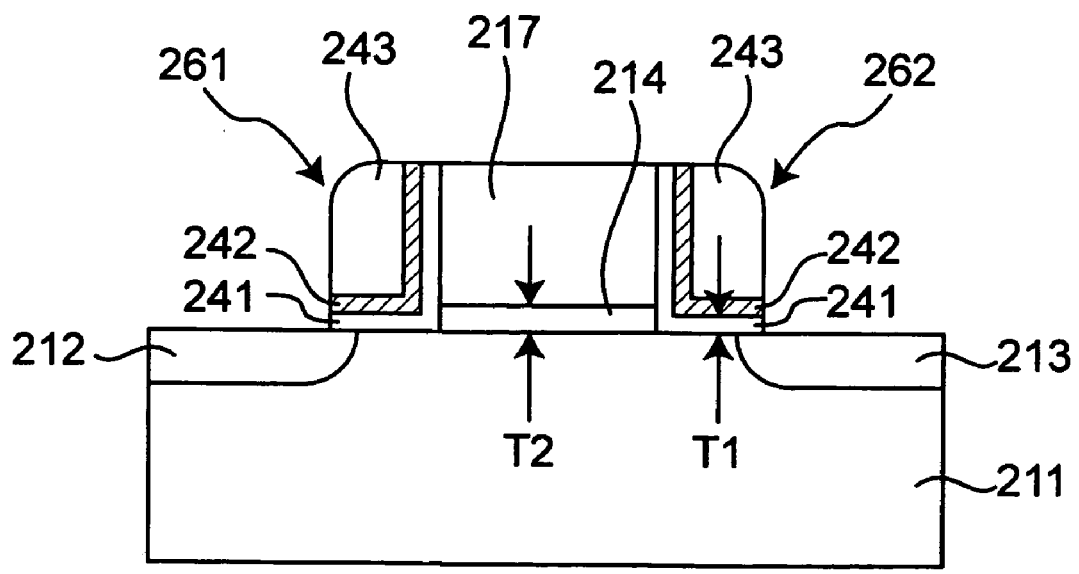
FIG. 17 is a schematic sectional view of part of a memory element in the semiconductor storage device of the seventh embodiment of the present invention.

A memory body of a semiconductor storage device in this embodiment has essentially the same structure as that in the second embodiment except that the thickness T1 of the insulating film 241 that separates the charge holding film (silicon nitride film 242) from the channel region or the well region 211 is smaller than the thickness T2 of the gate insulating film 214 as shown in FIG. 17.

The gate insulating film 214 has a lower limit of the thickness T2 because of the request for withstand voltage in memory rewrite operation. However, the thickness T1 of the insulating film 241 can be smaller than T2 regardless of the request for withstand voltage.

In the memory element of the present embodiment, the thickness T1 of the insulating film has high design freedom as stated above because of the following reason.

In the memory element, the insulating film 241 that separates the charge holding film (silicon nitride film 242) from the channel region or the well region is not interposed in between the gate electrode 217 and the channel region or the well region. Consequently, the insulating film 241 that separates the charge holding film (silicon nitride film 242) from the channel region or the well region does not receive direct influence from the high-electric fields that affect in between the gate electrode 217 and the channel region or the well region, but receives influence from relatively weak electric fields expanding from the gate electrode 217 in lateral direction. As a result, despite the request for withstand voltage to the gate insulating film 214, it becomes possible to make T1 smaller than T2. Decreasing the thickness T1 of the insulating film facilitates injection of electric charges into the memory function bodies 261, 262, decreases voltage for write operation and erase operation, or enables high-speed write operation and erase operation. In addition, since an electric charge amount induced in the channel region or the well region increases when electric charges are stored in the silicon nitride film 242, increased memory effect may be implemented.

Some electric lines of force having short length in the memory function body do not pass the silicon nitride film 242 as shown with an arrow 284 in FIG. 13. Since electric field strength is relatively large on such a short electric line of force, the electric fields along the electric line of force plays an important role in rewrite operation. By decreasing the thickness T1 of the insulating film 241, the silicon nitride film 242 moves to the lower side of the FIG. 13, so that the electric line of force shown with the arrow 284 passes the silicon nitride film 242. As a consequence, an effective dielectric constant in the memory function body along the electric line of force in the direction of arrow 284 becomes large, which makes it possible to make potential difference between the both ends of the electric line of force smaller. Therefore, most part of voltage applied to the gate electrode 217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory element.

As is clear from the above, by setting the thickness T1 of the insulating film 241 and the thickness T2 of the gate insulating film 214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18 V voltage is necessary for driving liquid crystal panel TFT (Thin Film Transistor). Eventually, it is not possible to make the gate oxide film thinner. In the case of mounting a nonvolatile memory of an embodiment of the present invention as an image adjuster together with other devices on the liquid crystal driver LSI, the memory element of an embodiment of the present invention enables optimum design of the thickness of the insulating film that separates the charge holding film (silicon nitride film 242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

The Eighth Embodiment

Figure 18:
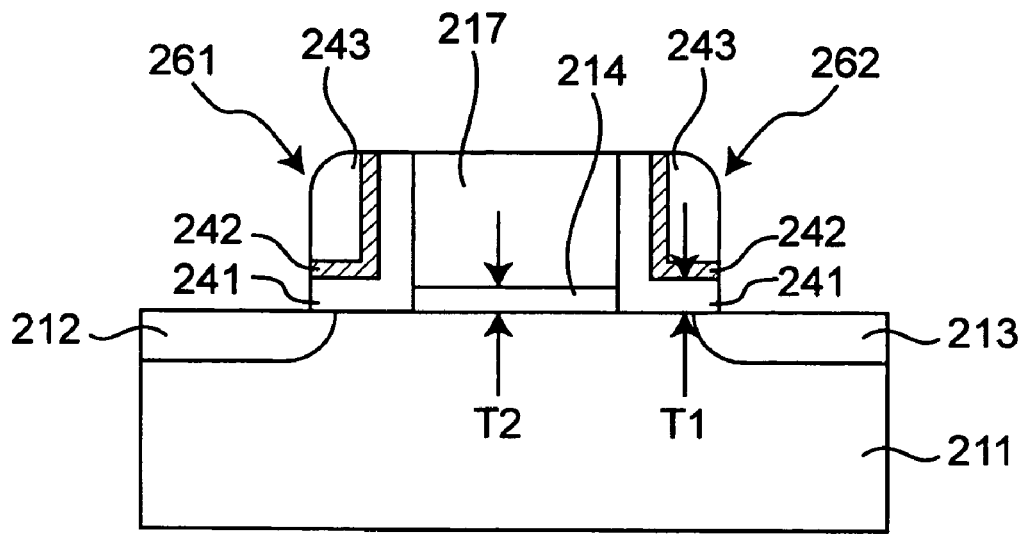
FIG. 18 is a schematic sectional view of part of a memory element in the semiconductor storage device of the eighth embodiment of the present invention.

A memory element of a semiconductor storage device according to this embodiment has essentially the same structure as that in the second embodiment except that the thickness (T1) of the insulating film that separates the charge holding film (silicon nitride film 242) from the channel region or the well region is larger than the thickness (T2) of the gate insulating film as shown in FIG. 18.

The gate insulating film 214 has an upper limit of the thickness T2 because of the request for prevention of short channel effect of the device. However, the thickness T1 of the insulating film 241 can be larger than T2 regardless of the request for prevention of short channel effect. More specifically, as miniaturization scaling proceeds (thinning of the gate insulating film proceeds), the thickness of the insulating film that separates the charge holding film (silicon nitride film 242) from the channel region or the well region may be optimally designed independently of the thickness T2 of the gate insulating film, which implements the effect that the memory function body will not disturb scaling.

In the memory element of the present embodiment, the thickness T1 of the insulating film has high design freedom as stated above because, as is already described, the insulating film that separates the charge holding film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dispersion of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory element of the present invention, independent designing of T1 and T2 is available as described above, and therefore miniaturization becomes possible.

In an embodiment of the present invention, for example, in a memory cell with a gate electrode length (word line width) of 45 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode miniaturization is further facilitated compared to normal logic transistors.

As described above, since an electrode for supporting write and erase operation is not present above the memory function body, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in comparison with the same processing accuracy.

The Ninth Embodiment

This embodiment relates to changes of electric characteristics when rewrite operation is performed in the memory element of the semiconductor storage device according to the present invention.

Figure 19:
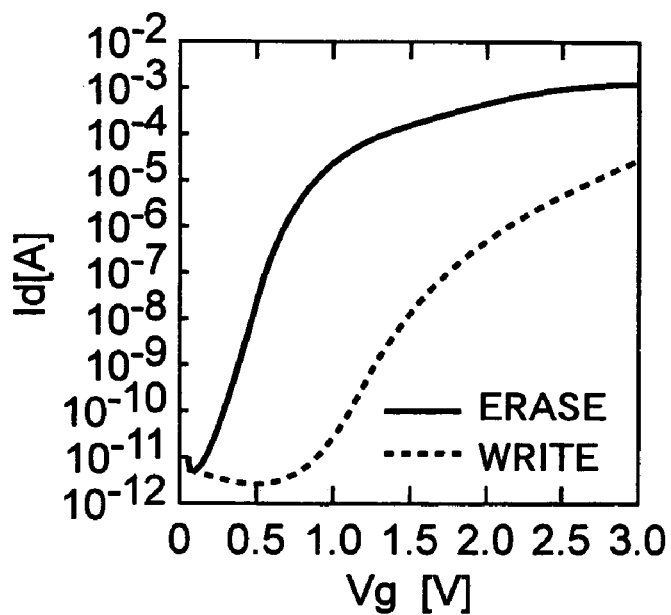
FIG. 19 is a graph showing the electrical characteristic of the memory element in the semiconductor storage device of the ninth embodiment.

FIG. 19 is a view showing characteristic curves of a drain current (Id) versus a gate voltage (Vg) (measured values) where an electric charge amount in the memory function body of an N-channel type memory element varies between erase state and written state.

Figure 41:
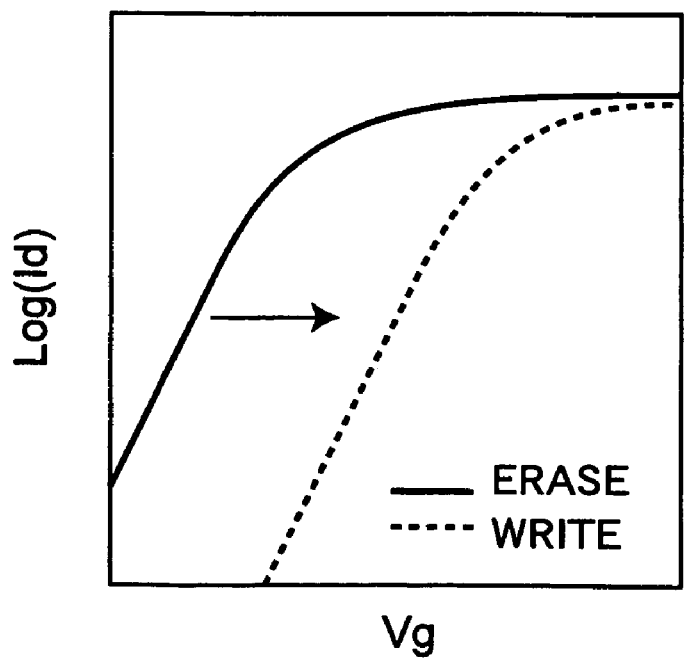
FIG. 41 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5 V, the current ratio is still two digits or more. This characteristic is largely different from that in the case of a flash memory shown in FIG. 41.

The appearance of the above characteristic in the memory element is a phenomenon peculiar to the case where the gate electrode and the diffusion region are offset and therefore the gate electric fields are difficult to reach the offset region. When the memory element is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory element is in the erased state, high-density electrons are induced in the offset region. Further, when 0 V is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the disclosed memory element makes it possible to make the drain current ratio of the erased state to the written state particularly large.

The Tenth Embodiment

This embodiment is related to a semiconductor storage device, in which a plurality of memory elements described in connection with the first through eighth embodiments are arranged and into which a rewrite and read circuit is incorporated and to a method for operating the device.

Figure 20:
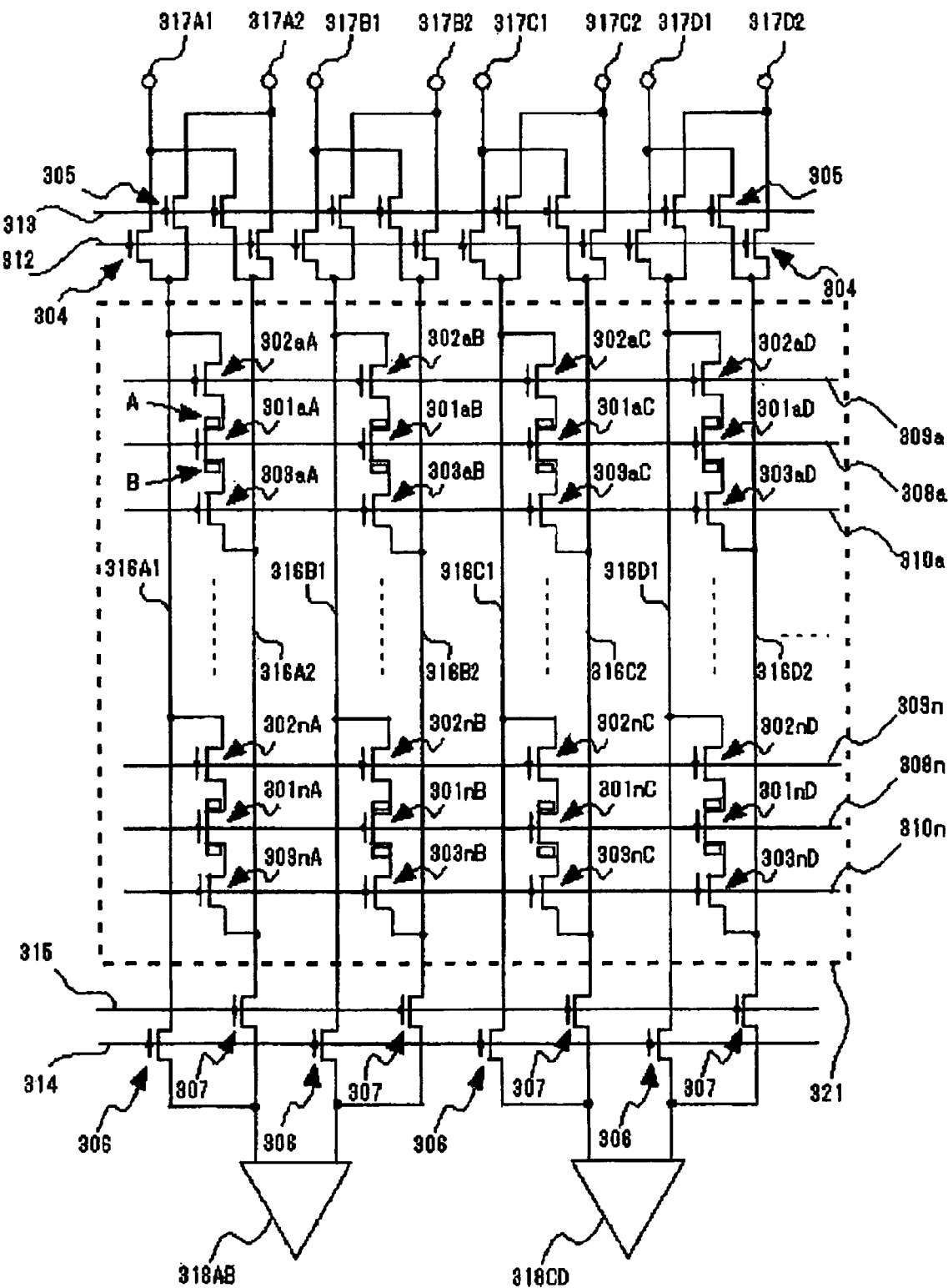
FIG. 20 is a circuit diagram of a semiconductor storage device of the tenth embodiment of the present invention.

As shown in the circuit diagram of FIG. 20, this semiconductor storage device includes a memory element array region (memory cell array) 321, a circuit section for giving a predetermined rewrite or read voltage to each memory element, a sense amplifier and a circuit section that connects the sense amplifier to each memory element. It is to be noted that the other peripheral circuits are not shown.

Memory elements 301aA-301aD, . . . , 301nA-301nD in the section (memory cell array) 321 where the memory elements are arranged are the memory elements described in connection with the first through eighth embodiments. Each of these memory elements has two memory function bodies, and in order to distinguish them from each other, only the memory element 301aA is indicated by an arrow A and an arrow B, and no indication is provided for the other memory elements in FIG. 20.

To each memory element is connected a total of two select transistors located on both sides of the element. For example, select transistors 302aA and 303aA are connected in series with the memory element 301aA.

The gate electrodes of the memory elements 301aA-301aD are connected to a word line 308a. The gate electrodes of the other memory elements are each similarly connected to a word line. Moreover, the gate electrodes of the select transistors 302aA-302aD are connected to a select transistor word line 309a, while the gate electrodes of the select transistors 303aA-303aD are connected to a select transistor word line 310a. The gate electrodes of the other select transistors are each similarly connected to a select transistor word line.

The select transistors 302aA-302nA are connected to a first bit line 316A1, while the select transistors 303aA-303nA are connected to a second bit line 316A2. The other select transistors are similarly connected to either the first or second bit line.

A pair of operation select transistors 304 and 305 are connected to each bit line. The operation select transistors 304 and 305 are connected to first voltage input terminals 317A1-317D1 or second voltage input terminals 317A2-317D2. The gate electrodes of the operation select transistors 304 and 305 are connected to operation select lines 312 and 313, respectively. With the above interconnections, if the operation select line 312 is selected, then, for example, the first bit line 316A1 is connected to the first voltage input terminal 317A1, while the second bit line 316A2 is connected to the second voltage input terminal 317A2. If the operation select line 313 is selected, then, for example, the first bit line 316A1 is connected to the second voltage input terminal 317A2, while the second bit line 316A2 is connected to the first voltage input terminal 317A1. That is, a pair of bit lines 316A1 and 316A2 are connected to mutually different voltage input terminals, and the voltage input terminal to be connected can be interchanged by changing the selection of the operation select line.

Two bit line pairs (e.g., the bit line pair 316A1 and 316A2 and the pair 316B1 and 316B2) are connected to one input and the other input of a sense amplifier that has two inputs via a switchover transistor. More concretely, the bit line pairs are connected as follows.

The first bit lines 316A1-316D1 are connected to a first switchover transistor 306. The second bit lines' 316A2-316D2 are connected to a second switchover transistor 307. The gate electrodes of the switchover transistors 306 and 307 are connected to switchover transistor select lines 314 and 315, respectively. With the interconnections as described above, if the switchover transistor select line 314 is selected, then, for example, one input of a sense amplifier 318AB is connected to the first bit line 316A1, while the other input of the sense amplifier 318AB is connected to the first bit line 316B1. If the switchover transistor select line 315 is selected, then, for example, one input of the sense amplifier 318AB is connected to the second bit line 316A2, while the other input of the sense amplifier 318AB is connected to the second bit line 316B2.

It is to be noted that the sense amplifier is merely required to be an amplifier capable of detecting an output current from the memory element, and, for example, a differential amplifier can be employed therefore.

Although four pairs of bit lines are arranged in FIG. 20, it is possible to arrange an arbitrary number of pairs of bit lines. Moreover, in FIG. 20, two pairs of bit lines are connected to one sense amplifier. This is because the selected two memory elements serve as a pair to be connected to one and the other inputs of one sense amplifier as described later.

However, as another example of the application of the memory elements to such a semiconductor storage device, it is acceptable to connect one memory element to one input of a sense amplifier and connect an external reference cell to the other input of the sense amplifier.

A method for operating this semiconductor storage device will be described. The operation of this semiconductor device includes rewrite operation and read operation, and the rewrite operation includes write operation and erase operation.

Reference is first made to a method for performing the write operation. As one example of the write operation, it is herein described the case where the memory element 301aA is subjected to write.

The operation select line 312 is selected to turn on the operation select transistor 304. By this operation, for example, the first bit line 316A1 is connected to the first voltage input terminal 317A1, while the second bit line 316A2 is connected to the second voltage input terminal 317A2. The same thing can be said for the other bit lines.

Further, the select transistor word lines 309a and 310a are selected. By this operation, one (located on the memory function body A side) in the diffusion regions (source/drain) of the memory element 301aA is connected to the first voltage input terminal 317A1, while the other (located on the memory function body B side) is connected to the second voltage input terminal 317A2. The same thing can be said for the memory elements 301aB-301aD connected to the word line 308a.

In this case, predetermined voltages for write are applied to the word line 308a and the first and second voltage input terminals 317A1 and 317A2. First of all, a voltage of, for example, +5 V is applied to the word line 308a. Further, a voltage of +5 V is applied to the first voltage input terminal 317A1, and a voltage of 0 V is applied to the second voltage input terminal 317A2. By this operation, write is selectively performed on the memory function body A side of the memory element 301aA.

At this time, if a predetermined voltage is applied to the other voltage input terminals, it is possible to execute write also in the memory elements 301aB-301aD. Moreover, concerning the memory elements that are not subjected to write, the voltage input terminal receives a voltage of 0 V or is put in an open state.

When write is performed on the memory function body B side of the memory element 301aA, it is proper to select an operation select line 313 instead of selecting the operation select line 312 and make other selection operations and voltage application conditions similar. It is acceptable to interchange the voltage applied to the first voltage input terminal 317A1 with the voltage applied to the second voltage input terminal 317A2.

Reference is next made to a method of the erase operation. As one example of the erase operation, it is herein described the case where the memory element 301aA is subjected to erase.

Similarly to the case of the write operation, the operation select line 312 is selected to turn on the operation select transistor 304 and select the select transistor word lines 309a and 310a.

In this case, predetermined voltages for erase are applied to the word line 308a and the first and second voltage input terminals 317A1 and 317A2. First of all, a voltage of, for example, −5 V is applied to the word line 308a. Further, a voltage of +5 V is applied to the first voltage input terminal 317A1, and a voltage of 0 V is applied to the second voltage input terminal 317A2. By this operation, erase is selectively performed on the memory function body A side of the memory element 301aA.

At this time, if predetermined voltages are applied to the other voltage input terminals, erase can also be performed in the memory elements 301aB-301aD. Moreover, concerning the memory elements that are not subjected to erase, the voltage input terminal receives a voltage of 0 V or is put in the open state.

When erase is performed on the memory function body B side of the memory element 301aA, it is proper to select the operation select line 313 instead of selecting the operation select line 312 and make the other selection operation and voltage application conditions similar. It is acceptable to interchange the voltage applied to the first voltage input terminal 317A1 with the voltage applied to the second voltage input terminal 317A2.

Reference is next made to a method of the read operation. As one example of the read operation, it is herein described the case where the information stored in the memory element 301aA is read.

When reading the storage information on the memory function body A side of the memory element 301aA, the operation select line 313 is selected to turn on the operation select transistor 305, and the switchover transistor select line 314 is selected to turn on the first switchover transistor 306. Further, a voltage of, for example, +2 V appropriate for the read operation is applied to the word line 308a. Subsequently, a voltage of, for example, +1.8 V is applied to the first voltage input terminal 317A1. The second voltage input terminal 317A2 is put in the open state.

According to the aforementioned selection operation and voltage application conditions, a current flows from the first voltage input terminal 317A1 via the memory element 301aA to one input of the sense amplifier 318AB. By detecting this current value, the information stored in the memory element 301aA can be distinguished. At this time, the memory function body A side of the memory element 301aA serves as a source, and therefore, the amount of electric charge accumulated in the memory function body A mainly exerts influence on the value of the current flowing through the memory element 301aA. Therefore, only the storage information on the memory function body A side can be selectively read.

As described in connection with the ninth embodiment, in the semiconductor storage device of the present invention, a ratio of a drain current during write and a drain current during erase can be particularly increased in the memory element, and therefore, it is easy to distinguish between the written state and the erased state.

When reading the storage information on the memory function body B side of the memory element 301aA, it is proper to select the operation select line 312 instead of selecting the operation select line 313, select the switchover transistor select line 315 instead of selecting the switchover transistor select line 314 and make the other selection operation and voltage application conditions similar.

If a voltage of, for example, +1.8 V for read is further applied to the first voltage input terminal 317B1 during the read operation, a current corresponding to the storage information of the memory element 301aB is inputted to the other input of the sense amplifier 318AB. Therefore, in the present embodiment, a difference between the currents flowing through the two memory elements 301aA and 301aB can be detected by the sense amplifier 318AB. In this case, two memory elements store one-bit or two-bit information. As described in the explanation of the read operation, if the direction of the current flowing in the memory element is reversed during the read operation and the pieces of information stored in the memory function body A and the memory function body B are independently read, then two-bit operation can be performed by two memory elements. If the direction of the current flowing in the memory element during the read operation is exclusively limited to one direction, then the one-bit operation is to be performed by two memory elements.

With a construction in which one memory element is connected to one input of the sense amplifier, and an external reference element is connected to the other input of the sense amplifier, two-bit information can be stored in one memory element.

However, it is preferable that the outputs of two memory elements (memory element pair) are inputted to an identical sense amplifier as in the present embodiment. When the above-mentioned construction is possessed, by detecting the difference between the currents flowing in the two memory elements that have similar element structures, the storage information of the memory element can be read. When, for example, a transistor of an ordinary structure is employed as an external reference, a difference in the temperature characteristic between the memory element and the transistor of an ordinary structure becomes the cause of obstructing the reliability of the read operation. Therefore, by inputting the outputs of the memory element pair to the identical sense amplifier, the reliability of the read operation can be improved.

In the semiconductor storage device of the present embodiment, a total of two select transistors are connected, one for each, to both sides of each memory element. Therefore, a rewrite voltage applied to the bit line during the rewrite operation is applied only to the selected sole memory element and not applied to the other memory elements connected to the same bit line pair. Therefore, it becomes possible to prevent the rewrite error of the non-selected cells during the rewrite operation.

Moreover, the problem that the off-state currents of the non-selected cells are added to the read current of the selected cell during the read operation and the margin of the read operation is reduced is alleviated. This effect becomes remarkable particularly when the number of word lines is great and the number of cells connected to an identical bit line is great.

In the case where one select transistor is provided only on one side of each memory element, the off-state current of the non-selected cells can be reduced during the read operation.

The word lines 308a-308n can be formed by connecting the gate electrodes of the memory elements by means of, for example, top metal interconnections. However, it is preferable that the gate electrodes of the memory elements (at least one pair of memory elements) integrally function as a word line, and the memory function bodies of the memory element pair are integrally shared on both sides of the respective gate electrodes. For example, if a linear polysilicon electrode extends over the active regions of a plurality of semiconductor layers, and the polysilicon electrode and the active regions of the semiconductor layers are insulated from each other by a gate insulator, then the polysilicon functions as a gate electrode on each active region and the linear polysilicon electrode itself functions as a word line. In this case, the number of contacts, which connect the gate electrodes with the top metal interconnections, is largely reduced, and the degree of integration of the semiconductor storage device can be improved. Moreover, since the gate electrode has the memory function bodies, there is no need to separate the memory function bodies every memory element, so that the manufacturing process can be simplified and a semiconductor storage device that is inexpensive and has high reliability can be obtained.

The semiconductor storage device of the present embodiment and a logic transistor should preferably be consolidated on an identical semiconductor chip.

Figure 23:
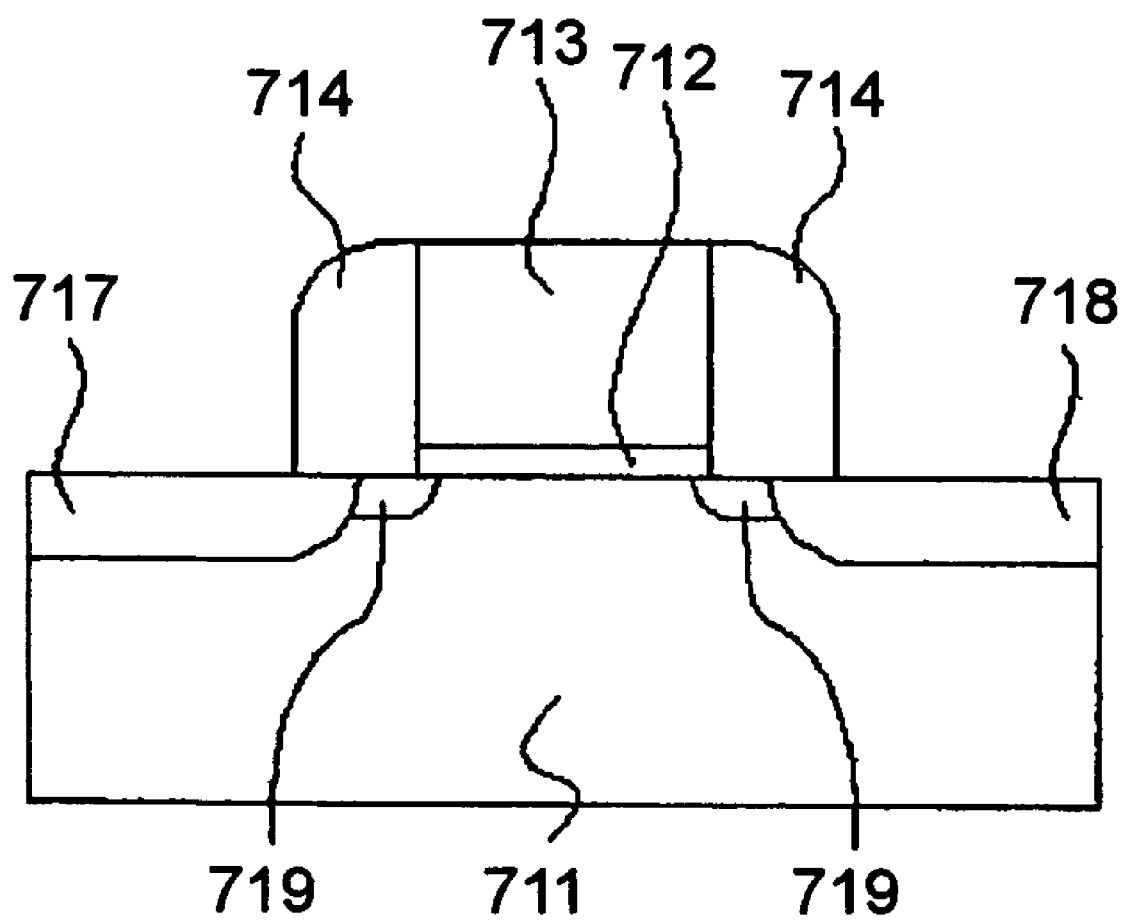
FIG. 23 is a schematic sectional view of part of an ordinary transistor.

A procedure for forming the memory element of the present embodiment has a very high affinity for the ordinary standard transistor formation processes, and therefore, a process for consolidating a semiconductor storage device, i.e., the memory element and a logic transistor becomes very simple. As shown in FIG. 23, in the standard transistor that constitutes a logic circuit section and an analog circuit section, a gate electrode 713 that has sidewall spacers 714 constructed of insulators on its sidewalls is normally formed on a semiconductor substrate 711 via a gate insulator 712, and a source region 717 and a drain region 718 are formed on both sides of the gate electrode 713. The source region 717 and the drain region 718 have an LDD (Lightly Doped Drain) region 719. Therefore, this standard transistor has a close resemblance to the construction of the memory element of the semiconductor storage device. In order to modify the standard transistor to the memory element, it is only required to add a function of a memory function section to, for example, the sidewall spacer 714 and form no LDD region 719.

More concretely, it is proper to modify the sidewall spacers 714 to a structure similar to that of, for example, the memory function bodies 261 and 262 of FIG. 8. In this case, a film thickness constituent ratio of the silicon oxides 241 and 243 and the silicon nitride 242 can be properly adjusted so that the memory element appropriately operates. Even if the side wall spacer of the transistor that constitutes the standard logic section has a structure similar to that of the memory function bodies 261 and 262 of FIG. 8, the transistor performance is not impaired so long as the sidewall spacer width (i.e., the total film thickness of the silicon oxides 241 and 243 and the silicon nitride 242) is appropriate and the transistor is operated within a voltage range in which no rewrite operation occurs.

Moreover, in order to form an LDD region in the transistor that constitutes the standard logic section, it is proper to carry out impurity implantation for forming the LDD region after the formation of the gate electrode and before the formation of the memory function bodies (sidewall spacers). Therefore, by merely masking the memory element with a photoresist in carrying out the impurity implantation for the formation of the LDD region, the memory element and the standard transistor can be concurrently formed and easily consolidated.

It is to be noted that the prior art flash memory has a formation process significantly different from those of the standard logic process. Therefore, the number of masks and the number of processes of the semiconductor storage device of embodiments of the present invention can be remarkably reduced in comparison with the conventional case where a logic circuit, an analog circuit and a flash memory used as a nonvolatile memory are consolidated. Therefore, the yield of the chip in which the logic circuit, the analog circuit and the nonvolatile memory element are consolidated is improved, and the manufacturing cost is reduced, consequently allowing an inexpensive semiconductor storage device of high reliability to be obtained.

It is preferable to operate the semiconductor storage device of the present embodiment so as to make two memory elements connected to one sense amplifier store mutually opposite pieces of storage information and detect a difference between the values of the currents flowing in the two memory elements by the sense amplifier during read. When the mutually opposite pieces of storage information are stored in the two memory elements connected to one sense amplifier, the reliability of read is more improved than when one memory element and an external reference cell are connected to one sense amplifier. Moreover, the read speed can be improved, and the read current value can be reduced. The reason why the reliability of read is improved when the mutually opposite pieces of storage information are stored in the two memory elements connected to one sense amplifier is that the rewrite frequencies of the two memory elements can be made to coincide with each other, and therefore, characteristic changes of the two memory cells become almost equivalent and the difference between the values of the currents flowing in the two memory elements is hard to change even when the characteristic change caused by device deterioration occurs. The values of the currents flowing in the two memory elements can easily be maintained large for similar reasons, and therefore, the read speed can be improved. Moreover, it is easy to reduce the read current value by raising the sensitivity of the sense amplifier for similar reasons. If the read current value can be reduced, the degree of integration of the memory cell array can be improved by reducing the gate width of the memory elements.

The method of operating the two memory elements connected to one sense amplifier so as to store the mutually opposite pieces of storage information and detect the difference between the values of the currents flowing in the two memory elements by the sense amplifier during read is preferable particularly when the semiconductor storage device of an embodiment of the present invention is employed.

As described in connection with the ninth embodiment, in the memory element of an embodiment of the present invention, the drain current ratio between write and erase can be particularly increased. Therefore, the difference between the values of the currents flowing in the two memory elements can be increased, allowing high-speed read to be achieved. Otherwise, the required difference in the current value can be obtained even if the gate width of the memory elements is reduced, and therefore, it becomes particularly easy to improve the degree of integration of the memory cell array by reducing the gate width of the memory elements.

It is acceptable to independently execute rewrite in one (A) and the other (B) of the memory function bodies in the two memory elements connected to one sense amplifier. Also, in this case, it is preferable to make the one (A) of the memory function bodies store mutually opposite pieces of storage information and make the other (B) of the memory function bodies store mutually opposite pieces of storage information. In this case, two-bit information can be stored in two memory cells. It is required to make reversible the direction of the current flowing in the memory element during the read operation.

Moreover, it is also acceptable to operate the two memory elements connected to one sense amplifier so that the one (A) and the other (B) of the memory function bodies have same storage state. In this case, one-bit information can be stored in two memory cells. As described above, by making same the storage states of the memory function bodies on both sides, the reliability of the read operation can be further improved.

That is, during the read operation, the drain current sensitively responds to the amount of electric charge in the memory function body located on the source side and is not so sensitive to the amount of electric charge in the memory function body located on the drain side. However, the drain current of the memory element is not completely free from the influence of the amount of electric charge in the memory function body located on the drain side. This influence produces an interference effect to change the value of the current inputted to the sense amplifier and increase the margin of the read current. Therefore, if the two memory elements connected to one sense amplifier operate so that the one (A) and the other (B) of the memory function bodies have same storage state, then the change in the value of the current inputted to the sense amplifier is reduced, and the reliability of the read operation can be improved.

With regard to the memory element employed in the present embodiment, it is preferable to employ the memory element of the seventh embodiment. That is, the thickness (T1) of the insulator that insulates the charge retention film (silicon nitride 242) from the channel region or the well region should preferably be thinner than the thickness (T2) of the gate insulator and not smaller than 0.8 nm. If such a memory element is employed in the semiconductor storage device of the present embodiment, it becomes possible to reduce the voltage of the write operation and the erase operation or increase the speed of the write operation and the erase operation. Moreover, the memory effect of the memory element is increased, and therefore, the read speed of the semiconductor storage device can be made high.

With regard to the memory element used in the present embodiment, it is preferable to employ the memory element of the eighth embodiment. That is, the thickness (T1) of the insulator that insulates the charge retention film (silicon nitride 242) from the channel region or the well region should preferably be thicker than the thickness (T2) of the gate insulator and not greater than 20 nm. If such a memory element is employed in the semiconductor storage device of the present embodiment, it becomes possible to improve the retention characteristic without degrading the short-channel effect of the memory element, and therefore, a sufficient storage performance can be obtained even if the semiconductor storage device is made to have high degree of integration.

As described in connection with the second embodiment, in the memory element employed in the present embodiment, the region (silicon nitride 242) that retains electric charge in the memory function bodies 261 and 262 should preferably overlap the diffusion regions 212 and 213, respectively. If such a memory element is employed in the semiconductor storage device of the present embodiment, the read speed of the semiconductor storage device can be sufficiently increased.

As described in connection with the second embodiment, in the memory element employed in the present embodiment, the memory function bodies should preferably include a charge retention film arranged roughly parallel to the surface of the gate insulator. If such a memory element is employed in the semiconductor storage device of the present embodiment, variations in the memory effect of the memory elements can be reduced, and therefore, variations in the read current of the semiconductor storage device can be restrained. Furthermore, the characteristic change of the memory element during storage retention can be reduced, and therefore, the storage retention characteristic of the semiconductor storage device is improved.

As described in connection with the third embodiment, in the memory element employed in the present embodiment, the memory function bodies should preferably include a charge retention film arranged roughly parallel to the surface of the gate insulator and include a portion extended roughly parallel to the side surface of the gate electrode. If such a memory element is employed in the semiconductor storage device of the present embodiment, the rewrite speed of the memory element is increased, and therefore, the rewrite operation of the semiconductor storage device can be made high.

With regard to the memory element employed in the present embodiment, it is most preferable to employ a memory element of the improved form that has already been described. With this arrangement, the performance of the semiconductor storage device can improved.

The Eleventh Embodiment

According to the semiconductor storage device of the present embodiment, no select transistor is arranged in the semiconductor storage device of the tenth embodiment.

Figure 21:
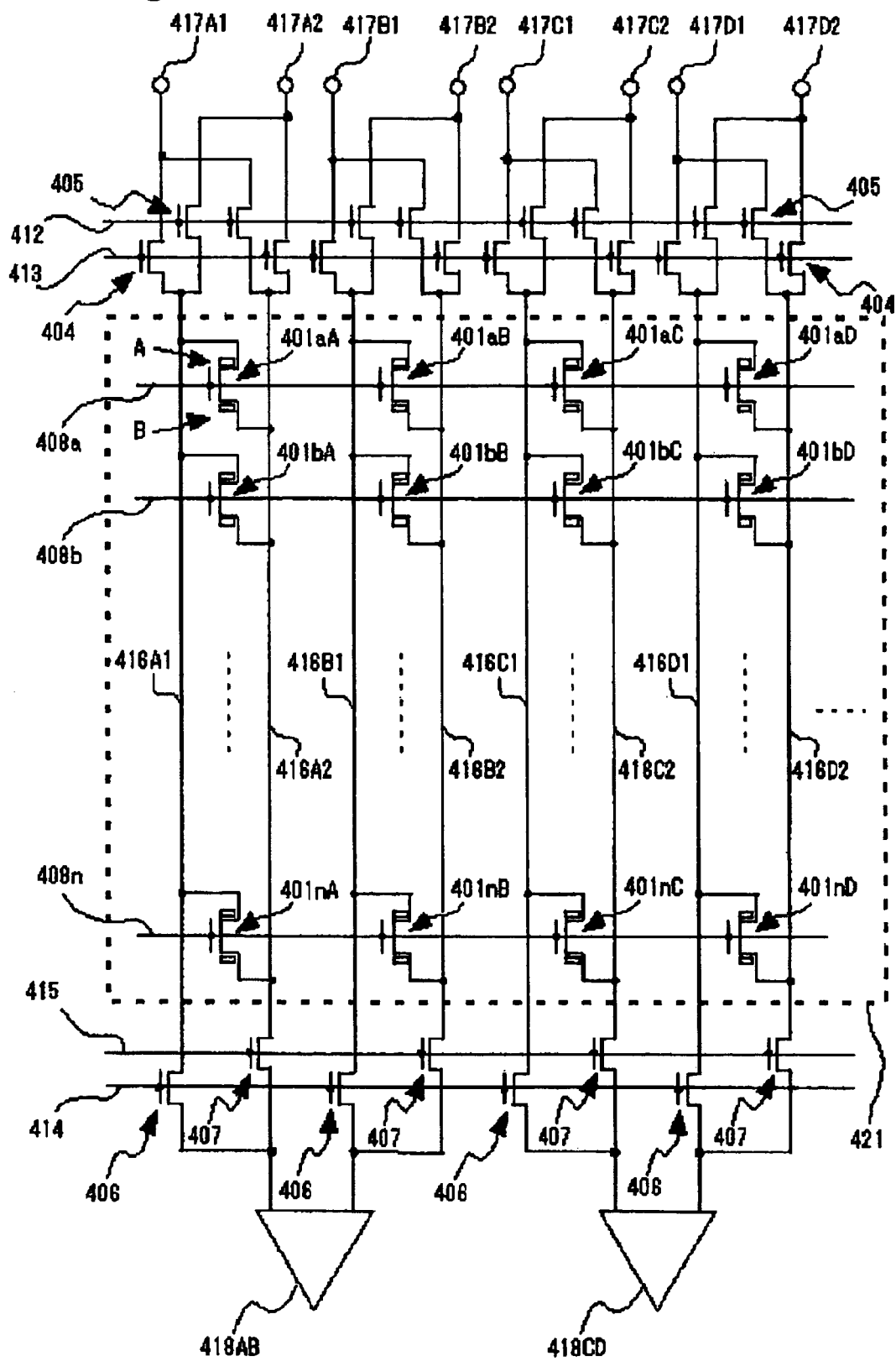
FIG. 21 is a block diagram of the semiconductor storage device of the eleventh embodiment of the present invention.

FIG. 21 is a circuit diagram of a semiconductor storage device. This device differs from the device of FIG. 20 only in the memory element array region (memory cell array) 421. Operation select transistors 404 and 405, operation select lines 412 and 413, first voltage input terminals 417A1-417D1, second voltage input terminals 417A2-417D4, a first switchover transistor 406, a second switchover transistor 407, switchover transistor select lines 414 and 415, sense amplifiers 418AB and 418CD and word lines 408a-408n are similar to those of the semiconductor storage device (FIG. 20) of the tenth embodiment.

The memory elements 401aA-401aD, . . . , 401nA-401nD are connected directly to the first bit lines 416A1-416D1 and the second bit lines 416A2-416D2, respectively.

The operation methods are similar to those of the semiconductor storage device (FIG. 20) of the tenth embodiment. It is to be noted that the rewrite voltage is applied to the sources and the drains of all the memory elements connected to an identical bit line pair during the rewrite operation since there is no select transistor. Therefore, it is required to design the memory elements so that the memory element connected to the word lines other than the selected word line are not rewritten.

According to the semiconductor storage device of the present embodiment, the degree of integration can be largely improved since there is no select transistor. Therefore, the manufacturing cost is remarkably reduced, and an inexpensive semiconductor storage device can be obtained.

In the memory element of embodiments of the present invention, overerase, which poses a problem in an EEPROM, does not occur. Therefore, it is especially preferable to employ the disclosed memory element in a semiconductor storage device that has a plurality of word lines and no select transistor as in the present embodiment. The above is because a state of continuity is consistently provided between the first bit line 416A1 and the second bit line 416A2, and it becomes impossible to select the memory element connected between these bit lines when the threshold value of one (e.g., memory element 401aA) of the memory elements becomes negative due to overerase.

The Twelfth Embodiment

The semiconductor storage device of the present embodiment is related to a device in which the memory element array region (memory cell array) 521 has a higher density.

Figure 22:
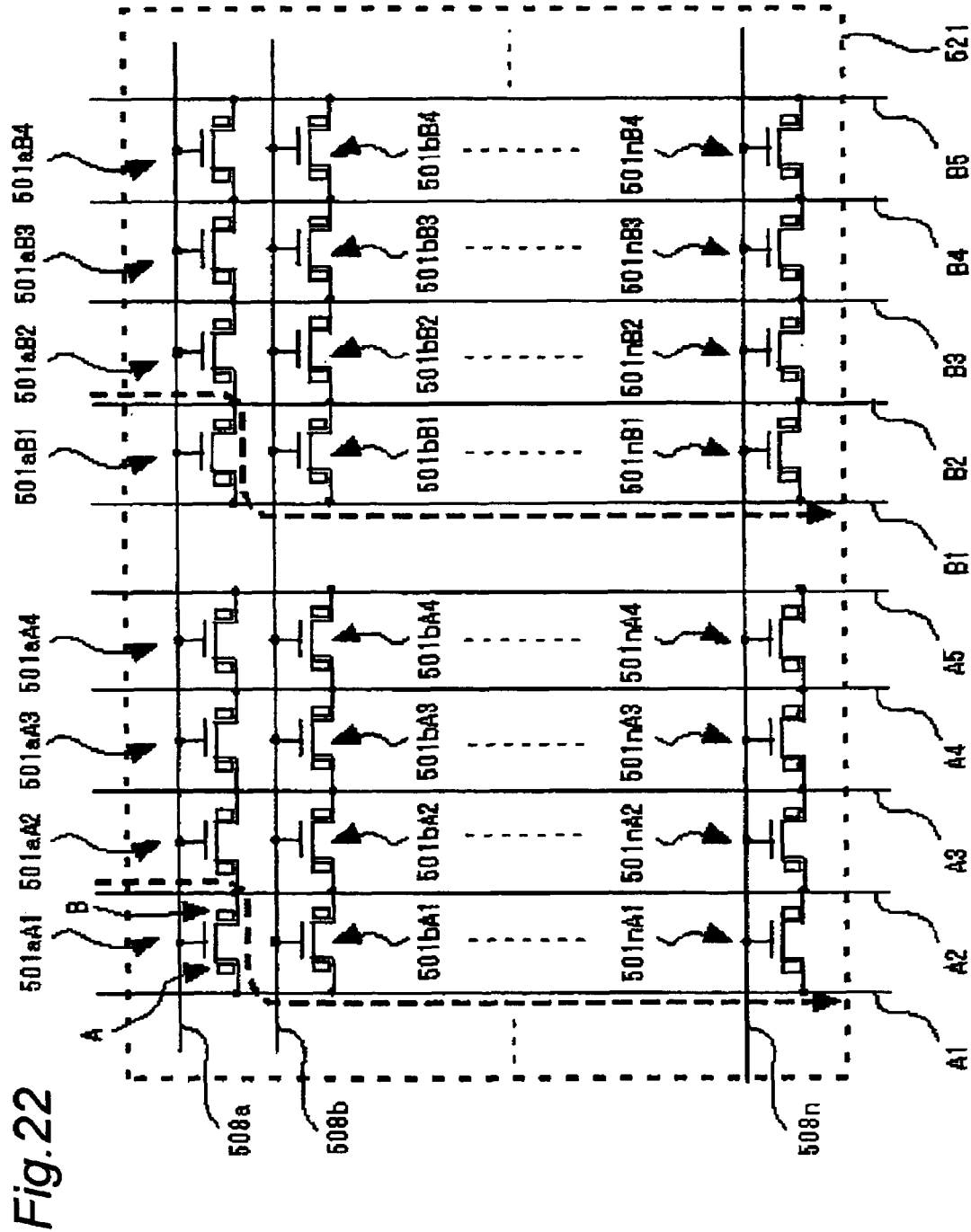
FIG. 22 is a block diagram of the semiconductor storage device of the twelfth embodiment of the present invention.

In FIG. 22, there are shown memory elements 501aA1-501aA4, 501aB1-501aB4, . . . , 501nB1-501nB4, word lines 508a-508n and bit lines BAL-BAS and BB1-BB5. The portion, where the memory elements of this semiconductor storage device are arranged, differs from those of the tenth and eleventh embodiments in that the bit lines are shared by memory elements that belong to the mutually adjoining columns. In concrete, the bit lines A2-A4 and B2-B4 are shared. Although the memory elements arranged in four columns constitute one block in the present embodiment, the number of columns is not limited to this.

In this semiconductor storage device, the read operation is performed by inputting currents flowing in two memory elements that belong to different blocks, or, for example, the memory elements 501aA1 and 501bB1 to one input and the other input, respectively, of the sense amplifier and detecting a difference between the currents. In the above case, for example, one input of the sense amplifier is connected to the bit line A1, and the other input is connected to the bit line B1. Further, a voltage (e.g., +1.8 V) appropriate for the read operation is applied to the bit lines A2 and B2. The dashed lines of FIG. 22 indicate the path of currents that flow at this time. The currents flowing through these paths are respectively inputted to the two inputs of the sense amplifier, and a difference between the currents is detected. It is to be noted that a circuit and so on for connecting the memory element to the voltage input terminal and the sense amplifier are not shown in FIG. 22.

According to the semiconductor storage device of the present embodiment, the bit lines are shared by the memory elements that belong to mutually adjoining columns, and therefore, the degree of integration can be remarkably improved. Therefore, the manufacturing cost is largely reduced, and an inexpensive semiconductor storage device can be obtained.

The Thirteenth Embodiment

This thirteenth embodiment is related to a semiconductor storage device (hereinafter referred to as a sidewall memory in this thirteenth embodiment) that includes a memory cell array in which the plurality of memory elements described in connection with the first through ninth embodiments are arranged or the memory cell array described in connection with the tenth through twelfth embodiments and includes a write state machine or the like for preventing the write and erase of the memory elements.

Figure 24:
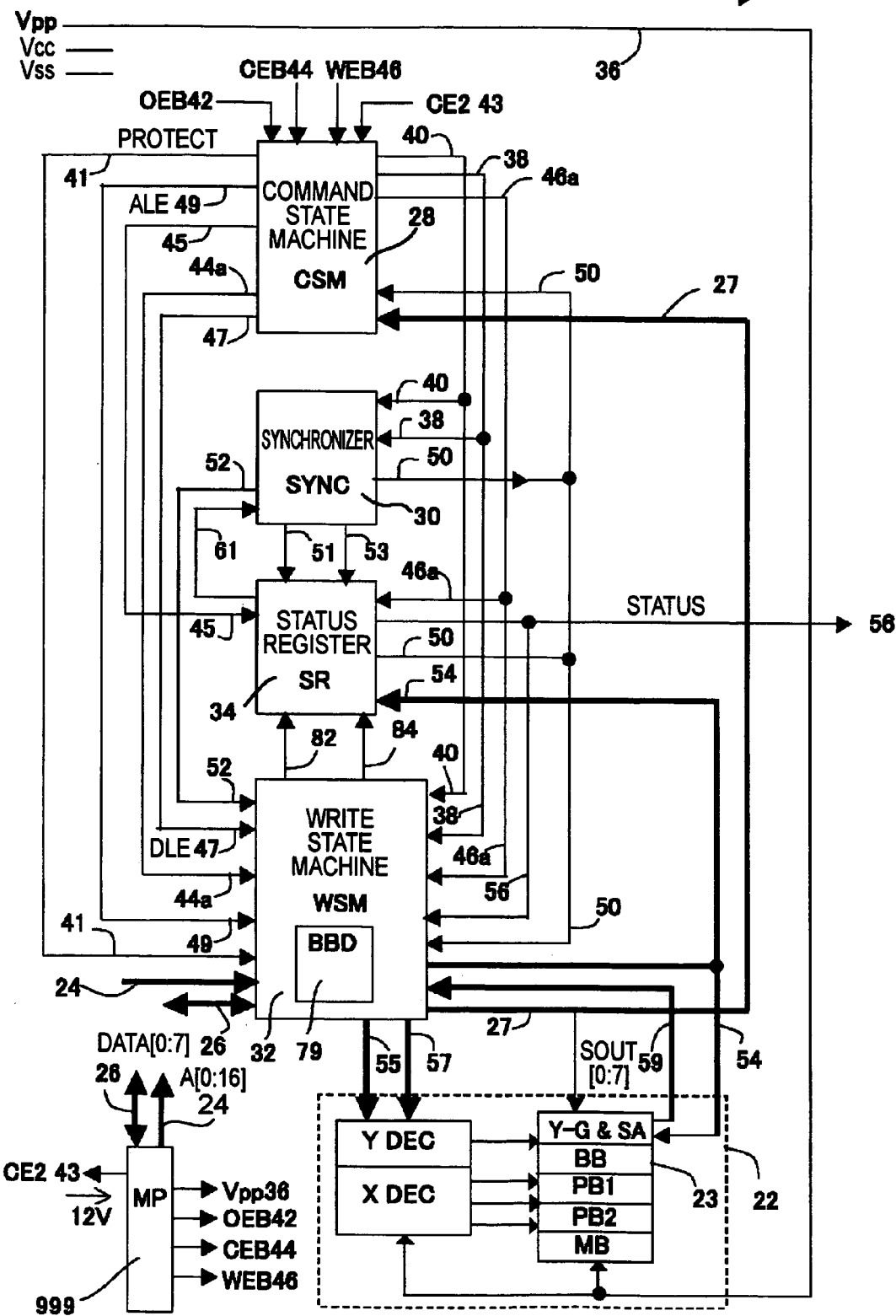
FIG. 24 is a block diagram of the semiconductor storage device of the thirteenth embodiment of the present invention.

FIG. 24 shows a block diagram of the circuit of this sidewall memory 20. The sidewall memory 20 includes a boot block detector 79 arranged in the write state machine 32. The boot block detector 79 prevents the boot block 23 of the memory cell array 22 from being written or erased so long as the boot block 23 is unlocked by a microprocessor 999. The microprocessor 999 can unlock the boot block 23 by raising the voltage of a CE2 pin 43 up to 5 V.

There is shown a power voltage Vpp36 for the erase/write of the sidewall memory 20. There are shown a power supply Vcc for the device of the sidewall memory 20 and a ground Vss. In one embodiment, Vpp36 is 5 V, and Vcc is about 2 V.

When no high voltage exists in Vpp36, the sidewall memory 20 operates as a read-only memory (ROM). Data that has been supplied via a line 24 and stored in an address is read from the memory cell array 22 and made usable via a data input/output line 26 to an external circuit of the sidewall memory 20.

The sidewall memory 20 has three control signals, i.e., a chip enable bar CEB signal 44, a write enable bar WEB signal 46 and an output enable bar OEB signals 42. The input of the CEB signal 44 is for power control and utilized for selecting a sidewall memory 20. The OEB signal 42 is active at low level. The output enable bar OEB signal 42 is for output control of the sidewall memory 20 and used for outputting data from the output pin of the sidewall memory 20 to the outside. The OEB signal 42 is active at low level. Both the CEB signal 44 and the OEB signal 42, which are control signals, must be logically active in order to obtain data on the data line 26 of the sidewall memory 20.

The WEB signal 46 enables write of a command state machine 28 despite the fact that the CEB signal 44 is low. The WEB signal 46 is active at low level. The address and data are latched at the rise of the WEB signal 46. The normal microprocessor timing is used.

When the CE2 signal 43 is set to 5 V, the CE2 signal 43 enables the write or erase of the contents of the boot block 23. If the CE2 signal 43 does not have a voltage of 5 V, then the data stored in the boot block 23 is not changed by write or erase. In other words, the boot block 23 is locked unless it is unlocked by pulling the CE2 signal 43 up to 5 V.

The operation of the device is selected by writing a specific data pattern into the sidewall memory 20 via the data input/output line 26.

In FIG. 25, SRD represents the data read from a status register 34. In FIG. 25, PA represents the address of the place in the memory to be subjected to write, and PD represents the data to be written in the address PA. BA represents any of the addresses of the block to be subjected to erase.

The erase operation is performed on the memory cell array 22 in response to a two-cycle erase command sequence. An erase setup command is accompanied by the address of the block selected to be first subjected to write and then to erase. This is accompanied by an erase confirm command and accompanied by a block address. Preconditioning (preparation), erase and erase verify are all processed internally by the write state machine 32. These are performed independently of the microprocessor 999. It takes about one second for the erase operation.

The erase and setup in two steps followed by the execution ensures that the contents of the block memory are not accidentally erased. The erase occurs only when a high voltage is applied to Vpp. In the absence of the high voltage, the contents of the memory are protected from being erased. The CE2 signal 43 provides a greater protection for the boot block 23. The boot block 23 can be erased only when the CE2 signal 43 has a voltage of 5 V.

The microprocessor 999 can detect the completion of the erase operation by issuing a read status register command to analyze status data. When the status register 34 indicates that the erase operation has been completed, an erase failure status bit is checked. After the check ends, the error bit of the status register 34 is appropriately cleared. The other operation is performed only after an appropriate command is received.

Write is performed according to a two-cycle command sequence. The program setup command is written into the command state machine 28 via the data line 26 and followed by a second write command that specifies the address and the data to be written. Then, the write state machine 32 succeeds the control of write and internally verifies the algorithm. By polling the status register 34 by a status read register command, the microprocessor 999 is made to determine when the write has been completed. Then, the read status register command is effective only while the write operation continues.

When the status register 34 indicates that the write operation has been completed, a write error bit is checked. After this check, the microprocessor 999 appropriately clears a status register error bit.

In a preferred embodiment, the circuit of the sidewall memory 20 shown in FIG. 24 is located on one substrate. In a preferred embodiment, the sidewall memory 20 employs a CMOS circuit.

Although not shown, the sidewall memory 20 includes a read path, a write path and a verify circuit as well as the memory cell array 22 that includes four blocks. The fact that the memory cell array 22 is constructed of blocks enables data to be separated every block. Thus, when one block is required to be subjected to erase, the other blocks are not required to be subjected to erase, and therefore, the blocks are not exposed to possible data loss and damage. For the above reasons, constituting the sidewall memory 20 of the memory cell array 22 constructed of the plurality of blocks further increases the level of data integrity by using a plurality of chips that include different sections, i.e., data of different types.

As shown in FIG. 24, the blocks of the subdivided memory cell array 22 are used for different functions. Three different functions include a boot block (BB) 23, parameter regions (PB1 and PB2), a main block (MB) or an application space. The boot block 23 retains codes necessary for the microprocessor (boot processor) 999. The parameter regions of the parameter block 1 (PB1) and the parameter block 2 (PB2) retain the parameter information needed depending on what application the sidewall memory 20 is used for. The main block (MB) or the application space itself includes an application code.

The sidewall memory 20 includes an on-chip command state machine (CSM) 28, a synchronizer 30, a write state machine (WSM) 32 and a status register 34.

The command to write or erase the memory cell array 22 is given via the data line 26. The data on the data line 26 is transferred to the command state machine 28. If the command state machine 28 decodes the data, and, if the data represents erase, write (program) or a status reset command, then the CSM 28 generates appropriate control signals. The control signals supplied to the write state machine 32 by the command state machine 28 include a PROGRAM signal 38, an ERASE signal 40, a STATRS signal 45 that is a status register reset signal, an ALE signal 49 that is an address latch enable signal and a DLE signal 47 that is a data latch enable signal.

The program and erase algorithm is adjusted by the write state machine 32 and includes program pulse repetition and internal verify of data when needed as described in detail below.

The write state machine 32 latches an address and data necessary for performing the erase and write (program)

operations according to inputted A[0:16] signal 24 and D[0:7] signal 26. The address and data latch operation of the write state machine 32 is controlled by an address latch enable signal (ALE signal) 49 and a data latch enable signal (DLE signal) 47 from the CSM 28.

The write state machine 32 is connected to the memory cell array 22 via an AY[0:6] signal 55 and an AX[0:9] signal 57, which are address signals, and an output SOUT [0:7] signal 59 of the sense amplifier (SA). The output SOUT [0:7] signal 59 of the sense amplifier SA represents the data of the addressed memory portion. When the write state machine 32 is active, the write state machine 32 controls the read path and the write path of the memory cell array 22 and the verify circuit according to a SBUS[0:4] signal 54.

The write state machine (WSM) 32 informs the synchronizer (SYNC) 30 and the status register (SR) 34 of the status according to the SBUS[0:4] signal 54 during operation.

The synchronizer 30 provides synchronization between the write state machine 32 and the command state machine (CSM) 28. Upon receiving either an active ERASE signal 40 or PROGRAM signal 38, the synchronizer 30 makes a READY signal 50 logically low to issue an instruction that the write state machine 32 is busy to the command state machine 28 and the status register 34. When the write state machine 32 completes its operation, the synchronizer 30 shuts down the write state machine 32 by setting the READY signal 50.

The synchronizer 30 resets the write state machine 32 by making a RESET signal 52 logically high every time the ERASE signal 38 and the PROGRAM signal 40 are made logically low.

The synchronizer 30 also informs the status register (SR) 34 of the information of the state of the write state machine 32 by a LOWVPP signal 51.

The status register 34 decodes the SBUS[0:4] signal 54 and instructs the microprocessor 999 whether or not the operation has been completed and the success of the operation by a STATUS signal 56. The STATUS signal 56 is multiplex transmitted to the input/output data line 26.

Figure 26:
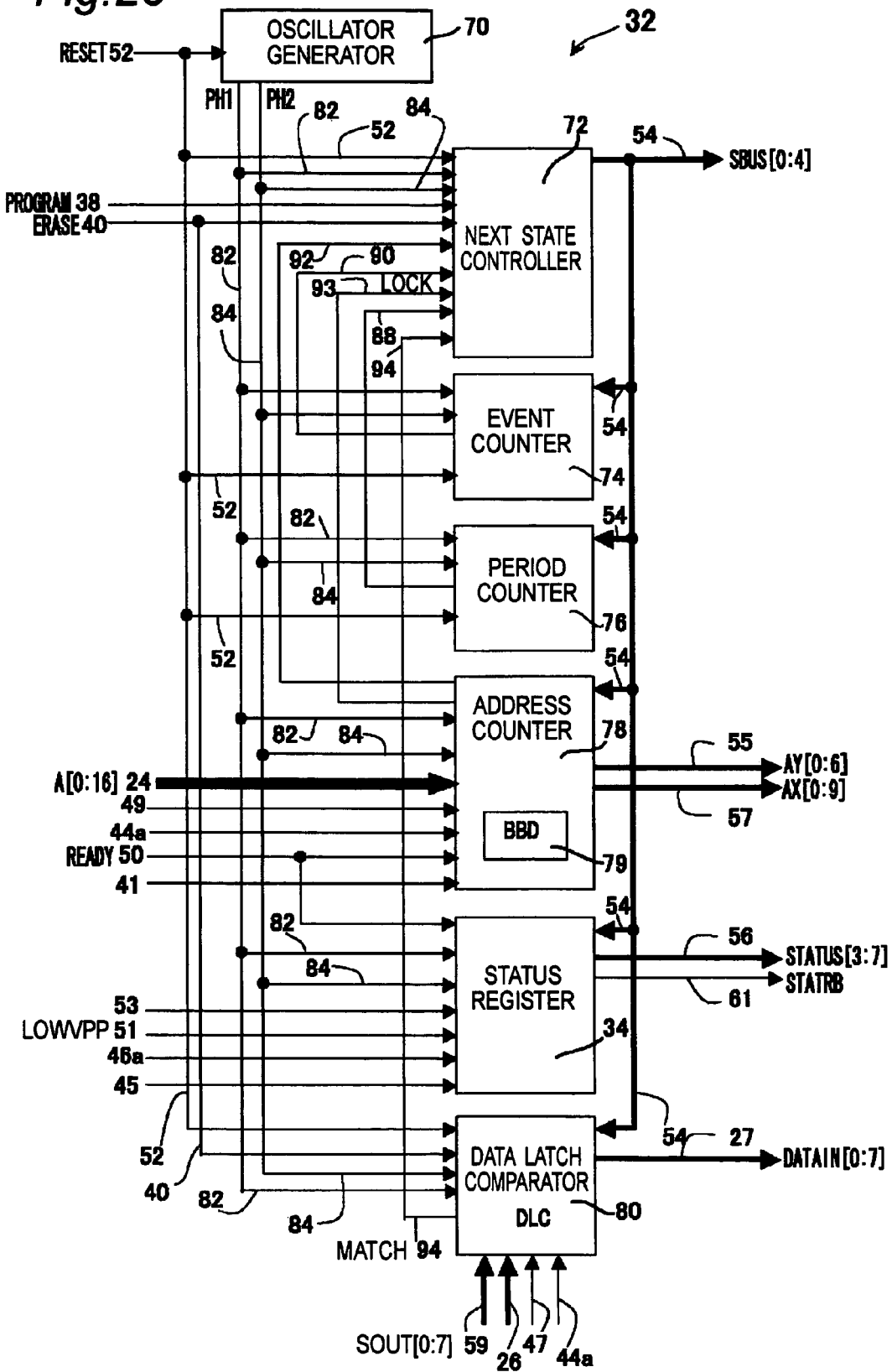
FIG. 26 is a block diagram of a write state machine.

FIG. 26 is a block diagram showing connections to the write state machine 32 and the status register 34. The write state machine 32 includes an oscillator generator 70, a next state controller 72, an event counter 74, a period counter 76, an address counter 78 and a data latch comparator (DLC) 80.

The RESET signal 52 is applied to almost all the circuits in the write state machine 32. The RESET signal 52 puts nodes in the write state machine 32 into a predetermined state. For example, the RESET signal 52 makes terminal count signals 88, 90 and 92 logically zero.

After receiving the inactive RESET signal 52, the oscillator generator (oscillator/phase generator) 70 starts generating two phase clocks that do not overlap, i.e., a phase 1 (PH1 signal 82) and a phase 2 (PH2 signal 84) and transfer the clocks to almost all the circuits in the write state machine (WSM) 32. The PH2 signal 84 is the first clock that becomes active after the RESET signal 52.

The next state controller 72 controls the activities of the write state machine (WSM) 32 and determines the next state of the write state machine 32. The next state controller 72 generates SBUS[0:4] signals 54, which are five outputs representing the current state of the write state machine 32. The next state controller 72 prevents the program and operation from being performed on the boot block when the lock signal 93 is active.

Each circuit, which has received the SBUS[0:4] signal 54 from the next state controller 72, decodes the SBUS[0:4] signal 54 by itself and determines the next task. Such a design enables a lot of tasks to be accomplished in parallel and enables the time consumed in performing erase and program (write) to be minimized.

The period counter 76 determines the pulse period of the voltage applied to the memory cell array during the write and erase operations and counts the time. Another period represented by the period counter 76 corresponds to a delay between write or erase and verify of the correct data from the memory cell array 22. By being made active high, the terminal count signal of the period counter 76, i.e., the PCTRTC signal 88 informs the next state controller 72 of the elapse of the period.

The period counter 76 decodes the SBUS[0:4] signal 54 to select the desired pulse period. The SBUS[0:4] signal 54 further resets the count value of the period counter 76 before the period counter 76 is enabled.

The event counter 74 determines when the maximum number of the write or erase operation is attained with regard to one-byte data. When the maximum number of the operations is attained with regard to one-byte data, the event counter 74 informs the next state controller 72 of that by logically making high the event terminal count signal, i.e., the ECTRTC signal 90. The event counter 74 determines the maximum number of operations by decoding the SBUS[0:4] signal 54. In a preferred embodiment, the maximum number of the write operations per one-byte data is set to 50, and the maximum number of the erase operations is set to 8192.

In the write state machine (WSM) 32, the address counter 78 functions as both an input buffer and a counter. When the READY signal 50 is high, the address of the address line A[0:16] is outputted as an AY[0:6] signal 55 and an AX[0:9] signal 57. The AY signal 55 and the AX signal 57 represent the location of the byte in the memory cell array 22 to be subjected to write, erase or read.

After the address is inputted to the input buffer, the address from the input buffer is loaded in the address counter 78 under the control of the command state machine (CSM) 28 via an ALE signal 49. Then, the address counter 78 counts all the addresses in the memory block selected from inside the memory cell array 22. The address counter 78 informs the next state controller 72 of reaching the end of the selected block memory by making a terminal count signal ACTRCT signal 92 logically high.

The address counter 78 includes a boot block detector (BBD) 79. This boot block detector 79 inspects the most significant four bits (MBAs) of the address signal A[13:16] and determines whether or not the boot block 23 has been designated. The boot block detector 79 generates an active lock signal 93 when the boot block (BB) 23 is selected and a protect signal 41 is active. The boot block 23 cannot be subjected to write or erase while the protect signal 41 is active. The active lock signal 93 informs the next state controller 72 of the fact that neither write nor erase is allowed to occur.

The data latch comparator (DLC) 80 is an interface between the write state machine (WSM) 32 and the command state machine (CSM) 28 and between the memory cell array 22 and the data line 26. The input of the TTL data on the data line 26 is stored in the DLC 80, and the command state machine 28 is informed of the input as a DATAIN[0:7] signal 27.

If the DATAIN[0:7] signals 27 represents a program command, then the command state machine 28 issues an instruction to store information on the data line 26 by setting the data latch enable signal DLE 47 logically high in the data latch comparator (DLC) 80. During the write operation, the data latch comparator (DLC) 80 compares the data stored in its own latch with a sense amp signal, i.e., an SOUT[0:7] signal 59 and sets a MATCH signal 94 logically high, thereby representing matching.

The data latch comparator (DLC) 80 compares the SOUT [0:7] signal 59 with the reference logical level in the course of an erase verify procedure. The sense amp signal, i.e., the SOUT[0:7] signal 59 represents the contents of the memory cell. The data latch comparator 80 informs the next state controller 72 of successful erase by setting the MATCH signal 94 logically high.

The status register 34 informs the microprocessor 999 of the state of the write state machine 32 via a status signal, i.e., an STAT[3:7] signal 56. The status signal, i.e., the STAT[3:7] signal 56 is multiplex transmitted on the data line 26. The status register 34 determines the state of the write state machine 32 on the basis of the READY signal 50, the LOWVPP signal 51 and the SBUS[0:4] signal 54.

Figure 27:
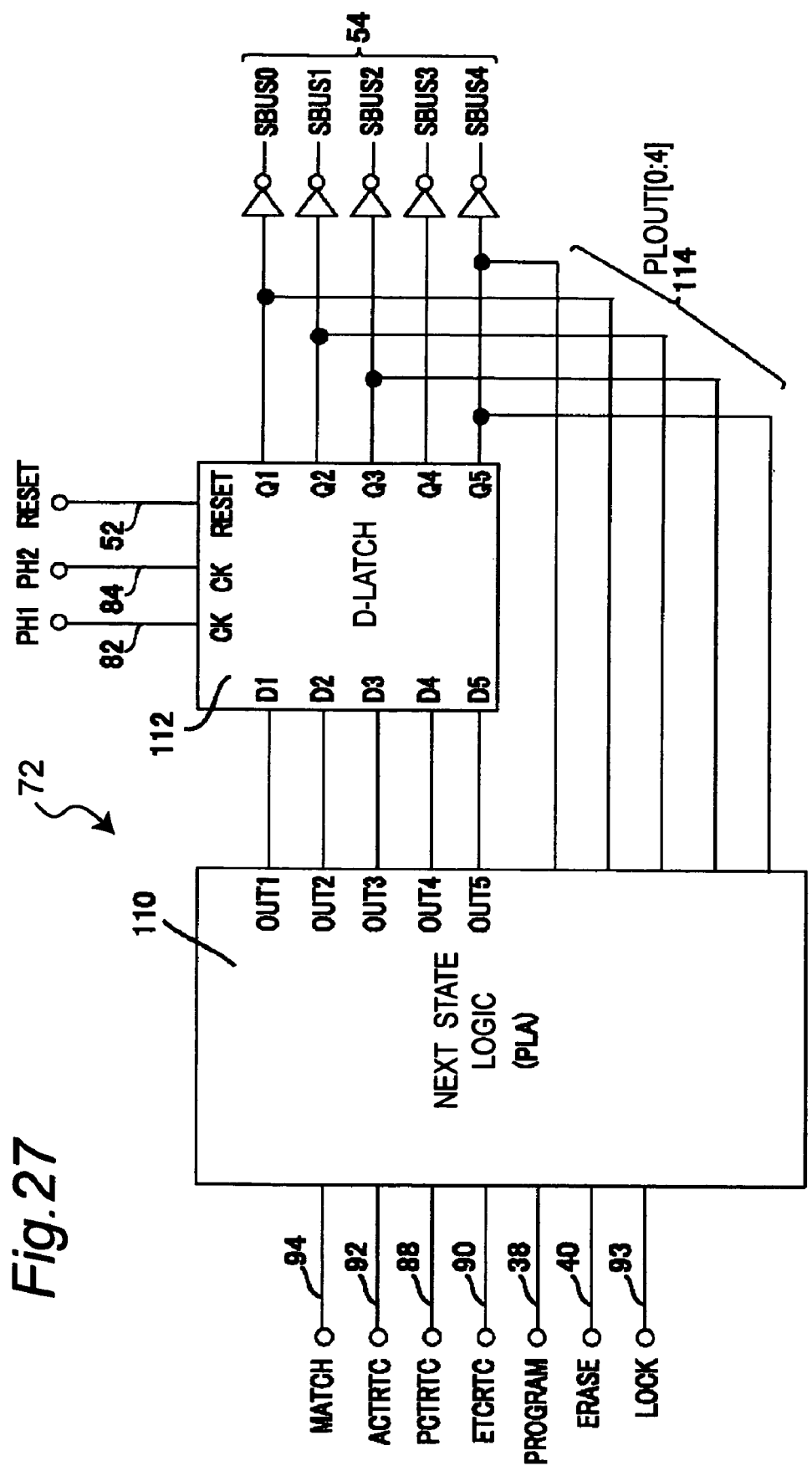
FIG. 27 is a block diagram of the next state of a controller.

FIG. 27 shows a block diagram of the next state controller 72. The next state controller 72 includes a next state logic 110 and a master-slave D-Latch 112. In a preferred embodiment, the next state logic 110 is provided as a programmable logic array.

The next state logic 110 determines the next state of each circuit in the write state machine 32 on the basis of the preceding state of the write state machine 32. The preceding state is represented by the signals of a PLOUT[0:4] signal 114, the MATCH signal 94, the PROGRAM signal 38, the ERASE signal 40 and the LOCK signal 93 as well as the terminal count signals of the PCTRTC signal 88, the ECTRTC signal 90 and the ACTRTC signal 92. Each circuit giving an input to next state logic 110 performs according to the next active PH2 signal 84 following a transition in the SBUS[0:4] signal 54. The reason why the above-mentioned circuit can do so is that all the circuits in the write state machine 32 are the master/slave devices capable of outputting an effective output to the PH2 signal 84.

The output of the next state logic 110 is latched in the latch 112 and provided as the SBUS[0:4] signal 54 to the remaining circuits of the write state machine 32.

The SBUS[0:4] signal 54, which is the status bus output, becomes active when the RESET signal 52 is cleared and the second PH2 signal 84 rises. As a result of the SBUS[0:4] signal 54 made active, each write state machine (WSM) 32 evaluates the SBUS[0:4] signal 54 while the PH1 signal 82 is high.

The method of write and erase performed by the next state controller 72 will be described with reference to the phase diagram of FIG. 28.

Figure 28:
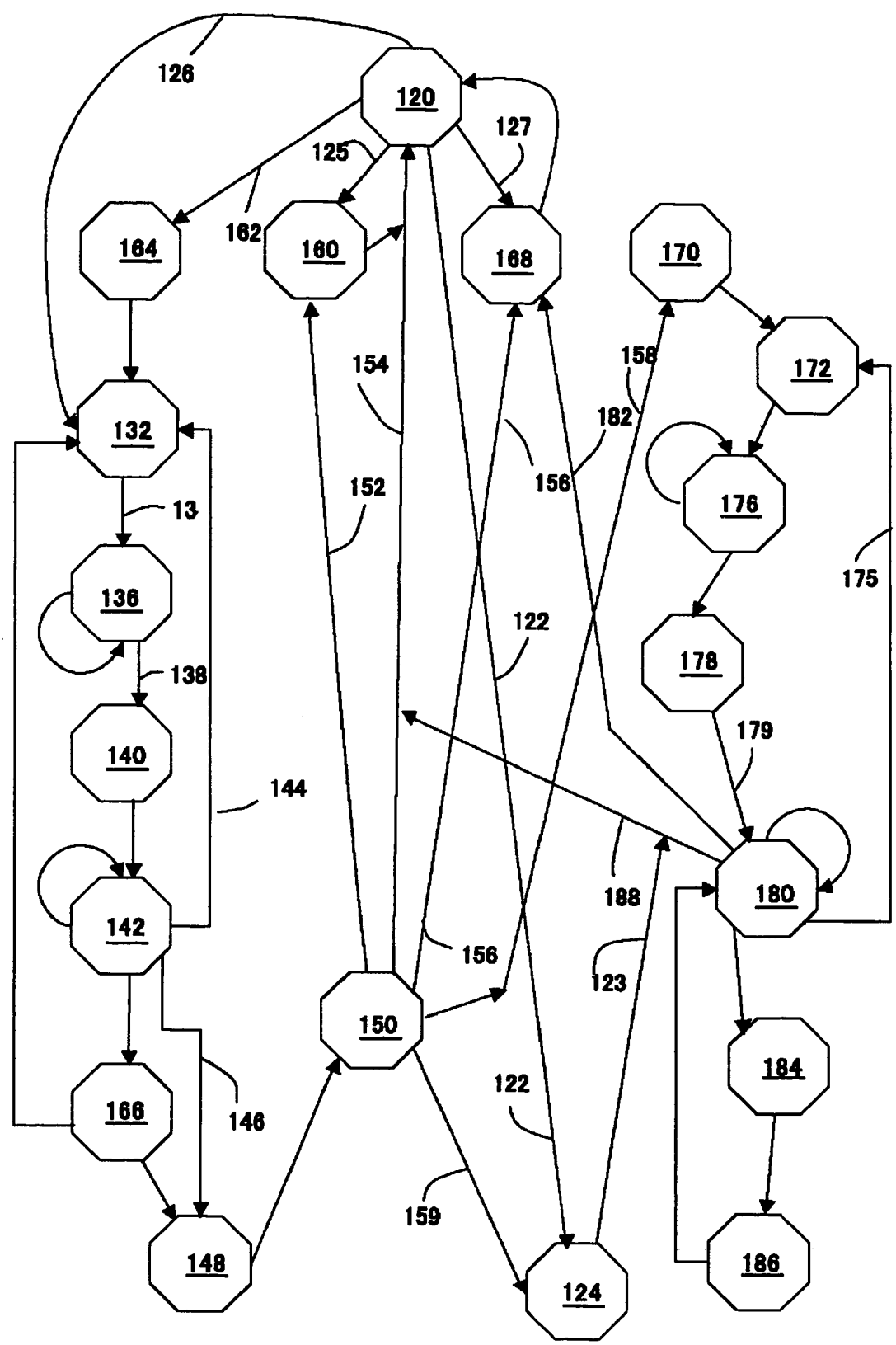
FIG. 28 is a phase diagram of the means of write and erase sidewall memory.

In FIG. 28, each bubble represents the state of the write state machine 32. If no combination of signals is shown next to branch, then it indicates that the next state controller 72 has branched from one state to another state regardless of the input to the next state controller 72.

If a power is first given to the sidewall memory 20, then the next state controller 72 is retained in a POWER_UP state 120 by the RESET signal 52. If nothing occurs under this state, then the next state controller 72 starts execution after receiving an active PROGRAM signal 38 or an ERASE signal 40 from the command state machine 28.

After the power-up, it is assumed that the next state controller 72 receives an active PROGRAM signal 38 and an active ERASE signal 40 at branch 122. These input signals diverge the next state controller 72 to a HARDWARE ERR state 124.

In the HARDWARE ERR state 124, two fail bits PRG_ERR and ERASE_ERR of the status register 34 are set logically high and represent a hardware error. The write state machine 32 takes branch from the state 124 so as to return to the POWER_UP state 120, and this occurs regardless of the input signal of the next state controller 72.

It is assumed that the next state controller 72 receives a write request of the boot block 23 while the boot block 23 is locked in the aforementioned state 120. A combination of signals representing this request is a combination of an active PROGRAM signal 38, an inactive ERASE signal 40 and an active LOCK signal 93. This combination of the signals makes the next state controller 72 take branch 125 into a PRG_FAIL state 160. In this state 160, the program fail bit of the status register 34 is set, and write (programming) does not occur. The next state controller 72 takes branch so as to return from the state 160 to the POWER_UP state 120.

If the erase of the boot block 23 is requested while the boot block 23 is locked, the operation of the next state controller 72 is similar. A combination of signals representing this request is a combination of an active ERASE signal 40, an inactive PROGRAM signal 38 and an active LOCK signal 93. This combination of the signals makes the next state controller 72 take branch 127 into an ERASE_FAIL state 168. An erase failure bit (erase error bit) is set in this state 168, and the erase of the boot block 23 does not occur. The next state controller 72 takes branch from the state 168 so as to return to the POWER_UP state 120.

After entering the state 120, the next state controller 72 receives an active PROGRAM signal 38, an inactive ERASE signal 40 and an inactive LOCK signal 93. This combination of the signals starts a program event. This program event is performed by byte data of the address line 24. The byte data is programmed to the data of the data line 26. In the above situation, the next state controller 72 takes branch 126 into a PROG_SETUP state 132.

In the PROG_SETUP state 132, the next state controller 72 is set so as to execute program operation. In the above state 132, the period counter 76 is reset, and the count of the program of the event counter 74 is selected. The program path in the memory cell array 22 is set up. Subsequently, the next state controller 72 takes branch 134 into a PROGRAM state 136.

In the above state 136, the byte data represented by the AY[0:6] signal 55 and the AX[0:9] signal 57 is programmed so that the voltage level becomes about 5 V. This voltage level represents logical low. The period counter 76 is constructed so as to execute the program operation by selecting its own program period in the state 136. The write state machine 32 is still in the state 136 until the period counter 72 reaches its terminal count, and this means that the program voltage is applied for a sufficient period so that the byte voltage becomes 5 V.

When the PCTRTC signal 88 becomes active, i.e., logically high, the next state controller 72 takes branch 138 into a program equalize state PROG_EQ 140.

The event in the state 140 is to execute program verify, i.e., preprocessing of determining whether or not the preceding program pulse has successfully programmed the byte data in the write state machine 32 and the memory cell array 22. In the state 140, the period counter 76 is reset, and the event counter 74 becomes enabled to increase its count value. The state of the SBUS[0:4] signal 54 in the state 140 enables the program verify of the memory cell array 22.

The next state controller 72, which has been set so as to execute the program verify, therefore takes branch from the state 140 into a PROG-VER-DELAY state 142. In this state 142, the write state machine 32 verifies whether or not the addressed byte data has been successfully programmed by comparing the SOUT[0:7] signal 59 with the program data stored in the DLC 80. The period counter 76 provides a verify delay before the verify is performed in order to guarantee the effectiveness of the SOUT[0:7] signal 59.

Figure 36:
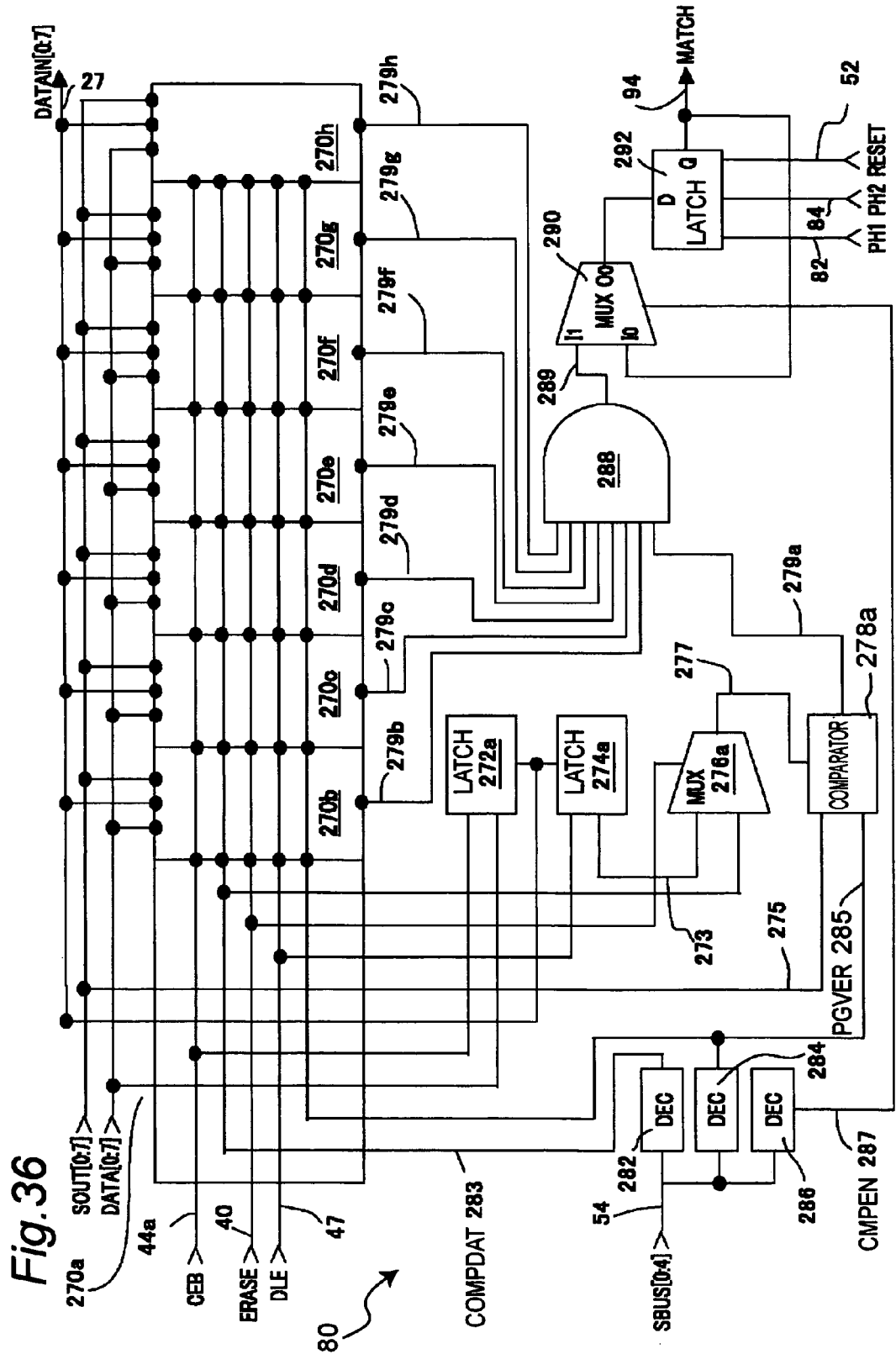
FIG. 36 is a block diagram of a data latch and a comparator.

The memory cell array 22 prepares for the program verify by making the word line enable to turn on the read path. The DLC 80 is constructed so as to execute the program verify by making active a CMPEN signal 287 and making active a PGVER signal 285 as shown in FIG. 36. When active, the PGVER signal 285 makes the DLC 80 indicate matching even when the microprocessor 999 tries to erase the program bit during the program operation. The effects of the CMPEN signal 287 and the PGVER signal 285 will be described more in detail later in connection with the block diagram of the DLC 80 of FIG. 36.

In the state 142, the program count of the event counter 74 remains selected, and the event counter 74 is retained in the program mode.

If the PCTRTC signal 88 becomes active, then the next state controller 72 inspects the MATCH signal 94 in order to determine whether or not the addressed byte data has been successfully programmed. The MATCH signal 94 has logic 1 when the byte data has been successfully programmed or has logic 0 when unsuccessful.

When the microprocessor 999 is requested to execute program operation, then the next state controller 72 takes only two of three branch paths from the state 142.

If the preceding program pulse (write pulse) has not successfully programmed the addressed byte data and the event counter 74 has not reached the terminal count, then the next state controller 72 takes branch 144 to return to the PROGRAM-SETUP state 132. This terminal count indicates that the program pulses of the maximum number per program operation have been applied to the byte data in the program mode. The write state machine 32 repeats the states 132, 136, 140 and 142 until the byte data is successfully programmed or until the event counter 74 reaches its terminal count, whichever occurs first.

If the event counter 74 times out or the byte data is successfully written, then the next state controller 72 takes branch 146 into a first program completion status PROG_DONE1 state 148. No event occurs in the state 148.

The next state controller 72 takes branch from the state 148 into a PROG_DONE2 state 150. No event occurs also in this case.

During the program event, the next state controller 72 can take only three branch paths 152, 154 and 159 from the state 150.

Upon receiving an illegal value of the SBUS[0:4] signal 54, the next state controller 72 takes branch 159 into the state 124. In a HARDWARE_ERR state 159, both PRG_ERR and ERASE_ERR bits of the status register 32 are set. The next state controller 72 subsequently takes branch from the state 159 into the state 120, and the program operation (write operation) ends in a hardware failure.

If the program operation has failed, then the next state controller 72 takes branch 152 from the state 150 into a PROG_FAIL state 160. In the PROG_FAIL state 160, the program error bit PRG_ERR of the status register 34 is set. Subsequently, the next state controller 72 takes branch so as to return to the POWER_UP state 120. The program operation ends again as a failure.

If, on the other hand, the program operation has been successful, then the next state controller 72 takes branch 154 connected directly to the state 120 from the state 150. In this case, the program operation is successfully completed.

Erase of the memory cell array 22 is started by receiving an active ERASE signal 38, an inactive PROGRAM signal 40 and an inactive LOCK signal in the POWER_UP state 120. The combination of these signals starts the erase operation to make the next state controller 72 take branch 162 into an ERASE state 164.

In the ERASE state 164, the next state controller 72 initializes the write state machine 32 for array preconditioning by resetting the address counter 78, the period counter 76 and the event counter 74.

The next state controller 72 takes branch from the ERASE state 164 into a state 132 to start preconditioning the memory cell array 22, i.e., writing logical zero into each bit prior to the erase of the memory cell array 22.

During the erase operation, the next state controller 72 repeats the states 132, 136 and 140 as described in connection with the program operation.

A difference between the erase operation and the program operation appears at possible branch from the PROG VER DELAY state 142. The difference between them partially appears because the program operation is related to only one-byte data in contrast to the fact that the erase operation is related to the entire memory cell array 22. A further possible state in the erase event is a state in which the address counter 78 circulates the byte data in the memory cell array 22.

If the addressed byte data is successfully prepared, then the next state controller 72 takes branch from the state 142 into a PROG_INC_ADD state 166. In the PROG_INC_ADD state 166, the event is to prepare another byte data of the memory cell array 22 in the write state machine 32. The address counter 78 becomes enabled to increase its count value, thereby representing a new address in the memory cell array 22. The event counter 74 is reset, and its program count value is selected. A program verify signal makes the program verify of the memory cell array 22 effective.

The next state controller 72 takes branch from the state 166 and returns to the PRGO_SETUP state 132 unless the address counter 78 reaches its terminal count.

The write state machine 32 cycles through the states 132, 136, 140, 142 and 166 until the byte data of the memory cell array 22 is prepared or until one-byte data can not successfully be prepared.

If one-byte data cannot successfully be prepared, then the next state controller 72 takes branch from the PROG_VER_DELAY state 142 into the PROG_DONE1 state 148. No event occurs in the state 148. The next state controller 72 takes branch into the PROG_DONE2 state 150.

The next state controller 72 can take only three branch paths 156, 158 or 159 from the state 150 during erase operation.

If one byte cannot successfully be preprocessed by the time the event counter 74 reaches its terminal count, then the next state controller 72 takes branch 156 to enter the ERASE_FAIL state 168. In this state 168, an ERASE_ERR bit is set. The next state controller 72 returns from the state 168 to the POWER_UP state 120. Thus, the erase operation unsuccessfully ends.

If all the byte data have been successfully preprocessed, then the next state controller 72 takes branch 158 to shift from the state 150 to an ERASE_SETUP1 state. Next, the next state controller 72 starts a process for erasing the memory cell array 22, i.e., starting a process for setting the cell voltage to about 5 V.

In a state 170, the address counter 78 and the event counter 74 are reset. These actions make the write state machine 32 and the memory cell array 22 prepare for erase.

The next state controller 72 takes branch from the state 170 into an ERASE_SETUP2 state 172. The event in this state 172 is to make the WSM 32 prepare for erasing the array 2. In this state 172, the period counter 76 is reset by the value of the SBUS[0:4] signal 54, enabling erase verify of the memory cell array 22.

The next state controller 72 takes branch from the state 172 into an APPLY ERASE state 176. In the state 172, an erase pulse is applied to the memory cell array 22 until the period counter 76 reaches its terminal count. The next state controller 72 proceeds from the state 176 into an ERASE_OFF state 178 when the PCTRTC signal 88 becomes active.

In anticipation of erase verify, the period counter 76 is reset into the state 178. The event counter 74 is interruptible, and its count value is incremented. The read line of the memory cell array 22 maintains the interruptible state and makes an access to read the contents of the memory cell array 22. The erase verify of the memory cell array 22 still remains interruptible.

The next state controller 178 takes branch from the state 178 into a state 180.

In the ERASE_VERIFY state 180, the write state machine 32 determines whether or not the designated byte data of the memory cell array 22 has successfully been erased. The event in the state 180 is to execute erase verify of the WSM 72. In this state 180, the period counter 76 is reset, and its erase verify delay is selected. The erase verify delay is roughly a time during which the erase voltage is removed and a time during which the SOUT[0:7] signal 59 is effective.

In the state 180, by setting a COMPDAT signal 283 to a logic and making active the signal CMPEN 287, the data latch comparator (DLC) 80 verifies the successful erase of the addressed byte data. The COMPDAT signal 283, the CMPEN signal 287 and the data latch comparator (DLC) 80 will be described in detail later.

In the state 180, the read path of the memory cell array 22 is turned on to make the memory cell array 22 interruptible, so that the memory cell array 22 outputs the SOUT[0:7] signal 59 to the DLC 80.

By examining the MATCH signal 94 after the timeout of the period counter 76, the next state controller 72 determines whether or not the erase operation has been successful. The MATCH signal 94 has logic one when the byte data has successfully been erased and has logic 0 when the byte data has not successfully been erased.

If the MATC signal 94 represents the fact that the currently addressed byte data has not successfully been erased or if the event counter 74 and the address counter 78 have failed in reaching their terminal counts, then the next state controller 72 takes branch from the state 180 into the state 172 and applies another erase pulse. The write state machine 32 repeats the states 172, 176 and 180 until timeout of the event counter 74 or until successful verify of the addressed byte data.

If the memory byte data is not successfully erased, then the next state controller 72 puts branch 182 into the ERASE_FAIL state 168. In the state 168, an ERASE_ERR bit is set. Subsequently, the write state machine 32 branches back to enter the state 120. Thus, the erase operation unsuccessfully ends.

As represented by an inactive ACTRTC signal 92, if one byte data is successfully verified or when all the byte data in the memory cell array 22 are not necessarily verified, then the next state controller 72 takes branch from the state 180 into an ERASE_INC_ADD state 184. In this state 184, the address counter 78 is interruptible, and its count value can be incremented. Moreover, the AY[0:6] signal 55 and the AX[0:9] signal 57 designate other byte data in the memory cell array 22. In the state 184, the memory cell array 22 and the DLC 80 prepare for verifying the erase of other byte data in the memory cell array 22. This is achieved by making active the CMPEN signal 287 and enabling the erase verify of the memory cell array 22.

After representing new byte data in the memory cell array 22, the write state machine 32 compares the current byte data value with the desired value and determines whether or not it is required to give an additional erase pulse to the memory cell array 22. These events occur in the states 180, 184 and 186.

The next state controller 72 takes branch from the state 184 into the ERASE_INC_DELAY state 186. This state 186 provides a small delay before the erase for performing erase verify. In this state 186, by setting the COMPDAT signal 283 to logic one and making active the COMPEN signal 287, the DLC 80 is retained in an erase verify configuration. The erase verify of the memory cell array 22 retains the interruptible state.

The next state controller 72 takes branch from the state 186 into the ERASE_VERFY state 180 and returns. The DLC 80 compares the contents of the current memory position with a voltage level that represents the erased byte data. If the verify indicates that the byte data has already been erased, then the next state controller 72 circulates via the states 184, 186 and 180 until the nonerased byte data is arranged in the memory cell array 22 or until the address counter 78 reaches its terminal count.

When an unerased memory location is reached and the address counter 78 has not yet reached its terminal count, the next state controller 72 takes branch from the ERASE_VERIFY state 180 into the state 172 and returns. The next state controller 72 repeats the states 172, 176, 178, 180, 184 and 186 until the selected block end in the memory cell array 22 is reached or until a byte data in the memory cell array 22 cannot be successfully erased.

When the byte data in the selected block of the memory cell array 22 is successfully erased, as represented by the active ACTRTC signal 92, the next state controller 72 takes branch 188 and enters the POWER_UP state 120. Thus, the erase of the memory cell array 22 is successfully completed.

Figure 29:
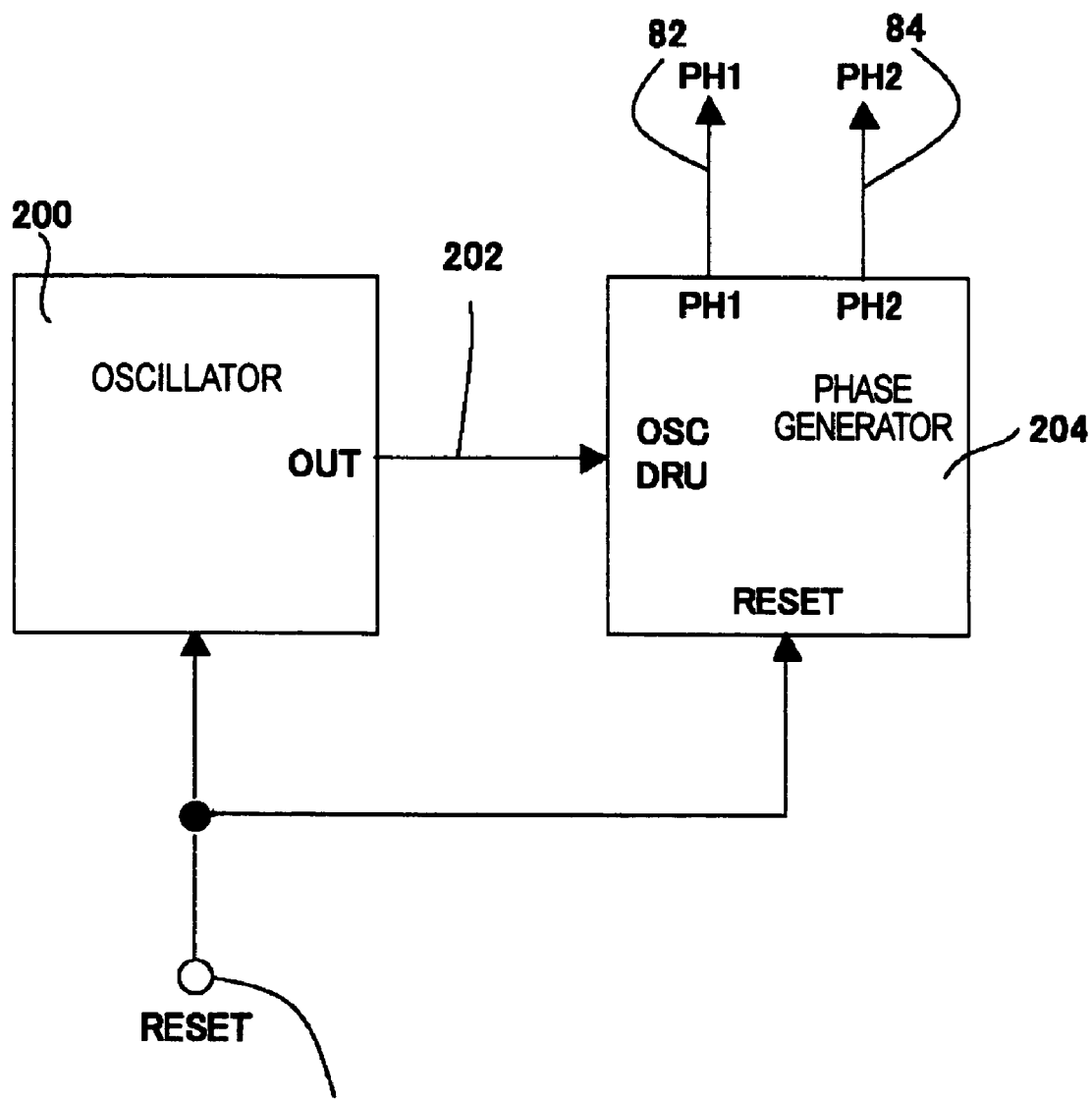
FIG. 29 is a block diagram of an oscillator and a phase generator.
Figure 30:
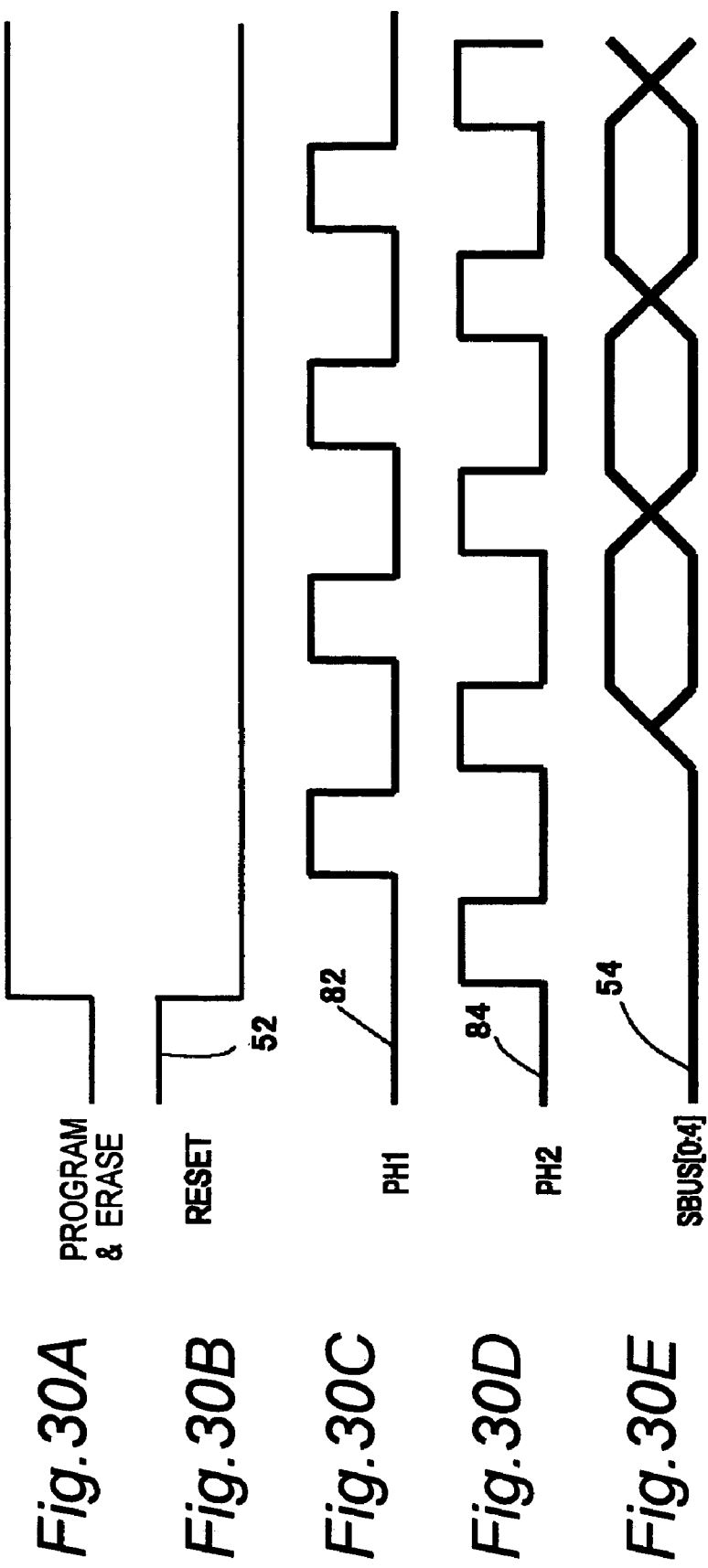
FIGS. 30A, 30B, 30C, 30D and 30E are timing charts of signals.

FIG. 29 is a block diagram showing an oscillator 200 and a phase generator 204. Upon receiving the RESET signal 52, this oscillator 200 starts operation. The oscillator 200 keeps operating so long as the RESET signal 52 is inactive. If the RESET signal 52 becomes assertive (active), then the oscillator 200 stops operating.

An output 202 of the oscillator 200 is given to the phase generator 204. The phase generator 204 includes a two-bit shift register, and the shift register is held inactive until activated. The shift register has four combinations of shift, i.e., "00", "01", "11" and "10". Two decoders of the phase generator 204 await the states of "01" and "10" and generate two out clocks of the PH1 signal 82 and the PH2 signal 84, which are transferred to nearly all of the write state machine (WSM) 32.

In a preferred embodiment, the PH1 signal 82 and the PH2 signal 84 have a typical cycle time of 500 nanoseconds. Both the PH1 signal 82 and the PH2 signal 84 have a duty cycle of about 25%.

FIGS. 30A, 30B, 30C, 30D and 30E show the startup timing of the PH1 signal 82 and the PH2 signal 84 with respect to the PRESET signal 52 and the SBUS[0:4] signal 54. The RESET signal 52 drops at the rising edge of the PROGRAM signal 38 or the ERASE signal 40. The PH2 signal 84 is the first clock that becomes active high after the drop of the RESET signal 52.

The SBUS[0:4] signal 54 changes the state at the rising edge of the pulse of the second PH2 signal 84. All the circuits in the WSM 32 evaluate the SBUS[0:4] signal 54 while the PH1 signal 82 is active in order to guarantee effective read.

Figure 31:
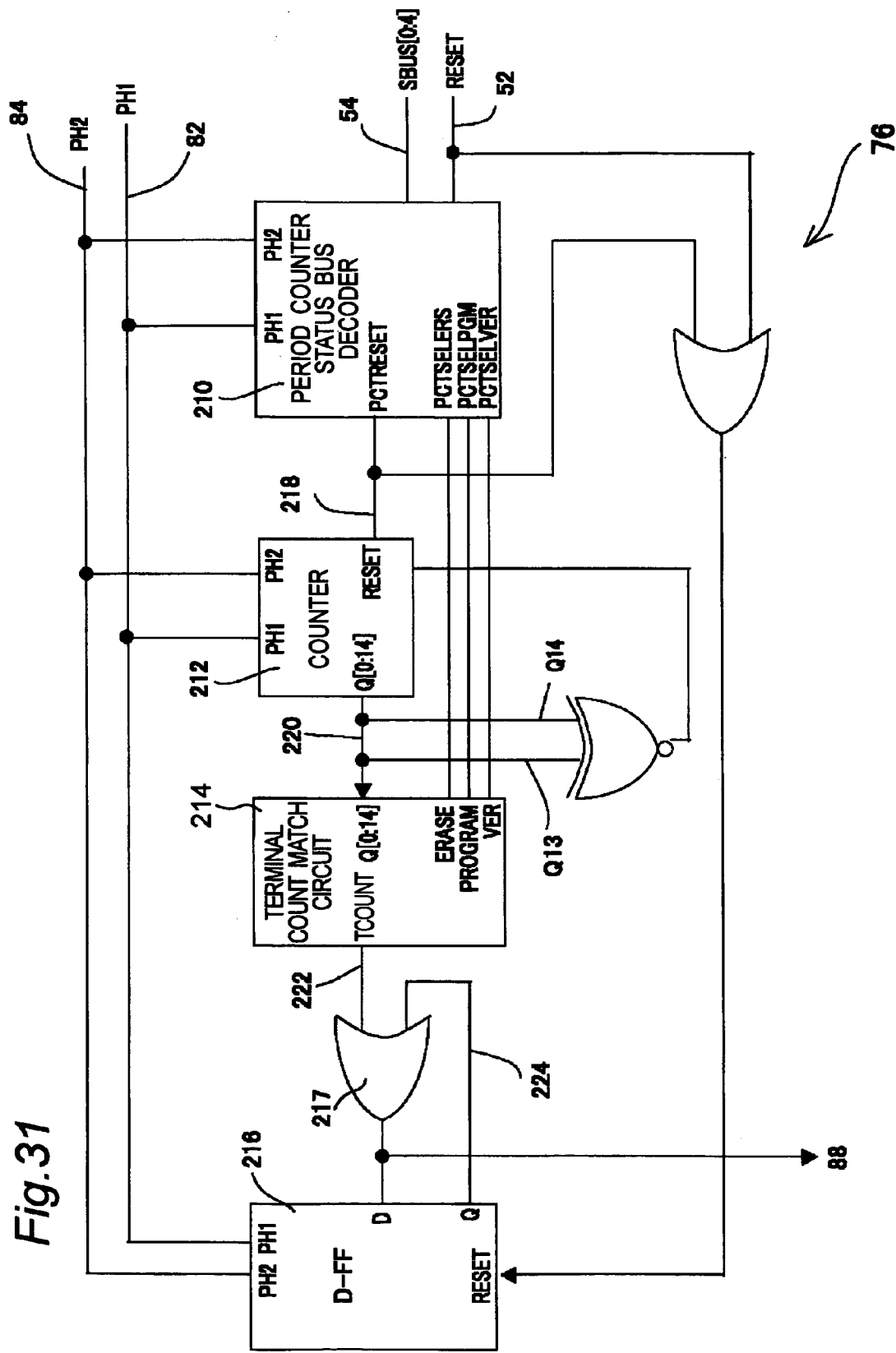
FIG. 31 is a block diagram of a period counter.

FIG. 31 is a block diagram of the period counter 76. This period counter 76 includes a period counter status bus (SBUS) decoder 210, a 15-bit shift register type counter 212, a terminal count match circuit 214 and a latch 216.

The period counter SBUS decoder 210 controls the counter 212 and the terminal count match circuit 214. The decoder 210 decodes the SBUS signal 54 to determine whether or not to reset the count of the counter 212 and selects among three possible terminal counts.

The SBUS decoder 210 is implemented as a random logic in a preferred embodiment. The counter 212, into which no counter enable is incorporated, therefore continues operating in every state except when it is reset by an active PCTRST signal 218.

The Q output 220 of the counter 212 is supplied to the terminal count match circuit 214. This terminal count match circuit 214 analyzes the Q output 220 and indicates when the count reaches the selected terminal count. The terminal count match circuit recognizes three possible terminal counts, i.e., erase, program (write) and verify. The terminal count is selected by the PCTSELERS signal, the PCTSELPGM signal and the PCTSELVER signal, which are active signals. There are assigned a time of about ten microseconds to each programming pulse, a time of about ten milliseconds to each erase pulse, a time of about three microseconds to each program verify operation and each erase verify operation.

The counter 212 continues incrementing a TCOUNT signal 222, and therefore, the TCOUNT signal 222 is active in only one state. In order to store the active terminal count (TCCOPYRGT.UNIT) 222, the latch 216 is used together with an OR gate 217.

At the initial power-up of the write state machine 32, the latch 216 is reset by RESET 52, and its Q output 224 is set to logic 0. When the TCOUNT signal 222 becomes active high, the Q output 224 comes to have logic 1. The Q output 224 retains the latch input at logic one also after the TCOUNT 222 becomes inactive. Thus, the PCTRTC signal 88 is retained at logic one until the latch 216 is reset by the RESET signal 52.

Figure 32:
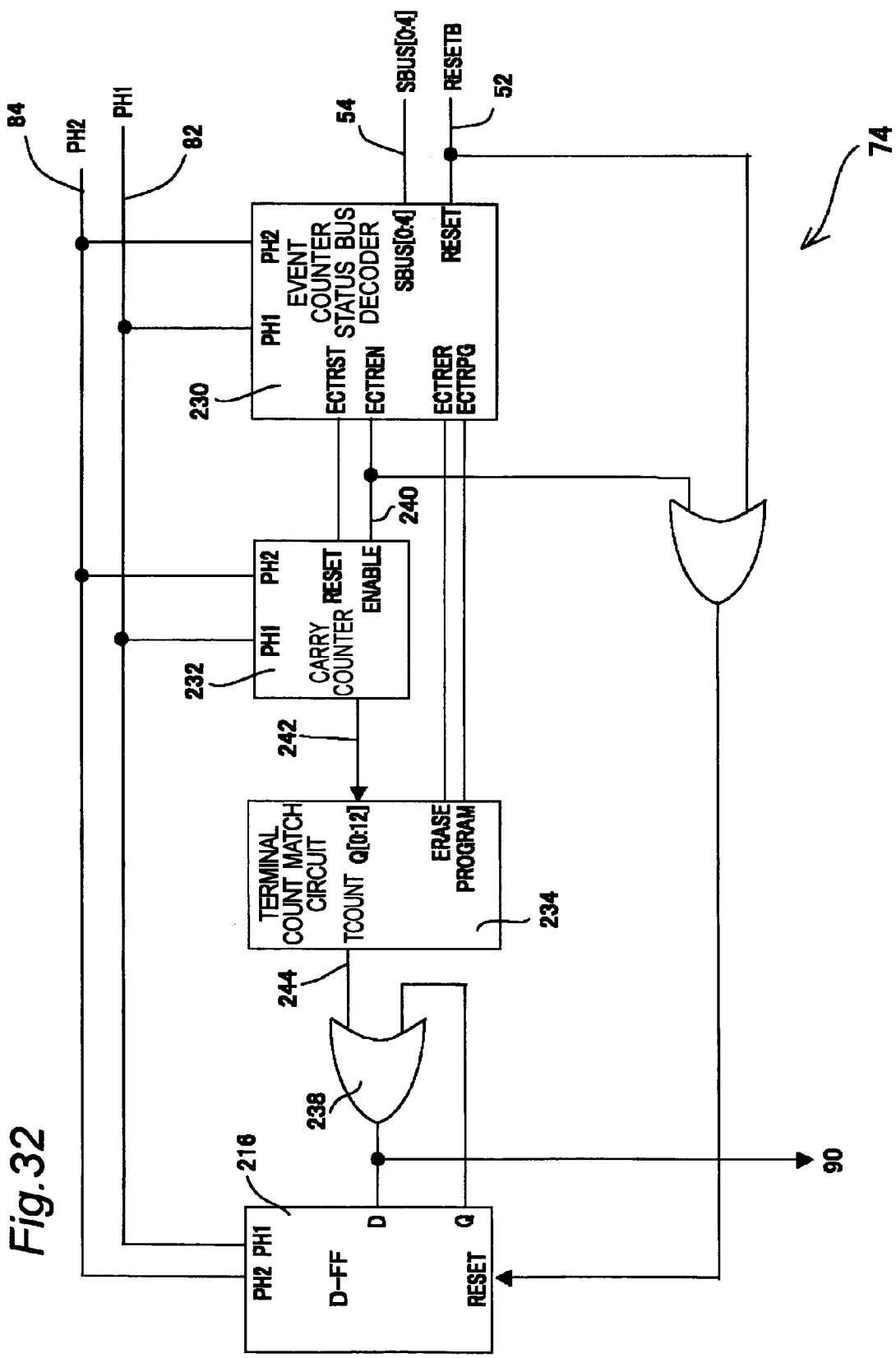
FIG. 32 is a block diagram of an event counter.

FIG. 32 is a block diagram of the event counter 74. This event counter 74 includes a status bus (SBUS) decoder 230, a 13-bit counter 232, a terminal count match circuit 234, a latch 216 and an OR gate 238.

The event counter SBUS decoder 230 controls the counter 232 and the terminal count match circuit 234. The decoder 230 decodes the SBUS[0:4] signal 54 to determine whether to enable or reset the counter 232 and selects between two possible event counter terminal counts.

The event counter SBUS decoder 230 is implemented as a random logic in a preferred embodiment.

The counter 232 is reset by the SBUS decoder 230 whenever the WSM 32 begins programs, makes precondition or erases a new byte. The ripple carry counter 232 increments its count only when made interruptible by an active ECTREN signal 240. The Q output 242 of the counter 232 is supplied to the terminal count match circuit 234 of the event counter 74.

The terminal count match circuit 234 analyzes the Q output 242 and indicates when the count reaches the selected terminal count. The terminal count match circuit 234 of the event counter 74 recognizes two possible terminal counts, i.e., erase and program (write). They are selected by an ECTRER signal and an ECTRPG signal.

When the erase operation is selected, 8000 or more erase pulses are applied by the event counter 74. When the program operation is selected, 50 program pulses are applied. The event counter 74 indicates when the maximum number of erase pulses or program pulses has been applied by making active the event counter signal ECTRTC 90.

A TCOUNT signal 244 is latched quite similarly to the TCOUNT signal 222 by using the latch 216 and the OR gate 238.

Figure 33:
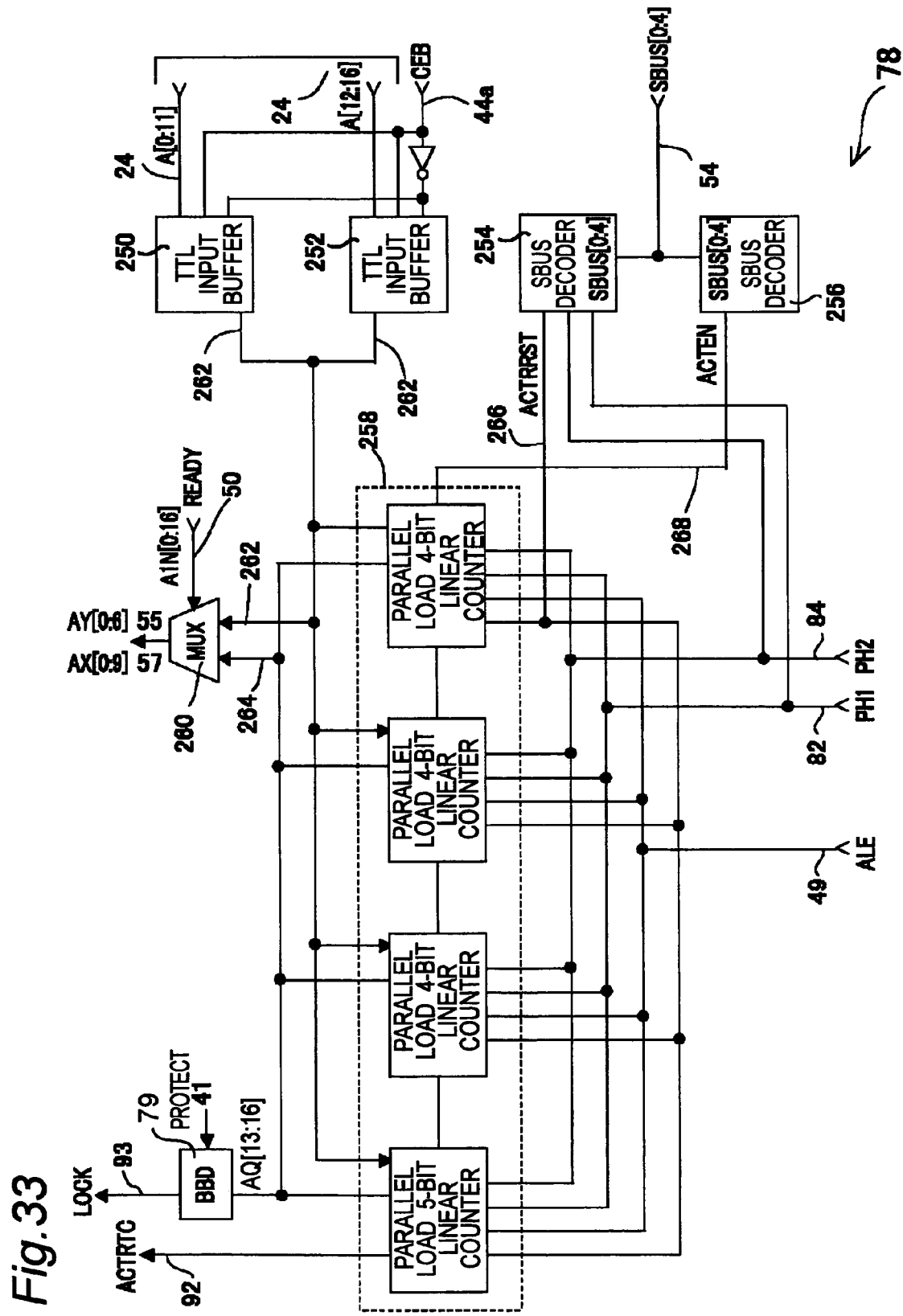
FIG. 33 is a block diagram of an address counter.

FIG. 33 is a block diagram of the address counter 78. The address counter 78 includes TTL input buffers 250 and 252, SBUS decoders 254 and 256, a 17-bit linear counter 258, a bypass multiplexer 260 and a boot block detector 79.

The input buffers 250 and 252 convert a TTL address input A[0:16] signals 24 into CMOS levels. The buffer output AIN[0:16] signals 262 are applied to the bypass multiplexer 260 and the parallel load inputs of the counter 258.

When the READY signal 50 is a logic high, the address counter 78 provides flow-through addressing by selecting the buffer TTL outputs 262 as the outputs of the bypass multiplexer 260.

The SBUS decoders 254 and 256 of the address counter 78 control the operation of the counter 258. The SBUS decoder 254 gives an ACTRRST signal 266 that is a reset signal to the counter 258. The SBUS decoder 256 decodes the SBUS[0:4] signals 54 to generate an ACTEN signal 268 that is a counter enable signal.

The SBUS decoders 254 and 256 of the address counter 78 are implemented as a random logic in a preferred embodiment.

The counter 258, which is a 17-bit linear counter with parallel load, is well known to those skilled in the art. Therefore, no detailed description is herein provided therefore.

During a program operation, the address counter 78 operates as follows. Before the command state machine 28 issues a program command 38 to the write state machine 32, the READY signal 50 is a logic high indicating that the write state machine 32 is ready for performing operation. This selects the TTL buffer outputs 262 as the outputs of the bypass multiplexer 260.

Before putting the PROGRAM signal 38 into an active state, the command state machine 28 makes active the ALE signal 49 that is an address latch enable signal. The active ALE signal 49 loads the AIN[0:16] signal 262 that is the buffer address output into the counter 258. An AQ[0:16] signal 264 and the AIN[0:16] signal 262 have the same value until the counter 258 is enabled to increment its count.

When the PROGRAM signal 38 becomes active, the bypass multiplexer 260 selects the AQ[0:16] signals 264 that are counter inputs as outputs.

The bypass multiplexer 260 selects the AQ[0:16] signal 264 by making inactive the READY signal 50. The counter 258 is not allowed to increment its count value during the program operation. Therefore, the counter 258 operates as an address latch during the program operation.

The operation of the address counter 258 during the erase operation resembles that during the program operation at the early stage. However, the counter 258 is enabled in a PROG_INC_ADD state 166 and an ERASE_INC_ADD state 184 during the erase operation. By this operation, the AY[0:6] signal 55 and the AX[0:9] signal 57 circulate via the addresses in the memory cell array 22 until the end address space of the memory cell array 22 is reached, as indicated by the active state of the ACTRTC signal 92.

In order to determine whether or not one address in the boot block 23 has been selected for write or erase, the boot block detector 79 analyzes four most significant bits of an AQ[13:16] signal that is an address signal. If an address in the boot block 23 has been selected and the PROTECT signal 41 is an active logic high indicating that the boot block 23 is to be protected from write or erase, then the boot block detector 79 outputs a LOCK signal 93 that is active and logically low. In order to prevent the write or erase of the boot block 23 while the boot block 23 is locked, a LOCK signal 93 is given to the next state controller 72. If, on the other hand, an address in the boot block 23 has not been selected for the write or erase of the boot block 23 while the boot block 23 is unlocked, as indicated by the PROTECT signal 41 that is inactive and logically low, then the LOCK signal 93 becomes inactive, or logically high. While the LOCK signal 93 is inactive, the write or erase of the selected block may occur.

Figure 34:
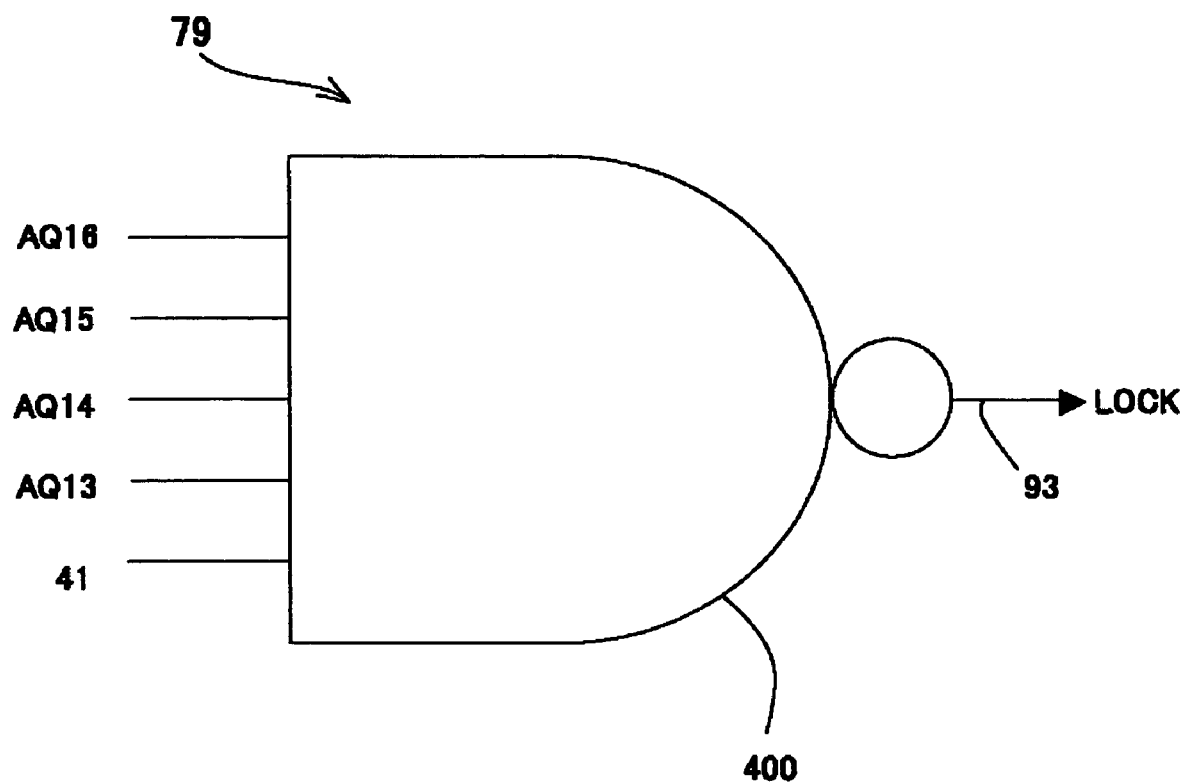
FIG. 34 is a circuit diagram of a boot block detector.

FIG. 34 shows the boot block detector 79. The boot block detector 79 is constructed of a five-input NAND gate 400. Therefore, the LOCK signal 93 is active only when all the five input signals are logically high.

This design of the boot block detector 79 originates in an address table selected from the memory cell array 22. The address table of the memory cell array 22 is partially shown in FIG. 35.

The boot block 23 occupies the addresses of 1FFFF (hexadecimal number) to 1E000 (hexadecimal number). As is apparent from FIG. 35, four most significant bits (MSBs) i.e. the AQ[13:16] signals are all high within this address range. At least one of the four MSBs is logically low with any address outside the boot block address range. This makes the lock signal active logic active high and consequently enables the write and erase of the addressed byte data.

A preferred embodiment of the present invention supports the placement of the boot block 23 at one end of the address range, for example, 0000 (hexadecimal number) or at the other end of the address range, for example, 1FFFF (hexadecimal number). This is achieved by flipping the four MSBs of the AQ[0:16] signal 264, i.e., AQ[13:16] via a switch address space bit.

The PROTECT signal 41 is generated by the command state machine 28 in response to the CE2 signal 43. When the CE2 signal 43 is boosted up to 5 V, then the command state machine 28 makes the PROTECT signal 41 logically low. As a result, the boot block 23 is unlocked, enabling the write or erase of the address in the boot block 23. When the CE2 signal 43 is not higher than 5 V, then the PROTECT signal 41 becomes logically high indicating that the boot block 23 is to be protected from data change.

FIG. 36 is a block diagram of the data latch and comparator ("DLC") 80. This data latch comparator (DLC) 80 includes eight latch and comparator circuits 270a through 270h (one for each data bit), SBUS decoders 282, 284 and 286, an AND gate 288, a multiplexer 290 and a latch 292.

The microprocessor 999 writes a command into the sidewall memory 20 via the data line DATA[0:7] 26 while maintaining a CBE signal 44a and a WEB signal 46 active. By the CBE signal 44a and the WEB signal 46 in the active state, the latches (TTL input buffers) 272a through 272h (only 272a is shown) within each DLC 80 and the comparators 270a through 270h can convert the data on the lines 26 into a CMOS level signal of the DATAIN[0:7] signal 27.

If the DATAIN[0:7] signal 27 represents the write or erase command, then the command state machine (CSM) 28 makes active the data latch enable signal DLE 47. When this signal DLE 47 becomes active, the data from the TTL buffers 272a through 272h are latched in latches 274a through 274h (only 274a is shown). During program verify, the latch comparator circuits 270a through 270h (only 270a is shown) operates as follows. The ERASE signal 40 is inactive to select ten inputs 273 of multiplexers 276a through 276h (only 276a is shown) as multiplexer outputs. Thus, the data stored in the latches 272a through 272h (only 272a is shown) are applied to LAT inputs 277 of comparators 278a through 278h (only 278a is shown).

The outputs 279a through 279h of the comparator represent whether or not each bit of the program data matches the SOUT[0:7] signal 59 that is the output of the sense amplifier SA. If an SOUT signal 275 and a LAT signal 277, which are two inputs of the comparator, agree with each other for each comparators 278a through 278h, then each of the comparator outputs 279a through 279h is a logic 1. If the inputs 275 and 277 of the comparator do not agree with each other, then each of the output 279a through 279h is a logic 0.

During program verify, the operation of the comparators 278a through 278h described above can be modified by the PGVER signal 285 that is an active program verify signal. As is apparent from Table 1 below, when the PGVER signal 283 is active, then the comparators 278a through 278h output a logic 1 when the memory element stores a logic 0 and the memory element should store a logic 1.

TABLE 1

| | | MATCH Output | |
| --- | --- | --- | --- |
| SOUT | LAT | PGVER Inactive | PGVER Active |
| 0 | 0 | 1 | 1 |
| 0 | 1 | 0 | 1 |
| 0 | 0 | 0 | 0 |
| 1 | 1 | 1 | 1 |

The MATCH outputs 279a through 279h of all the comparators 278a through 278h are ANDed by the AND gate 288. When each bit of the SOUT[0:7] signal 59 and each bit of the DATAIN[0:7] signal 27 coincide with each other, the output of the AND gate 288 is a logic 1. Moreover, when the SOUT[0:7] signal 59 and the DATAIN[0:7] signal 27 do not coincide with each other, the output of the AND gate 288 is a logic 0.

The output 289 of the AND gate 288 is applied to the I1 input of the output multiplexer 290. The I1 input of the multiplexer 290 is selected as the output of the multiplexer 290 by an active CMPEN signal 287.

During program verification, the CMPEN signal 287 is active, thus allowing the output 289 of the AND gate 288 to flow through the latch 292 and control the logic state of the MATCH signal 94.

The value of the MATCH signal 94 is stored by the latch 292 when the next state controller 72 moves out of the state of program verification. The Q output of the latch 292 is fed back to the I0 input of the multiplexer 290. When the CMPEN signal 287 becomes inactive, then the I0 input of the multiplexer 290 is selected, allowing it to control the latch 292.

The MATCH signal 94 is reset by a RESET signal 52.

The operation of the data latch and comparator circuits 270a through 270h during erase verification resembles that of the aforementioned program verification described above except for the following exceptions. First, the I1 inputs of the multiplexers 276a through 276h is set to a logic 1 by the active COMPDAT1 signal 283 during erase verification. This establishes a voltage reference for comparison with the output of the sense amplifier SA. Secondly, an active ERASE signal 40 selects the I1 inputs of the multiplexers 276a through 276h to be outputted to the comparators 278a through 278h. Thirdly, the PGVER signal 285 is inactive, by which the comparators 278a through 278h is operated without modification.

The SBUS decoders 282, 284 and 286 of the DLC 80 help control the operation of data latch and comparator circuits 272a through 272h.

In a preferred embodiment, the SBUS decoders 282, 284 and 286 of the DLC 80 are provided by a random logic.

Figure 37:
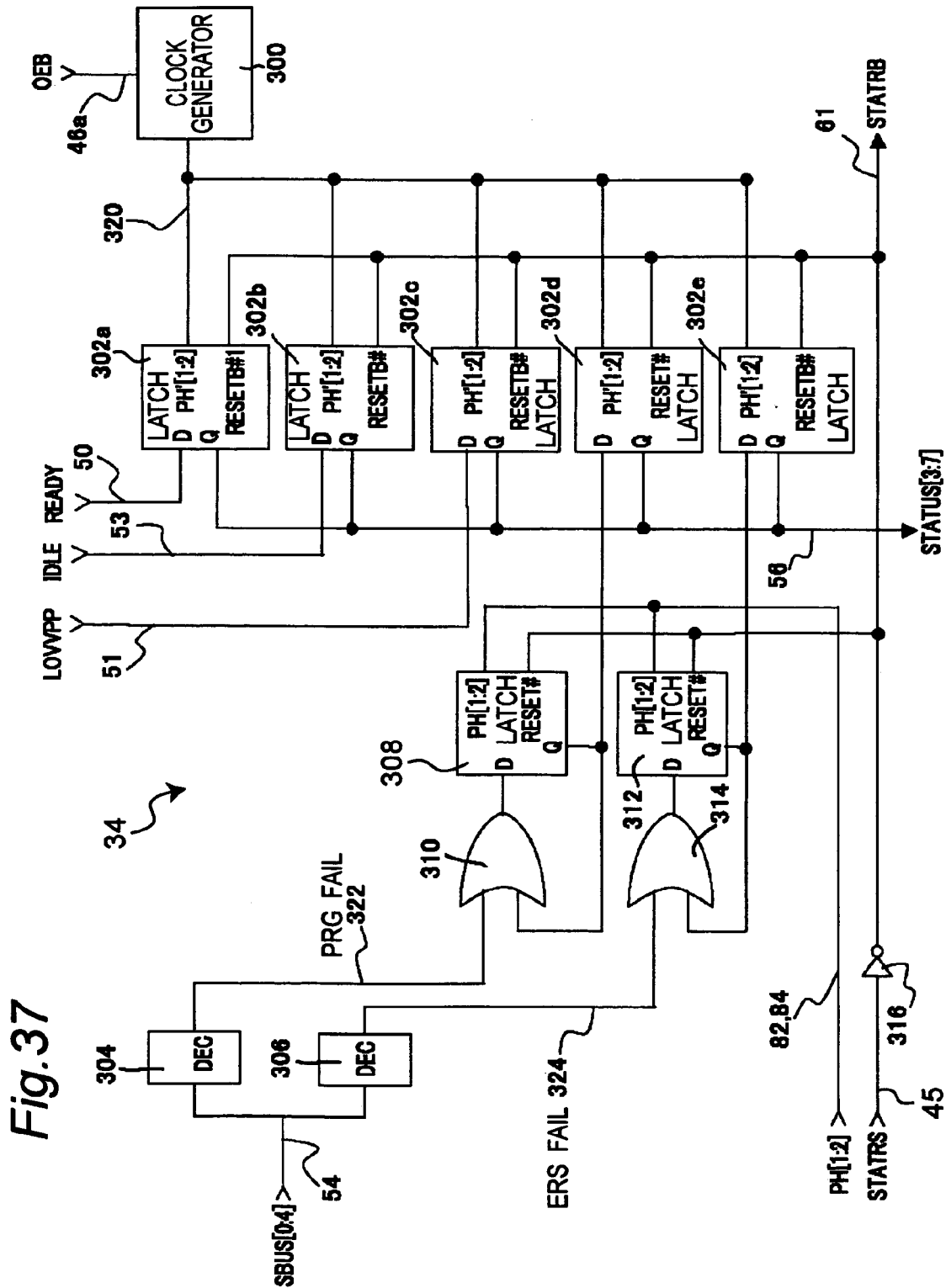
FIG. 37 is a block diagram of a status register.

FIG. 37 is a block diagram of the status register 34. This status register 34 includes a clock generator 300, five output latches 302a through 302e (one for each bit of the STATUS [3:7] signal 56), SBUS decoders 304 and 306, latches 308 and 312, OR gates 310 and 314 and an inverter 316.

The outputs 56 of the status register 34 are synchronized to an OEB signal 46a that is an output enable bar signal. Whenever the OEB signal 46a toggles states, the clock generator 300 accomplishes synchronization by generating a set of clock pulses PH'1/PH'2 320. The clock pulses PH'1/PH'2 320 control the clock-in of data into the output latches 302a through 302e. Thus, it will be understood that the OEB signal 42 must be toggled to read valid data from the output latches 302a through 302e.

The READY signal 50, the IDLE signal 53 and the LOWVPP signal 51 are inputted directly to the D inputs of the latches 302a through 302c, respectively.

The SBUS decoder 304 of the status register 34 decodes the SBUS[0:4] signal 54 to detect the failure of program (write). If this SBUS decoder 304 detects a failure, then a PRGFAIL signal 322 is set to a logic 1. Since the SBUS[0:4] signal 54 indicates the failure of program during only one state period, an active PRGFAIL signal 322 is stored by using the latch 308 and the OR gate 310 until the microprocessor 999 chooses to reset the status register 34. The status register 34 is reset by making active the STATRS signal 45. The pair of devices, i.e., the latch 308 and the OR gate 310, operate in the same manner as a substantially similar pair of devices in the period counter 76.

The SBUS decoder 306 of the status register 34 decodes the SBUS[0:4] signal 54 to detect erase failures. When the SBUS decoder 306 detects a failure, an ERSFAIL signal 324 is set high. The SBUS[0:4] signal 54 indicates an erase failure in only one state, and therefore, the active ERSFAIL signal 324 is stored by using the latch 312 and the OR gate 314 until the microprocessor 999 selects to reset the status register 34. This pair of devices, i.e., the latch 312 and the OR gate 314, operate in the same manner as a substantially similar pair of devices in the period counter 76, which was previously described.

In a preferred embodiment, both the SBUS decoders 304 and 306 are provided by using a random logic.

Active outputs of the latches 308 and 312 are reset when the STATRS signal 45, which is a status register reset signal, is active high. This is caused as a result of receiving a CLEAR STATUS REGISTER command from the microprocessor 999.

The STATUS[3:7] signal 56 includes a RDY/BSY signal, which is also known as STAT7. When the write state machine 32 is busy, RDY/BSY is a logic 0. The logic 1 of STAT7 indicates that the write state machine 32 has completed its operation and is prepared to another operation and that another status output is valid.

The STAT6 signal of the STATUS[3:7] signal is also known as an ERASE_SUSPEND signal. When the write state machine 32 has entered an idle state during erase operation, the ERASE_SUSPEND signal becomes active, i.e., a logic 1, indicating that the memory cell array 22 can be read. The ERASE_SUSPEND signal is set and cleared by the synchronizer 30 on the basis of a request from the microprocessor 999 and the status of the write state machine 32.

The STAT5 signal of the STATUS[3:7] is also known as an ERASE_FAIL signal. If the write state machine 32 cannot successfully program or erase the memory cell array 22, then the ERASE_FAIL signal is set to a logic 1. If an erase command has not successfully been performed or a hardware error is found, then the ERASE_FAIL signal is also set to a logic 1. The ERASE_FAIL signal is set by the write state machine 32 and cleared by a STATUS REGISTER CLEAR command.

The STAT4 signal of the STATUS[3:7] is also known as a program fail signal, i.e., PROG_FAIL signal. If the write state machine 32 has failed in successfully programming one-byte data, then the ERASE_FAIL signal is set to a logic 1. If the erase command is not successfully performed or a hardware error is found, the ERASE_FAIL signal is also set to a logic 1. The PRG_FAIL signal is set by the SBUS[0:4] signal 54 and cleared by the STATUS REGISTER CLEAR command.

The STAT3 signal of the STATUS[3:7] is also known as a LOW_VPP signal. When the program voltage Vpp 36 drops anytime during the program operation or the erase operation, the LOW_VPP signal is set. However, if PRG_FAIL or ERASE_FAIL signal is set, then the low voltage level of Vpp 36 exerts no influence on the operation. LOW_VPP is cleared by the STATRS signal 45.

The status register 34 outputs a STATRB signal 61 that is a status register reset bar signal to the synchronizer 30. This signal is an inversion signal of the STATRS signal 45.

The circuit for protecting the integrity of the data stored in the boot block 23 has been described hereinabove. The boot block 23 remains locked and protected from program and erase so long as the voltage of the CE2 signal 43 is lower than 5 V. The data in the boot block 23 can be changed by raising the voltage of the CE2 pin 43 up to 5 V. This guarantees the user of the sidewall memory with an automatic program and erase function securing from the accidental loss of boot block data.

The Fourteenth Embodiment

Figure 38:
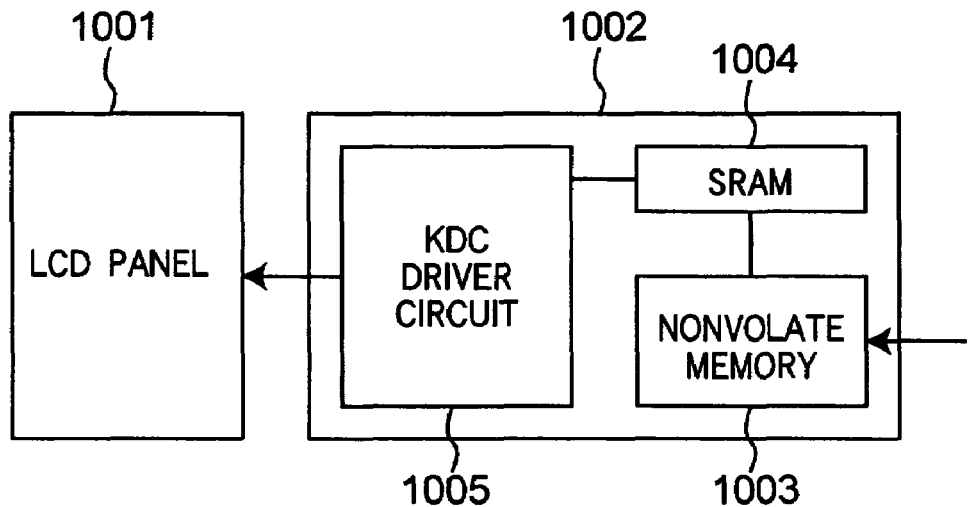
FIG. 38 is a schematic structural view of a liquid crystal display (the fourteenth embodiment) in which the semiconductor storage device of an embodiment of the present invention is incorporated.

As an application example of the aforementioned semiconductor storage device, there can be enumerated, for example, a rewritable nonvolatile memory for the image adjustment of an LCD panel as shown in FIG. 38.

The LCD panel 1001 shown in FIG. 38 is driven by an LCD driver 1002. Inside the LCD driver 1002, there exist a nonvolatile memory section 1003 as a semiconductor storage device, an SRAM section 1004 and an LCD driver circuit 1005. The nonvolatile memory section 1003 includes the nonvolatile memory element of an embodiment of the present invention preferably constructed of the semiconductor storage device described in connection with the tenth through thirteenth embodiments. The nonvolatile memory section 1003 has an externally rewritable construction.

The information stored in the nonvolatile memory section 1003 is transferred to the SRAM section 1004 when the power supply of the equipment is turned on. The LCD driver circuit 1005 can read the storage information from the SRAM section 1004 at need. By providing the SRAM section, the storage information can be read with very high speed.

The LCD driver 1002 may either be externally attached to the LCD panel 1001 as shown in FIG. 38 or formed on the LCD panel 1001.

The LCD panel changes the gradation displayed by giving multi-step voltages to the pixels, where the relation between the given voltage and the displayed gradation has a variation depending on each product. Therefore, by storing information for correcting the variations of individual products after the completion of each product and performing correction based on the information, the image qualities of products can be made more uniform. Therefore, it is preferable to mount the rewritable nonvolatile memory for storing the correction information on the LCD driver. It is preferable to employ the nonvolatile memory element of an embodiment of the present invention as this nonvolatile memory and particularly preferable to employ the semiconductor storage device described in connection with the tenth through thirteenth embodiments in which the nonvolatile memory elements are integrated.

If the memory element of an embodiment of the present invention is used as a nonvolatile memory for adjusting the image of an LCD panel, a consolidation process with a circuit such as a LCD driver is easy, thus reducing the manufacturing cost. Moreover, the semiconductor storage device described in connection with the tenth through fourteenth embodiments is appropriate particularly when the memory scale is comparatively small and importance is attached to reliability and stability. The outputs of two memory elements (memory element pair) are inputted to an identical sense amplifier, and the difference between the currents flowing in the two memory elements that have a similar device structure is detected. Therefore, the read operation is performed reliably and stably. Therefore, although an area per bit is increased, the rate of areal increase can be tolerated in comparison with the areas of the other circuits so long as the memory scale is small. Normally, a nonvolatile memory for adjusting the image of an LCD panel has a comparatively small memory scale of, for example, several kilobytes. Therefore, the semiconductor storage device described in connection with the tenth through fourteenth embodiments may beneficially as a nonvolatile memory for adjusting the image of an LCD panel.

The Fifteenth Embodiment

Figure 39:
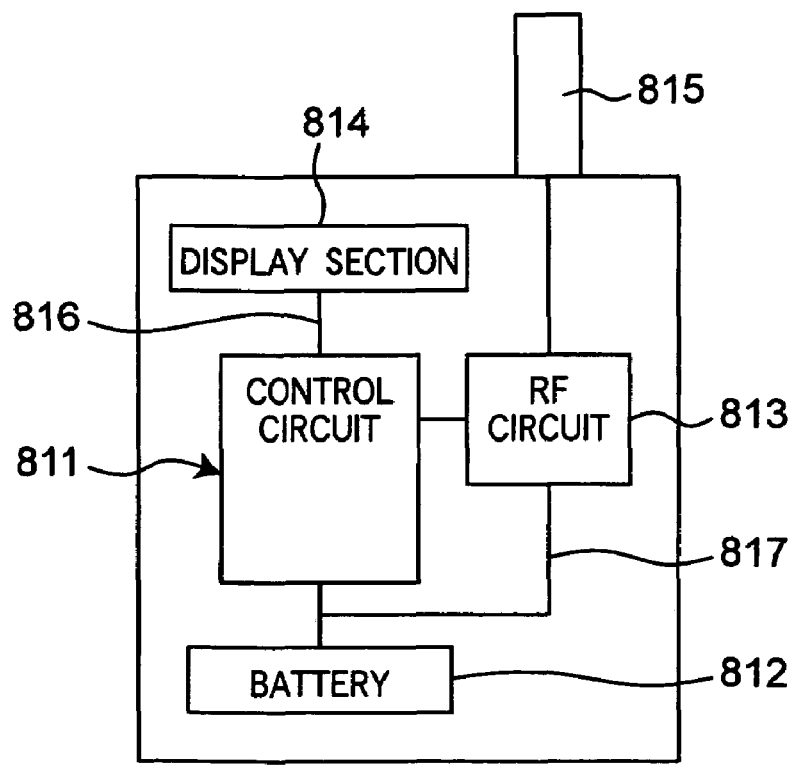
FIG. 39 is a schematic structural view of portable electronic equipment (the fifteenth embodiment) in which the semiconductor storage device of an embodiment of the present invention is incorporated.
Figure 40:
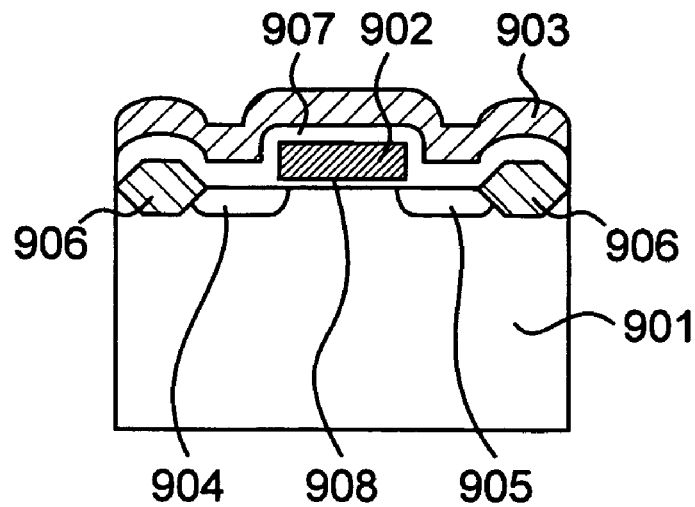
FIG. 40 is a schematic sectional view of part of a conventional flash memory.

FIG. 39 shows a portable telephone that is the portable electronic equipment into which the aforementioned semiconductor storage device is incorporated.

This portable telephone is constructed mainly of a control circuit 811, a battery 812, an RF (Radio Frequency) circuit 813, a display section 814, an antenna 815, a signal line 816, a power line 817 and so on, and a semiconductor storage device of an embodiment of the present invention is incorporated into the control circuit 811. The control circuit 811 should preferably be an integrated circuit that employs elements of an identical structure for a memory circuit element and a logical circuit element. This arrangement facilitates the manufacturing of the integrated circuit and allows particularly the manufacturing cost of the portable electronic equipment to be reduced.

As described above, by employing a semiconductor storage device that allows an easy consolidation process of the memory section and the logic circuit section and permits high-speed read operation for portable electronic equipment, it becomes possible to improve the operating speed of the portable electronic equipment and reduce the manufacturing cost, allowing inexpensive portable electronic equipment of high reliability and high performance to be obtained.

As is apparent from the above, according to the disclosed semiconductor storage device, the memory element of the memory cell array comprises the memory function bodies located on both sides of the gate electrode in place of the conventional floating gate, and therefore, the thickness of the gate insulator can be reduced, allowing the semiconductor storage device to be minute.

Furthermore, the formation process of the memory element has a high affinity for the formation process of the ordinary transistor and is able to remarkably reduce the number of masks and the number of processes in comparison with the case where a memory cell array of the conventional EEPROM and the peripheral circuit are consolidated. Therefore, the yield of chips can be improved, and the cost can be reduced.

Furthermore, in the memory element, the memory function borne by the memory function bodies is separated from the transistor operation function borne by the gate insulator. Therefore, it is easy to restrain the short-channel effect by reducing the film thickness of the gate insulator with a sufficient memory function possessed. Furthermore, the value of the current flowing between the diffusion regions due to rewrite changes more largely than in an EEPROM. Therefore, it becomes easy to distinguish between the write state and the erase state of the semiconductor storage device.

Moreover, in the semiconductor storage device of embodiments of the present invention, the command state machine generates the protect signal, while the write state machine operates to receive the protect signal and to generate an active lock signal if the predetermined bit of the identification of the block of the address and the protect signal are in a predetermined state, and the semiconductor storage device responds to this active lock signal by not performing the predetermined operation and responds to the absence of the active lock signal by performing each predetermined operation every address in the block. Therefore, the write and erase of data of the memory elements in the predetermined range can be selectively prevented.

In one embodiment, the memory element has an insulator, which insulates the film that has a surface roughly parallel to the surface of the gate insulator and has a function to retain electric charge from the channel region or the semiconductor layer, and the film thickness of the insulator is thinner than that of the gate insulator and is not smaller than 0.8 nm. This facilitates the injection of electric charge into the memory function bodies, allowing the voltage during write and erase to be lowered or allowing the speed of the write operation and the erase operation to be made high. That is, write and erase failures hardly occur, and therefore, the frequency of rewrite and re-erase is reduced. The lock means for preventing the program failure and erase failure as described in connection with the present embodiment is necessary for the reliability of the memory. However, the operation rate is reduced, and a reduction in power consumption can be achieved with reliability maintained as a whole.

Moreover, the portable electronic equipment of embodiments of the present invention comprises the aforementioned semiconductor storage device. Accordingly, there are the advantages of the simplified process of consolidation of the memory section and the logic circuit section, the improved operation speed, the reducible manufacturing cost, inexpensiveness and high reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
  a memory cell array having a plurality of memory elements whose addresses can be designated;
  a write state machine which is connected to the memory cell array, controls operations to be performed on the memory cell array, receives control signals that represent one operation or a sequence of operations to be performed at at least one block of at least one address in the memory cell array, receives predetermined bits of an identification of a block of addresses, further receives a protect signal, generates an active lock signal if the predetermined bit of the identification of the block of the addresses and the protect signal are in predetermined states, responds to the lock signal by failing to perform the operation identified, and responds to an absence of the lock signal by performing each operation identified on every address within the block; and
  a command state machine which is connected so as to receive data including commands and generates control signals for controlling the write state machine and the protect signal,
  each memory element of the memory cell array comprising:
  a gate electrode formed on a semiconductor layer via a gate insulator;
  a channel region disposed below the gate electrode via the gate insulator;
  diffusion regions which are disposed on both sides of the channel region and have a conductive type opposite to a conductive type of the channel region; and
  memory function bodies which are formed on both sides of the gate electrode and have a function to retain electric charge or polarization,
  wherein
  the write state machine comprises:
  an address counter which receives and buffers control signals to be applied to addresses within a given block of the memory cell array from the command state machine, and iteratively outputs signals to address memory elements in the memory cell array corresponding to the block of the addresses, and which further comprises a protected address detector which detects protected memory address and which senses a state of the protect signal by detecting a protected memory address, wherein the address counter outputs an active lock signal if the predetermined bits of an address are in predetermined states indicating that the address is to be protected and the protect signal is in a predetermined state indicating that the address is to be protected,
  a state controller connected so as to receive the identification of the operation to be performed and the lock signal, wherein the state controller determines a state of the write state machine, and indicates that the state of the write state machine is a state in which the operation is not performed if the operation is an identified operation and the lock signal is active.

2. The semiconductor storage device as claimed in claim 1, wherein the protected address detector comprises a multi-input AND gate connected so as to receive the predetermined bits of the address and the protect signal and outputs the lock signal.

3. The semiconductor storage device as claimed in claim 1, wherein:
  the command state machine is connected so as to receive a command from a microprocessor and to receive the protect signal, the command state machine outputting control signals to the write state machine so as to perform the operation, and the command state machine further outputting the protect signal to the write state machine.

4. Portable electronic equipment comprising the semiconductor storage device claimed in claim 1.

5. A semiconductor storage device comprising:
  a memory cell array having a plurality of memory elements identified by addresses; and
  a microprocessor for outputting commands of memory operations to be performed at at least one address in the memory cell array, wherein
  the command outputted from the microprocessor includes an identification of at least one operation to be performed and an identification of at least one block of memory addresses, and wherein
  the microprocessor further outputs a protect signal indicating that predetermined memory elements of the memory cell array are protected when the protect signal is in an active state,
  the semiconductor storage device comprising a memory controller connected between the memory cell array and the microprocessor, wherein
  the memory controller receives the commands, data and identifications of the blocks of the addresses and outputs operation control signals to perform the identified operation at the at least one address in the memory cell array, and wherein
  the memory controller comprises a command state machine connected so as to receive the identification of at least one operation to be performed and the state of the protect signal, the command state machine outputting write state machine control signals comprising signals to identify the operation to be performed and a state of the protect signal, wherein
  the memory controller further comprises a write state machine connected to the memory cell array to control operation to be performed on the memory cell array, the write state machine comprising a logic circuit connected so as to receive predetermined bits of the address and a write state machine control signal, the logic circuit generating an active lock signal if the predetermined bits of the address and the protect signal are in predetermined states, the write state machine responding to the active lock signal by failing to perform the operation identified, and
  each memory element of the memory cell array comprising:
  a gate electrode formed on a semiconductor layer via a gate insulator;

a channel region disposed below the gate electrode via the gate insulator;

diffusion regions which are disposed on both sides of the channel region and have a conductive type opposite to a conductive type of the channel region; and memory function bodies which are formed on both sides of the gate electrode and have a function to retain electric charge or polarization, wherein the write state machine comprises:

an address counter which receives and buffers the write state machine control signals to be applied to addresses in a given block of the memory cell array, and iteratively outputs control signals to address memory elements in the memory cell array corresponding to the block of the addresses, wherein the address counter comprises a protected address detector which detects protected memory addresses and senses a state of the protect signal, the address counter outputting an active lock signal if the predetermined bits of the address are in predetermined states indicating that the address is to be protected and the protect signal is active, the semiconductor storage device comprising a state controller connected so as to receive the identification of the operation to be performed and the lock signal, wherein the state controller determines a state of the write state machine, and the state controller indicates that the state of the write state machine is a state in which the operation is not performed if the operation is an identified operation and the lock signal is active.

6. The semiconductor storage device as claimed in claim 5, wherein the protected address detector comprises a multi-input AND gate connected to receive the predetermined bits of the address and the protect signal, and outputs the lock signal.

7. Portable electronic equipment comprising the semiconductor storage device claimed in claim 5.

8. A method for protecting predetermined memory elements in a semiconductor storage device including a memory cell array having a plurality of memory elements identified by addresses, a microprocessor that outputs commands of memory operation to be performed at at least one address in the memory cell array, and a memory controller connected between the memory cell array and the microprocessor, wherein the commands outputted from the microprocessor comprise an identification of an operation to be performed and a memory address, the memory controller receiving the command and outputting control signals to perform the identified operation at the at least one address in the memory cell array, each memory element of the memory cell array comprising a gate electrode formed on a semiconductor layer via a gate insulator, a channel region disposed below the gate electrode via the gate insulator, diffusion regions that are disposed on both sides of the channel region and have a conductive type opposite to a conductive type of the channel region, and memory function bodies that are formed on both sides of the gate electrode and have a function to retain electric charge or polarization, the method comprising the steps of:

outputting a protect signal indicating that predetermined memory elements of the memory cell array are protected when the protect signal is in an active state from the microprocessor to the memory controller;

receiving predetermined bits of the address and the protect signal by the memory controller and generating a lock signal if the predetermined bits of the address and the protect signal are in predetermined states;

putting the memory controller into a state determined by a status of the protect signal and by an immediately preceding state of the memory controller, and making the memory controller operate on subsequent memory addresses determined by the state, such that the memory controller fails to perform the operation identified if the lock signal is generated, and performs the operation identified according to the state of the memory controller on addresses at which the operations identified are to be performed if the lock signal is not generated.

9. A semiconductor storage device comprising:

a memory cell array having a plurality of memory elements whose addresses can be designated;

a write state machine which is connected to the memory cell array, controls operations to be performed on the memory cell array, receives control signals that represent one operation or a sequence of operations to be performed at at least one block of at least one address in the memory cell array, receives predetermined bits of an identification of a block of addresses, further receives a protect signal, generates an active lock signal if the predetermined bit of the identification of the block of the addresses and the protect signal are in predetermined states, responds to the lock signal by failing to perform the operation identified, and responds to an absence of the lock signal by performing each operation identified on every address within the block; and a command state machine which is connected so as to receive data including commands and generates control signals for controlling the write state machine and the protect signal, each memory element of the memory cell array comprising:

a gate electrode formed on a semiconductor layer via a gate insulator;

a channel region disposed below the gate electrode via the gate insulator;

diffusion regions which are disposed on both sides of the channel region and have a conductive type opposite to a conductive type of the channel region; and memory function bodies which are formed on both sides of the gate electrode and have a function to retain electric charge or polarization, wherein the memory element has an insulation film which insulates a film that has a surface roughly parallel to a surface of the gate insulator and a function to retain electric charge from the channel region or the semiconductor layer, and the insulation film has a film thickness thinner than a film thickness of the gate insulator and is not thinner than 0.8 nm.

10. A semiconductor storage device comprising:

a memory cell array having a plurality of memory elements identified by addresses; and a microprocessor for outputting commands of memory operations to be performed at at least one address in the memory cell array, wherein the command outputted from the microprocessor includes an identification of at least one operation to be performed and an identification of at least one block of memory addresses, and wherein the microprocessor further outputs a protect signal indicating that predetermined memory elements of the memory cell array are protected when the protect signal is in an active state, the semiconductor storage device comprising a memory controller connected between the memory cell array and the microprocessor, wherein the memory controller receives the commands, data and identifications of the blocks of the addresses and outputs operation control signals to perform the identified operation at the at least one address in the memory cell array, and wherein the memory controller comprises a command state machine connected so as to receive the identification of at least one operation to be performed and the state of the protect signal, the command state machine outputting write state machine control signals comprising signals to identify the operation to be performed and a state of the protect signal, wherein the memory controller further comprises a write state machine connected to the memory cell array to control operation to be performed on the memory cell array, the write state machine comprising a logic circuit connected so as to receive predetermined bits of the address and a write state machine control signal, the logic circuit generating an active lock signal if the predetermined bits of the address and the protect signal are in predetermined states, the write state machine responding to the active lock signal by failing to perform the operation identified, and each memory element of the memory cell array comprising:

a gate electrode formed on a semiconductor layer via a gate insulator;

a channel region disposed below the gate electrode via the gate insulator;

diffusion regions which are disposed on both sides of the channel region and have a conductive type opposite to a conductive type of the channel region; and memory function bodies which are formed on both sides of the gate electrode and have a function to retain electric charge or polarization, wherein the memory element has an insulation film which insulates a film that has a surface roughly parallel to a surface of the gate insulator and a function to retain electric charge from the channel region or the semiconductor layer, and the insulation film has a film thickness thinner than a film thickness of the gate insulator and is not thinner than 0.8 nm.

* * * * *